US010290619B2

(12) United States Patent
Evans et al.

(10) Patent No.: US 10,290,619 B2
(45) Date of Patent: May 14, 2019

(54) PHOTONIC INTEGRATED CIRCUIT PACKAGE

(71) Applicant: Infinera Corporation, Sunnyvale, CA (US)

(72) Inventors: Peter W. Evans, Tracy, CA (US); John W. Osenbach, Kutztown, PA (US); Fred A. Kish, Jr., Palo Alto, CA (US); Jiaming Zhang, Macungie, PA (US); Miguel Iglesias Olmedo, Sunnyvale, CA (US); Maria Anagnosti, Mountain View, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/398,713

(22) Filed: Jan. 4, 2017

(65) Prior Publication Data

US 2017/0194310 A1    Jul. 6, 2017

Related U.S. Application Data

(60) Provisional application No. 62/274,378, filed on Jan. 4, 2016.

(51) Int. Cl.
| | |
|---|---|
| *G02B 6/00* | (2006.01) |
| *G02B 6/12* | (2006.01) |
| *G02B 6/42* | (2006.01) |
| *G02F 1/21* | (2006.01) |
| *G02F 1/225* | (2006.01) |
| *H01L 23/00* | (2006.01) |
| *H01L 25/18* | (2006.01) |
| *H01L 31/02* | (2006.01) |

(Continued)

(52) U.S. Cl.
CPC ............ *H01L 25/18* (2013.01); *G02B 6/00* (2013.01); *G02B 6/12004* (2013.01); *G02B 6/4274* (2013.01); *G02F 1/2255* (2013.01); *H01L 23/49827* (2013.01); *H01L 23/49838* (2013.01); *H01L 23/5381* (2013.01); *H01L 23/5386* (2013.01); *H01L 24/09* (2013.01); *H01L 24/49* (2013.01); *H01L 31/02005* (2013.01); *H04B 10/40* (2013.01); *H04B 10/506* (2013.01); *G02B 2006/12121* (2013.01); *G02B 2006/12123* (2013.01); *G02B 2006/12135* (2013.01); *G02B 2006/12147* (2013.01); *G02F 2001/212* (2013.01); *G02F 2201/127* (2013.01); *H01L 2924/00014* (2013.01); *H01L 2924/1433* (2013.01); *H01L 2924/15323* (2013.01)

(58) Field of Classification Search
None
See application file for complete search history.

(56) References Cited

U.S. PATENT DOCUMENTS

2016/0085038 A1*   3/2016   Decker ............... G02B 6/4204
                                                  385/14

* cited by examiner

*Primary Examiner* — Jerry Rahll
(74) *Attorney, Agent, or Firm* — David L. Soltz

(57) ABSTRACT

Methods, systems, and apparatus, including a photonic integrated circuit package, including a photonic integrated circuit chip, including an active optical element; an electrode configured to receive an electrical signal; a ground electrode; and a bond contact electrically coupled to the electrode; and an ASIC chip including circuitry configured to provide the electrical signal; and a bond contact that is electrically coupled to the circuitry; an bridge chip bonded to at least a portion of the photonic integrated circuit chip and at least a portion of the ASIC chip.

15 Claims, 56 Drawing Sheets

(51) Int. Cl.
*H04B 10/40* (2013.01)
*H04B 10/50* (2013.01)
*H01L 23/498* (2006.01)
*H01L 23/538* (2006.01)

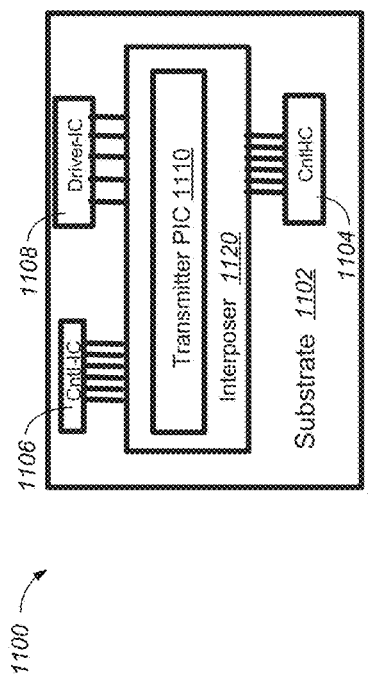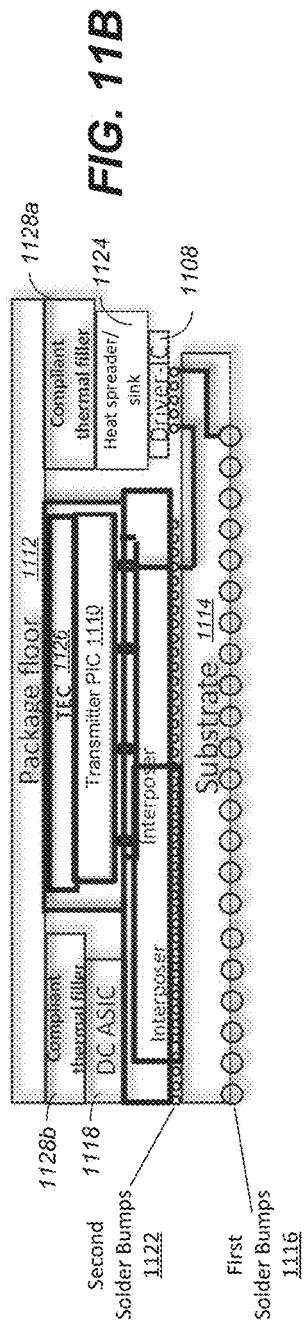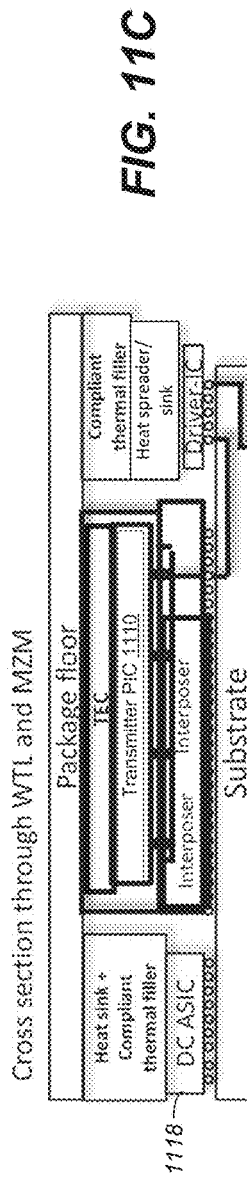
FIG. 11A
FIG. 11B
FIG. 11C

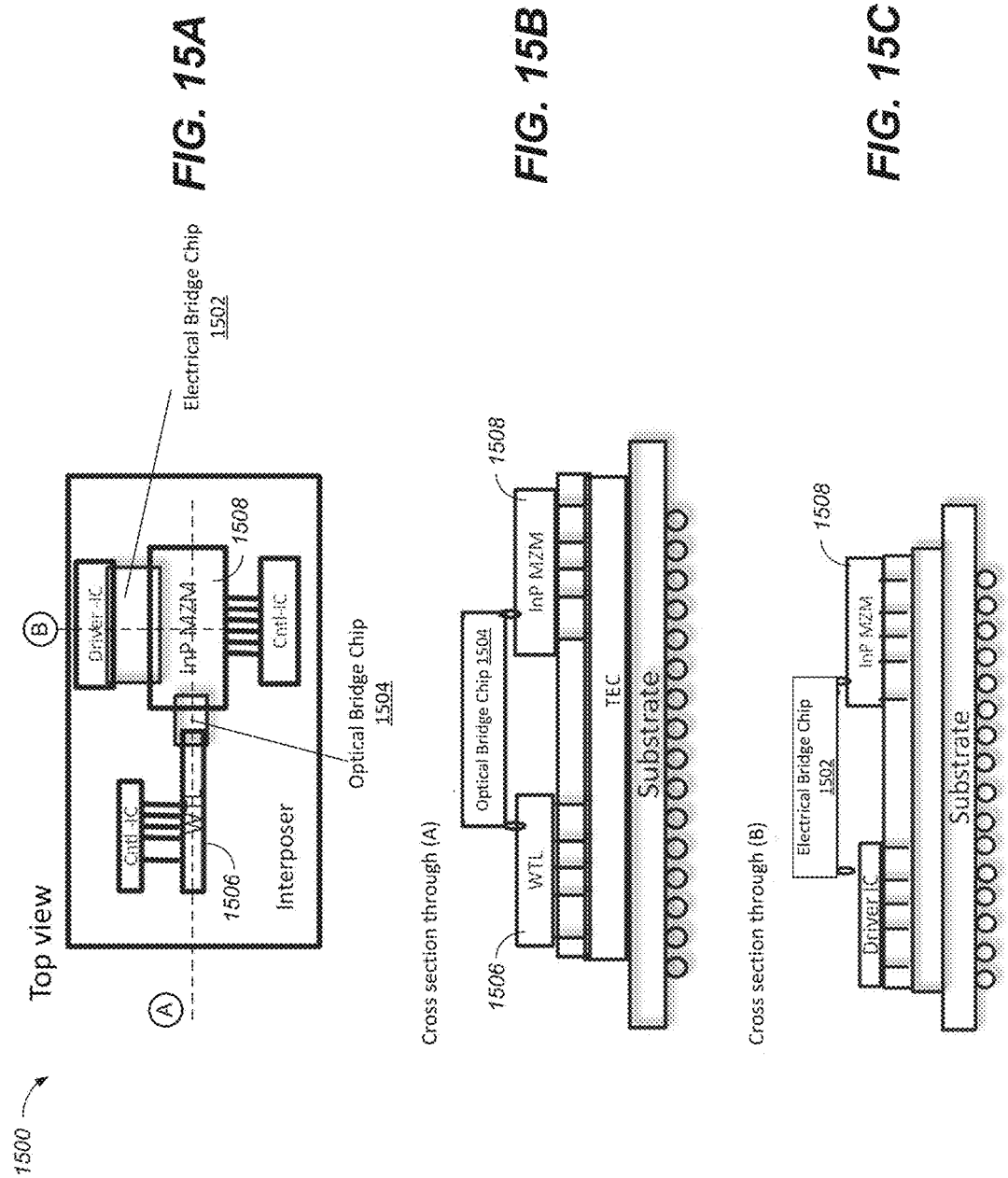

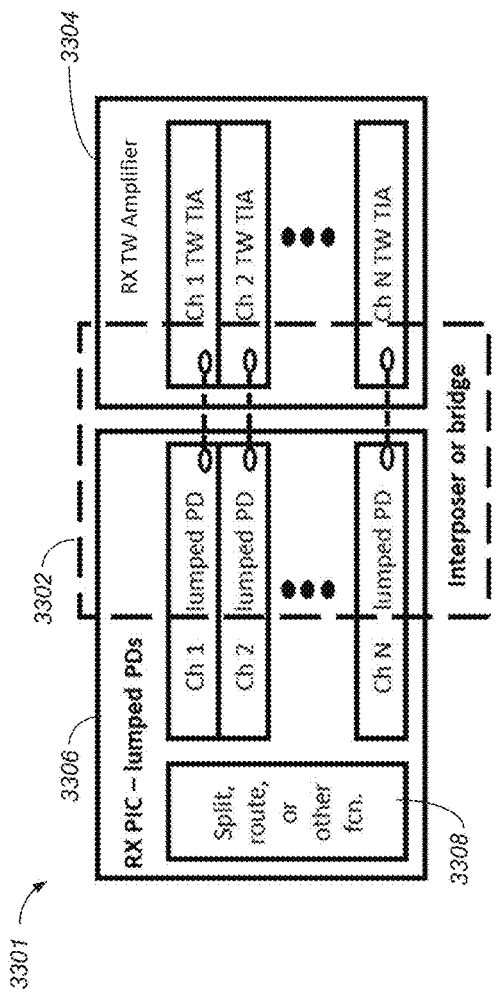

PHOTONIC INTEGRATED CIRCUIT PACKAGE

CROSS-REFERENCE TO RELATED APPLICATION

This patent application claims the benefit of U.S. Provisional Patent Application No. 62/274,378, filed Jan. 4, 2016, which is incorporated by reference herein.

TECHNICAL FIELD

The present disclosure is directed toward a photonic integrated circuit (PIC) arrangement and associated packaging that provides electrical connections to the PIC.

SUMMARY

In a general aspect, the subject matter described in this specification can be embodied in a photonic integrated circuit package, including a photonic integrated circuit chip, including an active optical element; an electrode configured to receive an electrical signal, where at least one characteristics of the active optical element is changed based on the electrical signal received by the electrode; a ground electrode; and a bond contact electrically coupled to the electrode; and an ASIC (application specific integrated circuit) chip including circuitry configured to provide the electrical signal; and a bond contact that is electrically coupled to the circuitry; an bridge chip bonded to at least a portion of the photonic integrated circuit chip and at least a portion of the ASIC chip, the bridge chip including a conductive trace formed on a surface of the bridge chip; a ground trace; a first conductive contact that is directly bonded to the bond contact of the photonic integrated circuit chip; and a second conductive contact that is directly bonded the bond contact of the ASIC chip, the first conductive contact and the second conductive contact electrically coupled to the conductive trace to provide the electrical signal from the circuitry of the ASIC chip to the electrode of the photonic integrated circuit chip.

The details of one or more implementations are set forth in the accompanying drawings and the description below. Other potential features and advantages will become apparent from the description, the drawings, and the claims.

BRIEF DESCRIPTION OF THE FIGURES

FIGS. 9A, 9B, 10A-10C, 11A-11C, 12A-12C, 13A-13D, 14A-14C, and 15A-15C show example packaging arrangements.

FIGS. 33A and 33B illustrate example arrangements where an interposer or a bridge chip provides electrical interconnects between a TW TIA and a receiver PIC chip.

DETAILED DESCRIPTION

Figure 1A:
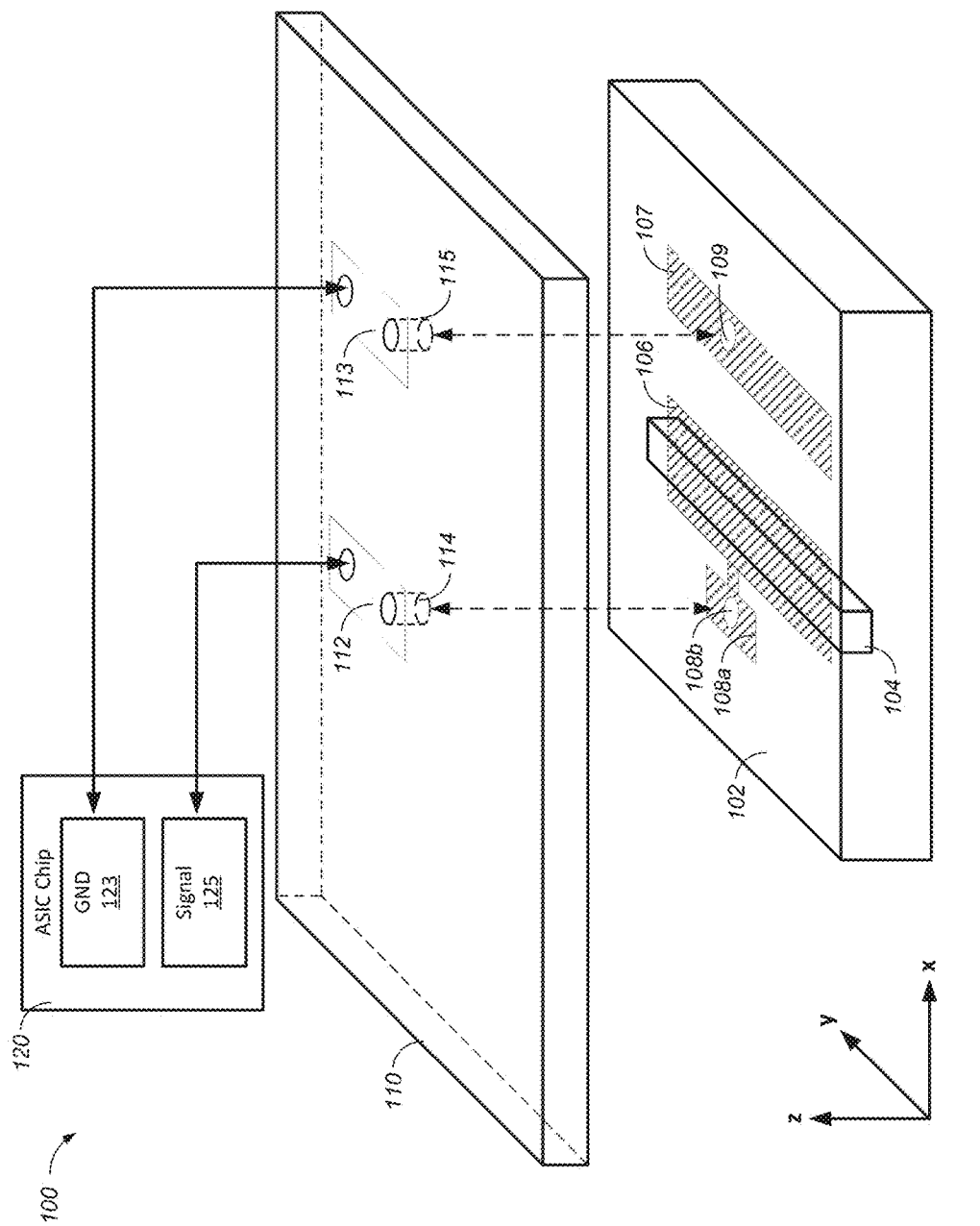
FIGS. 1A-1D illustrate example arrangements where an interposer provides electrical interconnects between a ASIC chip and a PIC chip having an optical device.

A photonic integrated circuit (PIC) provides a platform for integrating passive and active or multiple active optical devices on a single chip. For example, optical devices for enabling a transmitter, a receiver, or a transceiver may be implemented on a photonic integrated circuit. Active photonic devices are typically controlled by electrical signals, where the electrical signals may be supplied by external circuitry such as an application-specific integrated circuit (ASIC) chip. Conventionally, a single-channel traveling wave modulator may be packaged to an interposer. However, a single-channel configuration may not scale to multiple channels or multiple elements due to constraints such as geometry, electrical/optical routing, excessive PIC size and cost, and/or packaging. Moreover, connections between an ASIC and the interposer to drive a photonic integrated circuit require careful engineering considerations. In addition, an interpose configuration for a traveling wave modulator may not work on a lumped element on the PIC, and it is not obvious that a lumped element could benefit from an interposer.

This disclosure is directed to using one or more interposers or substrates including semiconductor or dielectric materials in a PIC package. The interposers may provide electrical interconnects between an ASIC chip and a PIC chip for controlling lumped-based and/or traveling wave-based active optical devices, such as modulators. Interposers may provide compact connections to multi-element (especially multi-active element) and/or multi-channel PICs. Such connections may otherwise be bulky or impractical with conventional wire-bonding technology. Interposers electrically connect radio frequency (RF) ASICs and RF PIC elements in a short distance with controlled impedance, and they may also connect slower-speed (quasi-direct current (DC)) PIC elements to slower speed ASICs or other driver circuitry that may be located in the same package or external to a module package. Radio frequency may range from 3 kHz to 300 GHz. ASICs may be arranged in one or more arrays that match the pitch of one or more of the PIC channel device array or arrays. As described in this disclosure, a channel includes the electrical circuitry and optical devices that are associated with one optical wavelength. A RF channel pitch is the physical spacing on a PIC chip or on an ASIC chip that is associated between two channels, which may include I-Q (in-phase and quadrature) modulators or detectors for both polarizations where these are routed and processed separately.

The subject matter described in this specification can be implemented in particular embodiments so as to realize one or more of the following advantages. For example, conductive traces may be formed with highly repeatable dimensions (e.g. defined by semiconductor processing techniques) as well as on a polished or otherwise smooth surface of an interposer to provide connections having well-controlled impedance characteristics, which reduces the variations in impedance across different connection points (i.e., element to element variation) as well as between different packages (i.e., package to package variation). As another example, the termination resistors for matching an impedance of a conductive trace may be provided off the PIC chip on the interposer or routed elsewhere in the package via the interposer, such that heat dissipation from the termination resistor does not affect the performance of the PIC chip. The PIC, therefore, may be more readily cooled or temperature regulated. As another example, by avoiding wire bonding, an inductance of a conductive trace may be reduced. As another example, in cases where a velocity mismatch between an electrical signal and an optical signal affects a performance of an active optical device, a length of a conductive trace on an interposer may be designed such that the electrical signal and the optical signal may arrive at designed location(s) on the PIC chip at the same time, i.e., matched phase. As another example, test points may be formed on a conductive trace on an interposer to test a frequency response of an active optical device or combined electro-optic ASIC-interposer-PIC performance (or subset thereof).

In general, in an optical communication system, an optical signal having a particular wavelength is modulated to carry data from a transmit node to a receive node. In a wavelength multiplexed (WDM) optical communication system, optical signals of different wavelengths may be combined from a transmit node to a receiver node as a multiplexed optical signal. The transmit node typically includes one or multiple lasers, each of which supplies continuous wave (CW) light at a particular wavelength to a corresponding modulator. Each modulator also receives at least one electrical signal that is associated with data to be transmitted to the receive node. Based on such electrical signal(s), each modulator outputs a respective one of the modulated optical signals. The receiving node typically includes one or multiple photodetectors. In a WDM optical communication system, the receiving node receives multiplexed optical signals and may include a demultiplexer (e.g., an arrayed waveguide grating (AWG), a wavelength-selective switch, ROADM or any other suitable demultiplexer) that separates the received multiplexed optical signal into a plurality of optical signals, each of which having a different wavelength. Alternatively, in an optical communication system employing coherent detection, optical power splitters may instead be employed to supply power-split portions to coherent detectors because the local oscillator beats with all the incoming signals but predominantly extracts the signal from the desired wavelength. The optical signal of each wavelength, or for each channel, is guided to a corresponding photodetector or balanced photodetector that converts the optical signal to an electrical signal. The electrical signal may be provided to a transimpedance amplifier (TIA), which, in turn, provides an electrical output for further processing, such as analog to digital conversion, carrier recovery, and forward error correction. The wavelength-selecting or power splitting functions may be located on the receiver PIC or not on the receiver PIC, depending on the optical system functionality requirements and intended use. Although optical signal demultiplexing or power splitting are shown located on PIC in the following examples, it should be considered optional in some cases.

High speed active optical devices for the purpose of this invention include electro-optic components such as lasers, optical amplifiers, modulators, photodetectors, variable optical attenuators, and variable optical phase shifters. A number of these devices (e.g., modulators, photodetectors) may be implemented in either a "lumped" or "traveling wave (TW)" configuration. For example, modulators include Mach-Zehnder modulators (MZMs) may be implemented in either a "lumped" or "traveling wave" configuration. Lumped MZMs typically have a length that is less than the optical propagation length of about a quarter of one bit in the semiconductor waveguide, i.e, the distance light travels in the waveguide during the time required to transmit one bit. In general, the maximum modulation frequency of such lumped MZMs is approximately limited to a value based on an RC time constant, where R is a resistance associated with a driving circuit of the lumped MZM and C is a capacitance of the lumped MZM. However, the impedance associated with a driver circuit (e.g., modulator driver and interconnect to MZM) will change the circuit and may reduce or enhance the overall bandwidth of the circuit. For instance, the use of a 50-ohm probe or an impedance that is not very well controlled may degrade the apparent bandwidth of the modulator, but the bandwidth may be extended beyond the nominal RC time constant calculation by the use of series inductive peaking implemented with the appropriate length, cross-sectional area and configuration of signal and ground bond wires or metal traces arranged as coplanar waveguides as well as peaking in the modulator driver (MZMD) circuit itself. A controlled impedance for the connection between the MZMD and the MZM is important to achieve modulation ≥64 Gbaud using a lumped MZM. A controlled impedance is an impedance that can be matched to another element (e.g., transmission line), or one where it enhances the combined electro-optical frequency response of the package.

Traveling wave MZMs, on the other hand, are based on a transmission line structure that has a signal electrode to which the data carrying electrical signal is applied, and at least one ground electrode. The signal electrode may be a single electrode or may be segmented (with appropriate timing synchronization between electrodes). A waveguide of the MZM is provided adjacent the signal electrode, such that an electric field generated by the signal electrode can induce refractive index changes in the waveguide, thereby altering the phase of light propagating in the waveguide in accordance with the applied electrical signal. The capacitance of a traveling wave MZM is distributed along the length of the device, and, therefore, traveling wave MZMs can output optical signals having frequencies higher than those associated with lumped MZMs. However, the length of a traveling wave MZM may be longer than that of a lumped MZM because the induced phase change per unit length is smaller for a traveling wave MZM. As an example, lumped nested MZMs may be about 200-400 µm in length for data rates up to 64 Gbaud, but traveling wave MZMs may be about 1-3 mm in length for the same data rate.

Photodetectors may also be implemented in either a "lumped" or "traveling wave" configuration. The bandwidth of a lumped photodetector is limited by the response of the current source and the response of the overall circuit. In general, the response of the current source is determined by the velocities of photo-generated electrons and holes and the distances these free carriers travel. The maximum response frequency of lumped photodetectors is generally approximately limited to a value based on an RC time constant, where R and C are the resistance and capacitance of the lumped photodetector, but the impedance associated with an amplifier circuit (e.g., TIM and interconnection between the circuit and probe will change the circuit and may reduce or enhance the overall bandwidth of the detection circuit. For instance, the use of a 50-ohm probe may degrade the apparent bandwidth of the photodetector, but the bandwidth may be extended beyond the nominal RC time constant calculation by the use of series inductive peaking implemented with the appropriate length, cross-sectional area and configuration of signal and ground bond wires or metal traces arranged as coplanar waveguides and/or peaking in the response of the amplifier circuit itself.

Traveling wave photodetectors are based on a transmission line structure that is modelled by a terminated section of transmission line with an exponentially decaying photo-current source propagating on the transmission line at the optical group velocity. The traveling wave photodetector velocity-mismatch bandwidth limitation depends on the optical absorption coefficient and a mismatch between optical group velocity and electrical phase velocity, as opposed to an RC bandwidth limitation determined by the total junction area of the photodetector and other parasitic and interconnected circuit elements. Thus, traveling wave photodetectors are not subject to the same RC bandwidth limitation as lumped-element photodetectors, and may simultaneously have a large bandwidth and high efficiency. However, the length of a traveling wave photodetector may be longer than that of a lumped photodetector because of a lower absorption efficiency. As an example, lumped photodetectors may be about 10-100 µm in length for data rates up to 64 Gbaud, but traveling wave photodetectors may be about 1 mm in length for the same data rate.

PICs may include various active optical devices integrated onto a common semiconductor substrate in order to provide a multi-channel and/or WDM signal. However, integration of a plurality of active optical devices on a PIC presents various challenges. For example, the relatively long length of TW active optical devices may reduce device density on the PIC, such that the size of the PIC substrate or die must be increased to accommodate multiple channels. Accordingly, fewer die can be obtained from a given wafer. Further, the number of defects that may occur on a die may increase, such that yields may suffer. Also, the integration of a lumped element in a PIC that requires high-speed modulation may result in significant compromises to enable routing of electrical connection metal layers on the PIC, the placement of the lumped element in sufficient proximity to the high-speed driver or amplifier circuit, and/or the provision for bond pads and wire-bonding that have sufficiently low and controlled inductance. These elements may make the implementation of lumped elements in a PIC impractical (e.g., by having placement and routing demands drive significant increases to PIC die size, thereby substantially increasing cost and potentially compromising reliability and manufacturability. An interposer is enabling for such devices in that it allows the routing of high-speed (and DC) signals on a substrate external to the PIC and provides the possibility of low-inductance controlled impedance transmission lines thus enabling substantial freedom (and optimization) of PIC layout.

Thermal management creates another challenge. For high-speed applications, the electrodes for active optical devices may be terminated with a resistor that precisely matches the impedance of the transmission line to avoid reflections detrimental to signal integrity. Such impedance matching resistors may generate significant amount of heat, particularly at higher drive voltages and frequencies, which can adversely affect performance of optical devices if the impedance matching resistors are implemented on the PIC. Heat sinks or thermoelectric coolers (TECs) may be employed to cool the PICs, but the thermal load associated with other PIC elements, such as lasers and variable optical attenuators (VOAs), may generate an excessive amount of heat that may not be adequately dissipated by the heat sink or TEC. In addition, connections to multiple termination resistors on the PIC in such a way to maintain impedance matching may be difficult.

Moreover, the impedance of the signal electrode is based, in part, on the length of the electrode. The signal electrode on a PIC is provided over etched semiconductor and dielectric layers that may have thicknesses that vary from one process run to the next. Accordingly, the overall dimensions of the signal electrode and surrounding material properties may vary from one process run to the next and/or across a wafer. Such dimensional changes, although small, can result in PICs having different signal electrode impedances, particularly at high frequencies. Accordingly, the signal electrode may not be impedance matched on some PICs.

In addition, in cases where wire bonds or coplanar waveguides are used to provide electrical interconnects between a PIC and an ASIC, wire bonds to the signal and ground electrodes may add inductance which may further affect performance of an active optical device by reducing the frequency or speed of the active optical device. In some cases, series inductance may enhance the frequency response, but at very high speeds series inductance usually impairs the frequency response. Matching impedance generally leads to reduced reflections and higher bandwidth.

In light of the foregoing, there is a need for a PIC package having a compact design suitable for integration of multiple active optical devices on a single-channel or a multi-channel PIC. In addition, the optical devices on a PIC should be adequately cooled and have a controlled signal conductor length.

Consistent with the present disclosure, various PIC layouts are provided that have a compact design so that more PICs or die that can be obtained from a given wafer. In addition, various electrode and packaging structures are described that include a single-channel or a multi-channel PIC having impedance matching, improved thermal management, and less inductance compared wire bonding. Furthermore, it's desirable for gain sections of lasers provided on the PIC to be perpendicular to reverse-biased p-i-n phase adjustors and RF sections of phase modulators also provided on the PIC (for device processing and material properties), and, in certain applications, for the modulator sections to be as identical as possible to each other in length, width, and orientation on the wafer. The electrode and packaging structures described in the disclosure may be used for any other suitable PIC elements. For example, the electrode and packaging structures described in the disclosure may be used for a lumped electro-absorption modulator.

Reference will now be made in detail to the exemplary embodiments of the present disclosure, examples of which are illustrated in the accompanying drawings. Wherever possible, the same reference numbers will be used throughout the drawings to refer to the same or like parts.

FIG. 1A illustrates a simplified illustration of an example arrangement 100, where an interposer 110 provides an electrical interconnect between an ASIC chip 120 and a PIC chip 102 having a lumped optical device 104. The PIC chip 102 includes a lumped active optical device 104, a lumped electrode 106, a ground electrode 107, a contact region 108a, a bond contact 108b formed on the contact region 108a, and a bond contact 109 formed on the ground electrode 107. The PIC chip 102 may be implemented based on III-V materials such as indium-phosphide (InP), silicon, or any other suitable PIC platform. The lumped active optical device 104 may be a lumped modulator (MZM, electro-absorption modulator or other types of modulators), a lumped photodetector, a directly modulated laser, or any suitable lumped active optical device that may be implemented on a PIC. An optical signal may propagate along the +y or −y direction in the lumped active optical device 104. The lumped electrode 106 and the contact region 108a are electrically coupled, and may be formed using a conductive material such as gold, platinum, aluminum, copper, titanium, or any other suitable layers or combinations of conductors or alloys. The bond contact 108b may include a gold or solder bump or any other conductive adhesive material.

In some implementations, the ASIC chip 120 may include circuitry that provides a high-speed data signal to the lumped electrode 106 to control the active optical device 104. The ASIC chip 120 may include a driver, an amplifier, or other suitable circuit. For example, the ASIC chip 120 may be a MZM driver that provides a high-speed data signal to the lumped electrode 106 to control a lumped MZM modulator (i.e., the active optical device 104). In some implementations, the ASIC chip 120 may include circuitry that senses a high-speed data signal from the lumped electrode 106. For example, the ASIC chip 120 may be a TIA that converts a sensed current from the lumped electrode 106 that is generated by a lumped photodetector (i.e., the active optical device 104). In some implementations, the ASIC chip 120 may include circuitry that provides a DC or quasi-DC signal such as a ground voltage or a biased voltage/current or control bias and/or signals.

The interposer 110 includes a conductive trace 112, a ground trace 113, and conductive vias 114 and 115. The interposer 110 may be made of a semiconductor material (e.g., silicon), a ceramic, an insulating material (e.g., silicon oxide), or an organic material. In general, the interposer 110 provides adequate dimensional control, workable transmission line impedance (e.g., 20-200 ohms), and low RF loss. In some implementations, the interposer 110 may be bonded to the PIC chip 102 using flip-chip bonding or wafer bonding techniques. The conductive trace 112 formed on a smooth surface of the interposer 110 opposite the surface facing the PIC chip 102 is electrically coupled to the ASIC chip 120. In some implementations, the conductive trace 112 may be electrically coupled to a signal contact 125 of the ASIC chip 120 through wire bonding. In some other implementations, the conductive trace 112 may be electrically coupled to the signal contact 125 of the ASIC chip 120 through flip-chip or wafer bonding. Metal or other conductive material provided in the via 114 through the interposer 110 electrically connects the conductive trace 112 to the lumped electrode 106, so that electrical signals may be supplied from the ASIC chip 120 to the PIC chip 102, or vice versa.

The ground trace 113 formed on the smooth surface of the interposer 110 opposite the surface facing the PIC chip 102 is electrically coupled to a reference voltage or ground 121. As used in this disclosure, a smooth surface refers to a surface having a root mean square (RMS) roughness that is within a predetermined threshold for enabling a high speed application. Metal or other conductive material provided in the via 115 through the interposer 110 electrically connects the ground trace 113 to the ground contact 123 of the ASIC chip 120, so that a ground voltage may be provided to the PIC chip 102. Multiple metal traces may be employed on the interposer, either on a single level or separated by insulating (e.g., dielectric) materials and interconnected by vias. The interposer may be connected to the package by either wire-bonding or bump bonding. For bump bonding, it may be advantageous to have the interposer include thru-hole vias to enable interconnection (and possibly routing) on the other side of the interposer 110. The routing on the backside of the interposer 110 may be with multiple traces on multiple levels (separated by insulating layers).

Although not shown in FIG. 1A and other figures in this disclosure, an interposer, e.g., the interposer 110, may include other circuit elements such as capacitors and inductors that are either fabricated as part of the interposer or are attached as discrete components, such that the PIC and/or the ASIC chip may integrate additional elements to better utilize the real-estate on the chip(s). An interposer may include vias and/or bond contacts for establishing electrical connections with another component, e.g., a PIC or an ASIC.

Although not shown in FIG. 1A, the PIC chip 102 may include multiple active optical devices (DC, lumped, or TW wave), and the interposer 110 may include multiple conductive traces to electrically couple the ASIC chip 120 to the multiple active optical devices of the PIC chip 102 similar to the technique as described in FIG. 1A. As described in more detail in reference to FIGS. 30A, 30B, 32A, and 32B, the PIC chip 102 may include multiple lumped active optical devices, and the interposer 110 may include multiple conductive traces to electrically couple the ASIC chip 120 to the multiple lumped active optical devices of the PIC chip 102 similar to the technique as described in FIG. 1A. In addition, the interposer 110 may be used to establish electrical connections between a lumped ASIC chip and one or more DC, quasi-DC, lumped, and/or TW elements implemented on a PIC.

Although not shown in FIG. 1A and other figures, an interposer such as the interposer 110 enables a PIC to have a RF channel pitch that is the same or different from a RF channel pitch on the ASIC chip. For example, if the RF channel pitch on the ASIC chip is larger than the RF channel pitch on the PIC, conductive traces on the interposer may be arranged to fan out on the interposer to accommodate the different pitches.

Figure 1B:
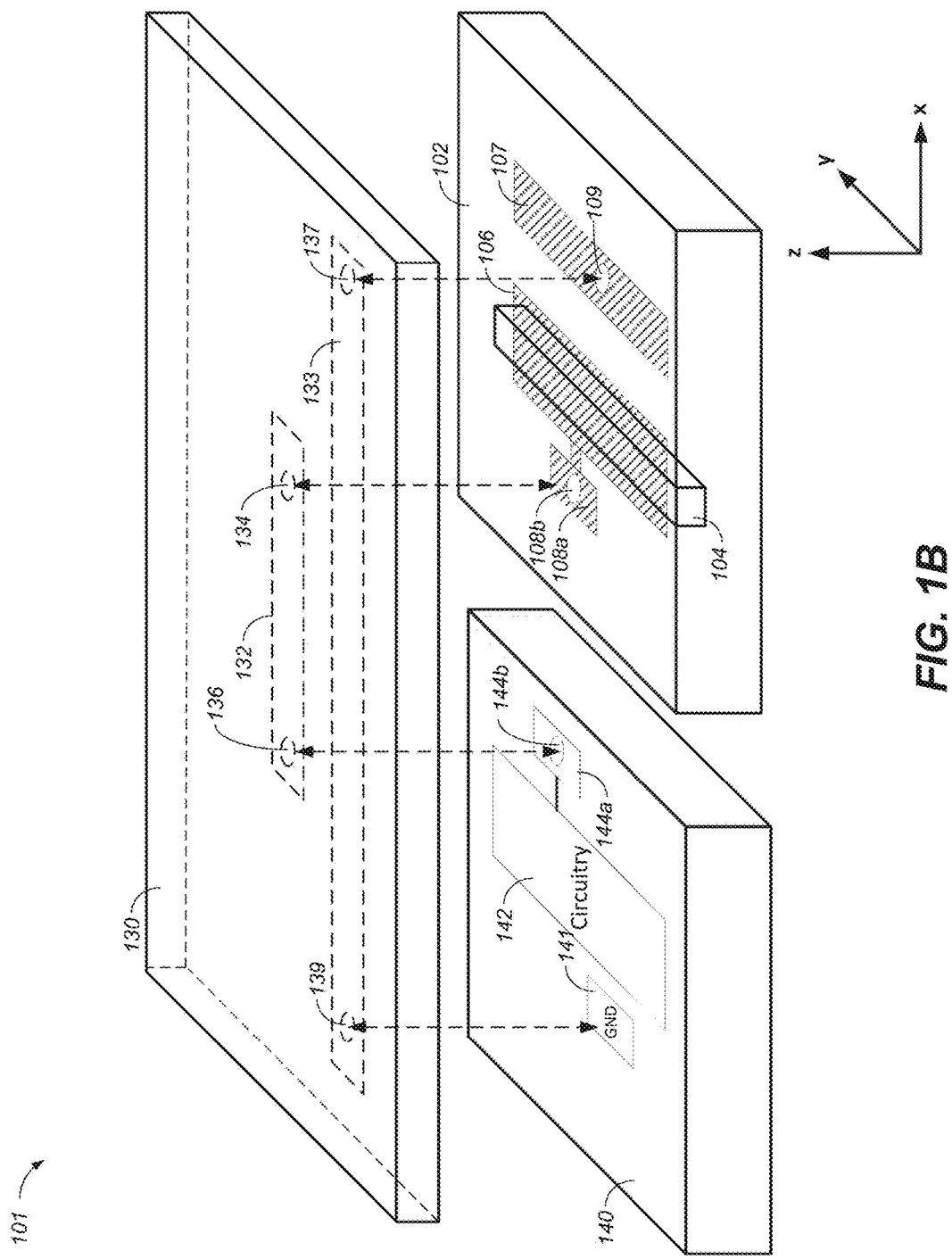

FIG. 1B illustrates a simplified illustration of an example arrangement 101, where an interposer 130 provides an electrical interconnect between a ASIC chip 140 and a PIC chip 102 having a lumped optical device 104. Similar to the descriptions in reference to FIG. 1A, the PIC chip 102 includes a lumped active optical device 104, a lumped electrode 106, a ground electrode 107, a contact region 108a, a bond contact 108b formed on the contact region 108a, and a bond contact 109 formed on the ground electrode 107.

The ASIC chip 140 includes circuitry 142, a ground contact 141, a contact region 144a, and a bond contact 144b. The circuitry 142 may include circuitry for a MZM driver, a TIA, a DC voltage, or any other suitable driver circuitry. The contact region 144a is electrically coupled to the circuitry 142, and may be formed using a conductive material such as gold, platinum, aluminum, copper, titanium, or any other suitable layers or combinations of conductors or alloys. The bond contact 144b may include a gold or solder bump or any other conductive adhesive material.

The interposer 130 includes a conductive trace 132, a ground trace 133, and conductive bond pads 134, 136, 137, and 139. The interposer 130 may be made of a semiconductor material (e.g., silicon), a ceramic, an insulating material (e.g., silicon oxide), or an organic material. In some implementations, the interposer 130 may be a very thin (e.g., 50 to 300 µm) silicon, organic or other material that does not need to provide hermetic sealing between the interposer 130 and the PIC chip 102 or between the interposer 130 and the ASIC chip 140. In some implementations, the interposer 130 may be bonded to the PIC chip 102 and the ASIC chip 140 using flip-chip or wafer bonding techniques. Metal or other conductive material provided on the conductive pads 134 and 136 of the interposer 130 electrically connects the conductive trace 132 to the lumped electrode 106 and the circuitry 142, respectively, so that electrical signals may be supplied from the ASIC chip 140 to the PIC chip 102, or vice versa. Metal or other conductive material provided on the conductive pads 137 and 139 of the interposer 130 electrically connects the ground trace 133 to the ground electrode 107 and the ground contact 141 of the ASIC chip 140 in a flip-chip bonding arrangement. The interposer 130 may be referred to as a "bridge chip" because the interposer 130 bridges between two chips, e.g., the PIC chip 102 and the ASIC chip 140. In some implementations, a bridge chip includes RF electrical signal routing, but does not provide substantial mechanical support or heat sinking for the PIC and the ASIC. By contrast, an interposer such as the interposer 110 as described in FIG. 1A may provide mechanical support or heat PIC sinking function in addition to RF electrical signal routing.

As described in more detail in reference to FIGS. 30A, 30B, 32A, and 32B, the PIC chip 102 may include multiple lumped active optical devices, and the interposer 130 may include multiple conductive traces to electrically couple the ASIC chip 140 to the multiple lumped active optical devices of the PIC chip 102 similar to the technique as described in FIG. 1B. In addition, the interposer 130 may be used to establish electrical connections between a lumped ASIC chip and one or more DC, quasi-DC, lumped, and/or TW elements implemented on a PIC.

Figure 1C:
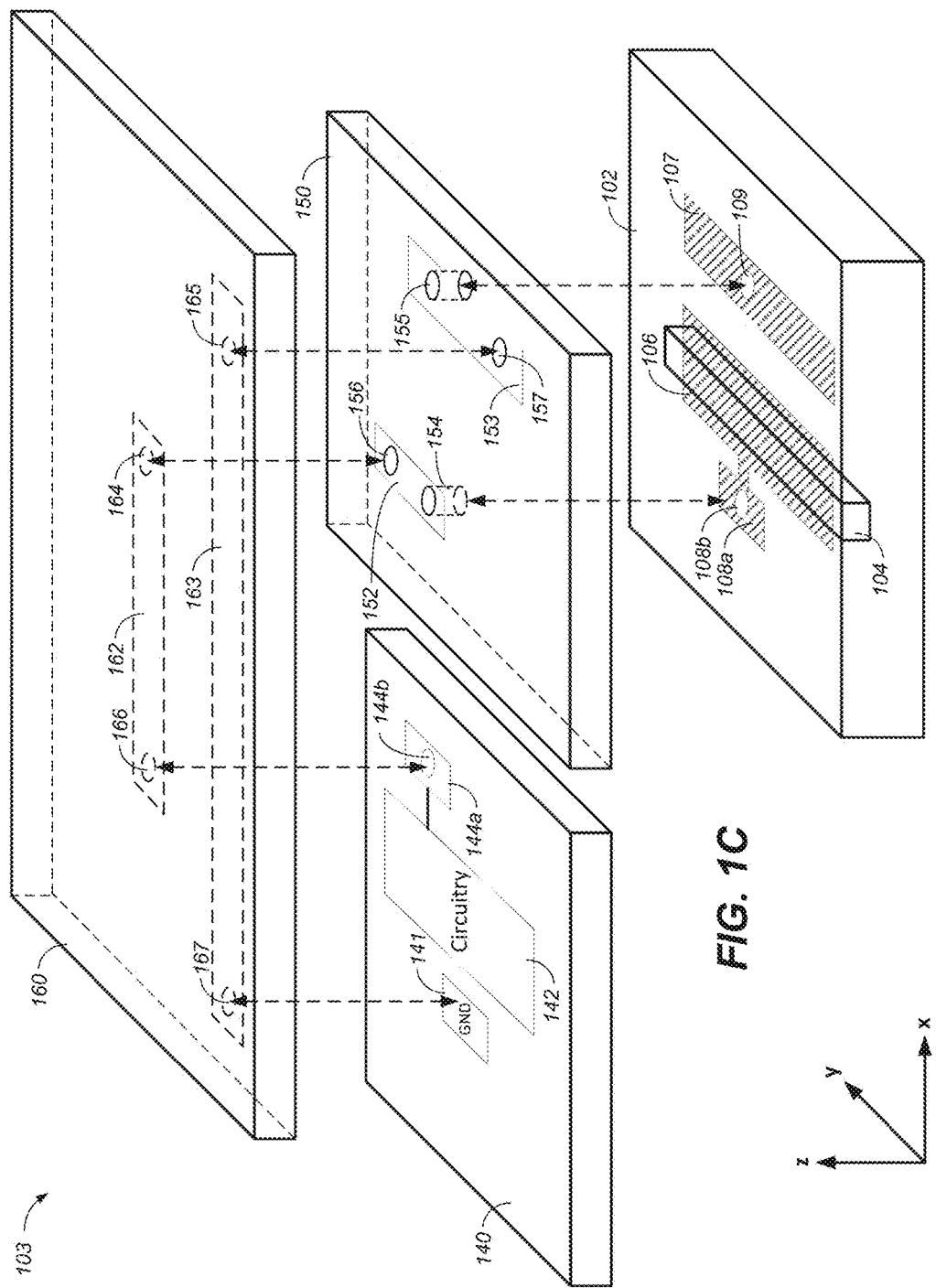

FIG. 1C illustrates a simplified example arrangement 103, where a first interposer 150 and a second interposer 160 provide an electrical interconnect between a ASIC chip 140 and a PIC chip 102 having a lumped optical device 104. Similar to the descriptions in reference to FIG. 1A, the PIC chip 102 includes a lumped active optical device 104, a lumped electrode 106, a ground electrode 107, a contact region 108a, a bond contact 108b formed on the contact region 108a, and a bond contact 109 formed on the ground electrode 107. Similar to the descriptions in reference to FIG. 1B, the ASIC chip 140 includes circuitry 142, a ground contact 141, a contact region 144a, and a bond contact 144b.

The first interposer 150 includes a conductive trace 152, a ground trace 153, conductive vias 154 and 155, and bond pads 156 and 157. The first interposer 150 may be made of a semiconductor material (e.g., silicon), a ceramic, an insulating material (e.g., silicon oxide), or an organic material. In some implementations, the first interposer 150 may be bonded to the PIC chip 102 using flip-chip bonding techniques.

The second interposer 160 (a bridge chip) includes a conductive trace 162, a ground trace 163, and conductive bond pads 164, 165, 166, and 167. The second interposer 160 may be made of a semiconductor material (e.g., silicon), a ceramic, an insulating material (e.g., silicon oxide), or an organic material. In some implementations, the interposer 160 may be bonded to the first interposer 150 and the ASIC chip 140 using flip-chip bonding techniques. Metal or other conductive material in the conductive trace 162 provides electrical interconnects between the conductive trace 152 and the circuitry 142, so that electrical signals may be supplied from the ASIC chip 140 to the PIC chip 102, or vice versa, or at least in the case of the photodiode, both. Metal or other conductive material in the conductive trace 163 provides electrical interconnects between the ground trace 153 and the ground 141 of the ASIC chip 140. For example, the conductive bond pad 167 may be bonded to the ground contact 141 in a flip-chip bonding arrangement.

Although not shown in FIG. 1C, the PIC chip 102 may include multiple active optical devices, and the first interposer 150 and the second interposer 160 may include multiple conductive traces to electrically couple the ASIC chip 140 to the multiple lumped active optical devices of the PIC chip 102 similar to the technique as described in FIG. 1C. These multiple traces may be on one level or multiple levels. If the multiple traces are on multiple levels, the multiple levels would be electrically isolated from each other.

As described in more detail in reference to FIGS. 30A, 30B, 32A, and 32B, the PIC chip 102 may include multiple lumped active optical devices, and the first interposer 150 and the second interposer 160 (bridge chip) may include multiple conductive traces to electrically couple the ASIC chip 140 to the multiple lumped active optical devices of the PIC chip 102 similar to the technique as described in FIG. 1C. In addition, the first interposer 150 and the second interposer 160 may be used to establish electrical connections between a lumped ASIC chip and one or more DC, quasi-DC, lumped, and/or TW elements implemented on a PIC.

Figure 1D:
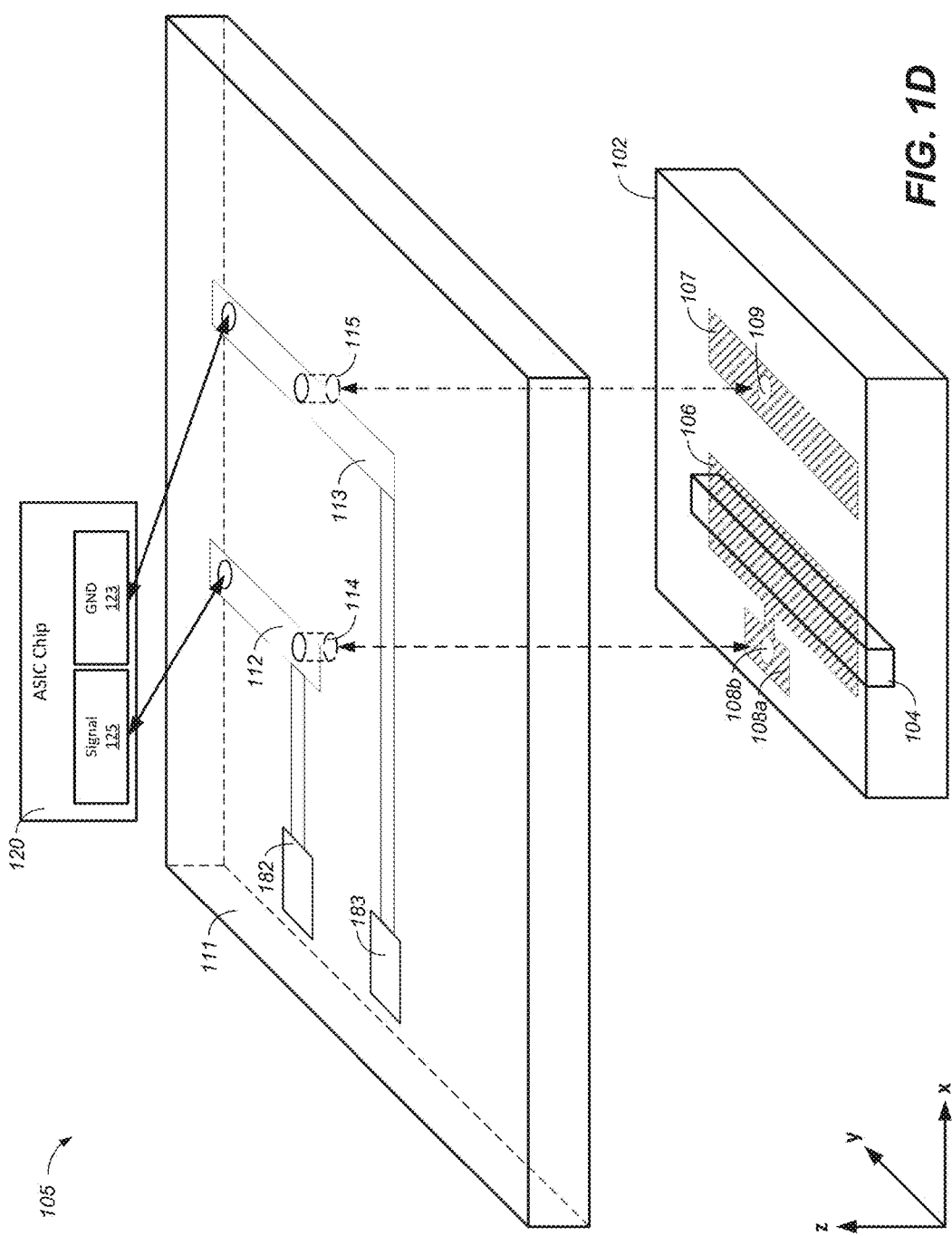

FIG. 1D illustrates a simplified illustration of an example arrangement 105. The example arrangement 105 is similar to the example arrangement 100 as described in reference to FIG. 1A. The example arrangement 105 includes an interposer 111, which is similar to the interposer 110 as described in FIG. 1A. However, the interposer 111 further includes a testing contact 182 that is electrically coupled to the conductive trace 112 and a testing contact 183 that is electrically coupled to the ground trace 113. The testing contacts 182 and 183 may be used to test one or more DC and/or RF characteristics of the lumped active optical device 104 or the ASIC circuit. Additionally, some of the characteristics of the interconnects may be tested. In some implementations, the testing may be performed after the PIC chip 102 is bonded to the interposer 111 but before the PIC 102 chip is packaged with the rest of the components, or after the ASIC chip 120 is bonded, but before it is packaged, or after the ASIC and PIC chip(s) are both bonded. The testing contacts 182 and 183 allow the PIC chip 102 to be tested through the interposer 111 without causing damages to the contact pads formed on the PIC. In some implementations, the testing contacts 182 and 183 may be electrically isolated from the conductive trace 112 after testing. For example, the testing contacts 182 and 183 may be mechanically removed (e.g., through polishing) from the interposer 111. As another example, the testing contacts 182 and 183 may be removed by a laser or by a fuse that can be "blown" open by electrically overstress. In some implementations, the testing contacts 182 and 183 may be designed to act as a tuning stub for the transmission line and load, such that the testing contacts 182 and 183 may remain on the interposer 111 after testing. The stub may be located near the input or the output of the modulator, and it may act to match impedance and therefore enhance performance or else to have very high impedance and negligible influence on the transmission line under normal modulation.

Although not shown in FIG. 1D, the interposer 111 may include multiple testing contacts for performing DC and RF tests. For example, to measure a S parameter of a lumped active optical device, multiple testing contacts including a first testing contact for ground, a second testing contact for signal, and a third testing contact for ground may be formed on the interposer 111. As described in more detail in reference to FIGS. 30A, 30B, 32A, and 32B, the PIC chip 102 may include multiple lumped active optical devices, and the interposer 111 may include multiple conductive traces to electrically couple the ASIC chip 120 to the multiple lumped active optical devices of the PIC chip 102 similar to the technique as described in FIG. 1D. In addition, the interposer 111 may be used to establish electrical connections between a lumped ASIC chip and one or more DC, quasi-DC, lumped, and/or TW elements implemented on a PIC.

Figure 2A:
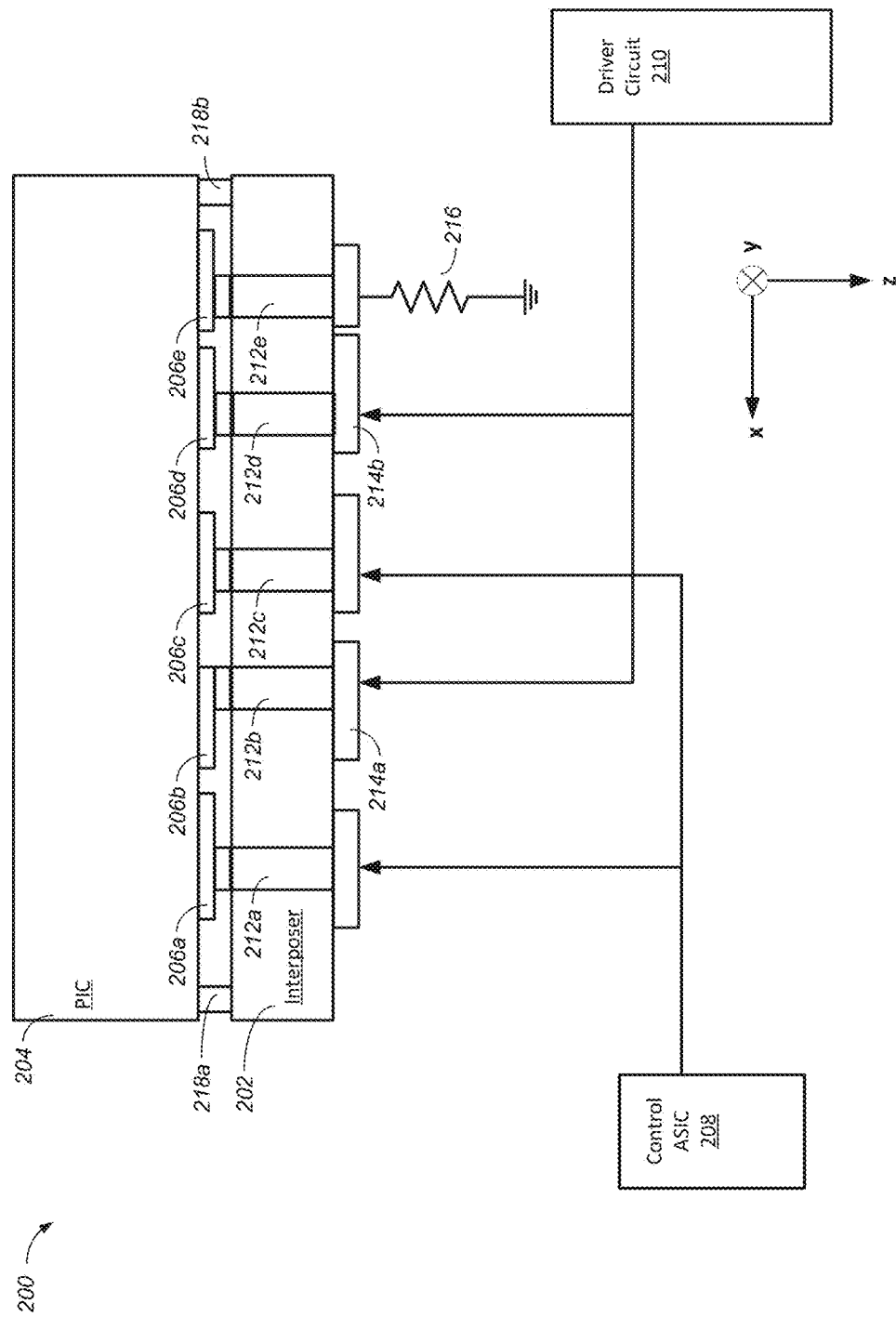
FIGS. 2A-2C illustrate a package where an interposer provides electrical interconnects between a ASIC chip and a PIC chip having an optical device.

FIG. 2A illustrates a simplified cross-sectional view of a package 200 consistent with the present disclosure. Package 200 includes a substrate or interposer 202 that may be made of a semiconductor material, such as silicon, a ceramic, or an organic material. An example of the interposer 202 may be the interposer 110 as described in FIG. 1A. Package 200 also includes a PIC 204 having one or more active optical devices other optical devices integrated on a common substrate, along with conductive traces, signal and ground electrodes, and bonding pads 206a-206e. An example of the PIC 204 may be the PIC chip 102 as described in FIG. 1A. In one example, the signal electrode is a continuous trace that runs along a surface of the InP PIC.

Traces on a smooth surface of the interposer 202 opposite the surface facing the PIC 204 electrically connect to a control application specific integrated circuit (ASIC) 208, for example, as well a high speed driver circuit 210. In some implementations, the ASIC 208 or the driver circuit 210 or both may be flip-chip bonded to the interposer 202. In the wire-bonded implementations, all of the ASICs may not be mounted on the interposer. This is especially true for ASICs that are not high-speed drivers/amplifiers (e.g., laser drivers, modulator control ASICs, etc.). In some implementations, the ASIC 208 or the driver circuit 210 or both may be wire-bonded to the interposer 202. An example of the control ASIC 208 and the driver circuit 210 may be the ASIC chip 120 as described in FIG. 1A. Metal or other conductive material provided in vias 212a-212e through the interposer 202 electrically connect such traces to the conductive traces, signal/ground electrodes and bonding pads 206a-206e on the PIC 204, so that control signals may be applied from the control ASIC 208 to the PIC 204 and monitoring signals from the PIC 204 may be supplied to the control ASIC 208. Also, drive signals from the driver circuit 210 may be applied to signal electrodes on the PIC 204 through connections by way of interposer traces on the interposer conductive vias 212a-212e through it. As an example, modulator drive signals may be supplied to one or more continuous signal traces on the conductive traces 214a and 214b formed on a surface of the interposer 202 opposite the PIC 204. As discussed in greater detail below with respect to FIGS. 3A-3C, the signal electrode on the PIC 204 may be a lumped electrode that contacts the continuous signal trace on the interposer 202 through a corresponding conductive via. In some implementations, an impedance-matching termination resistor 216 may also be connected between a continuous signal trace on the interposer 202 and ground. The termination resistor 216 may advantageously be provided off the PIC 204 and may be easily connected in such a way as to maintain impedance matching.

Package 200 may provide several advantages. For example, signal traces are formed on a polished or otherwise smooth surface of the interposer 202 to provide connection to conductors on the PIC 204. Thus, such traces, and the signal traces in particular, may have controlled lengths that are not subject to processing variations that cause changes in underlying layer thicknesses, which may occur if such traces were provided directly on the PIC 204. As noted above, such process variations may cause dimensional changes and, thus, changes in the impedance of the signal electrode from PIC to PIC. Accordingly, the impedance of the signal traces on each PIC 204 may be controlled to be more precisely matched to the termination resistor 216.

In addition, as noted above, the termination resistors may be provided off the PIC 204, such that heat is dissipated from the resistors at locations that do not appreciably increase the temperature of the PIC 204 and do not provide an additional thermal load on a thermoelectric cooler (TEC) or heat sink coupled to the PIC 204. The PIC 204, therefore, may be more readily cooled or temperature regulated.

Further, connections from the driver circuit 210 and/or the control ASIC 208 to the interposer traces may be made with a thermally insulating bridge chip, as discussed with respect to FIG. 1C. Accordingly, wire bonding can be avoided, and therefore impedance can be better matched and inductance may be reduced.

Figure 2B:
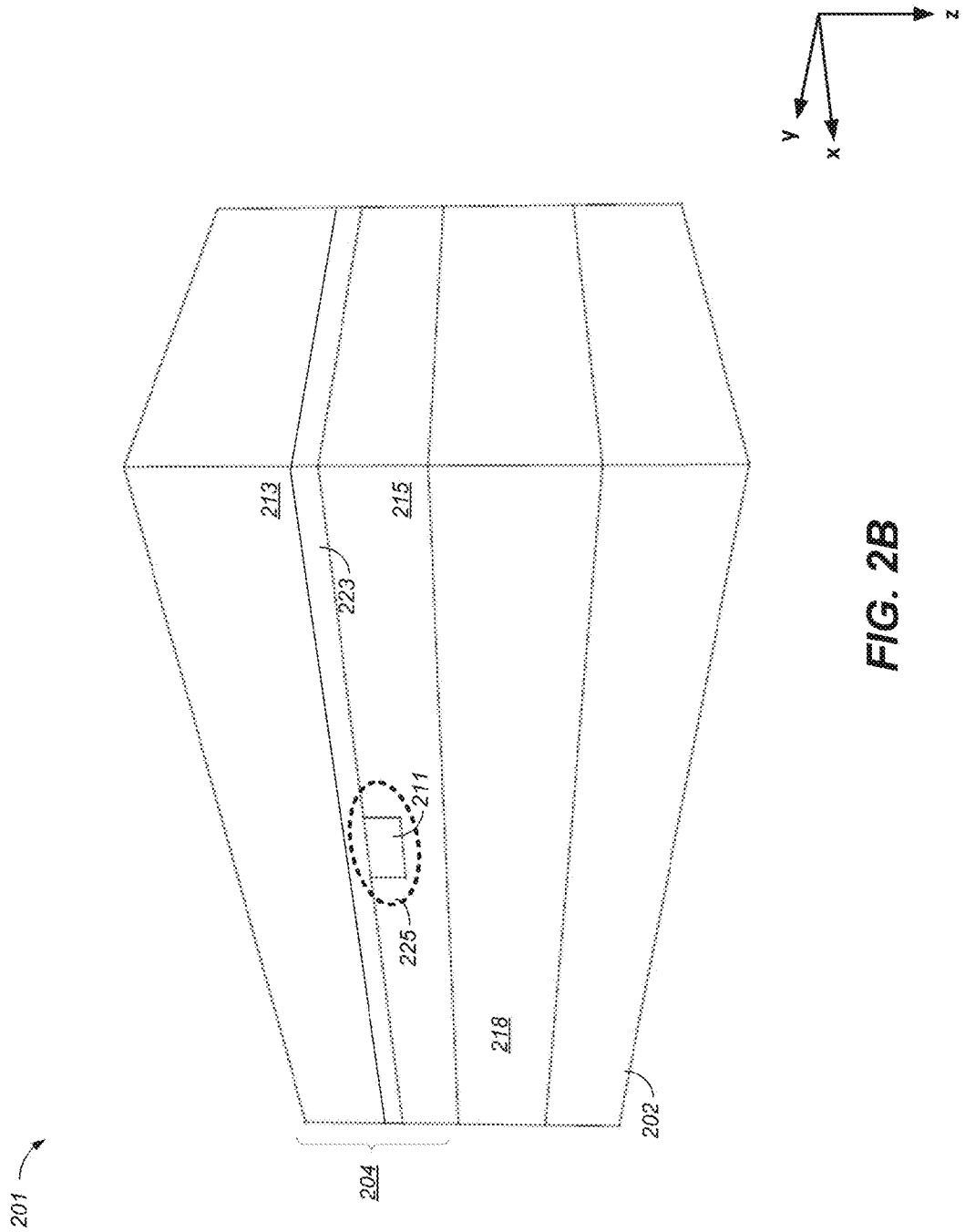

Moreover, as further shown in FIG. 2A, an additional metallization 218a and 218b may optionally be provided on the interposer in order to hermetically seal and protect the elements of the PIC 204 (lasers, modulators, etc.) in a space between the interposer 202 and the PIC 204. In this case, the entire outside edge of the PIC 204 should have minimal topography, or height variations. This is not difficult to achieve except for the input and output waveguides located at the optical facet. These input/output waveguides therefore may have buried cores or else relatively planar spot size converters at the facet rather than deeply-etched ridge waveguides or spot size convertors that are not planarized. FIG. 2B shows an example package 201, where the PIC 204 includes a buried waveguide core 211 that is formed on a substrate 213 and buried in a lower cladding 223 and an upper cladding 215. An optical mode 225 propagates along the buried waveguide core 211. Consistent with the descriptions in FIG. 2A, the PIC 204 in FIG. 2B is flip-chip bonded to the interposer 202, and metallization 218 is provided on the interposer to hermetically seal and protect the elements of the PIC 204 (lasers, modulators, etc.) in a space between the interposer 202 and the PIC 204.

Figure 2C:
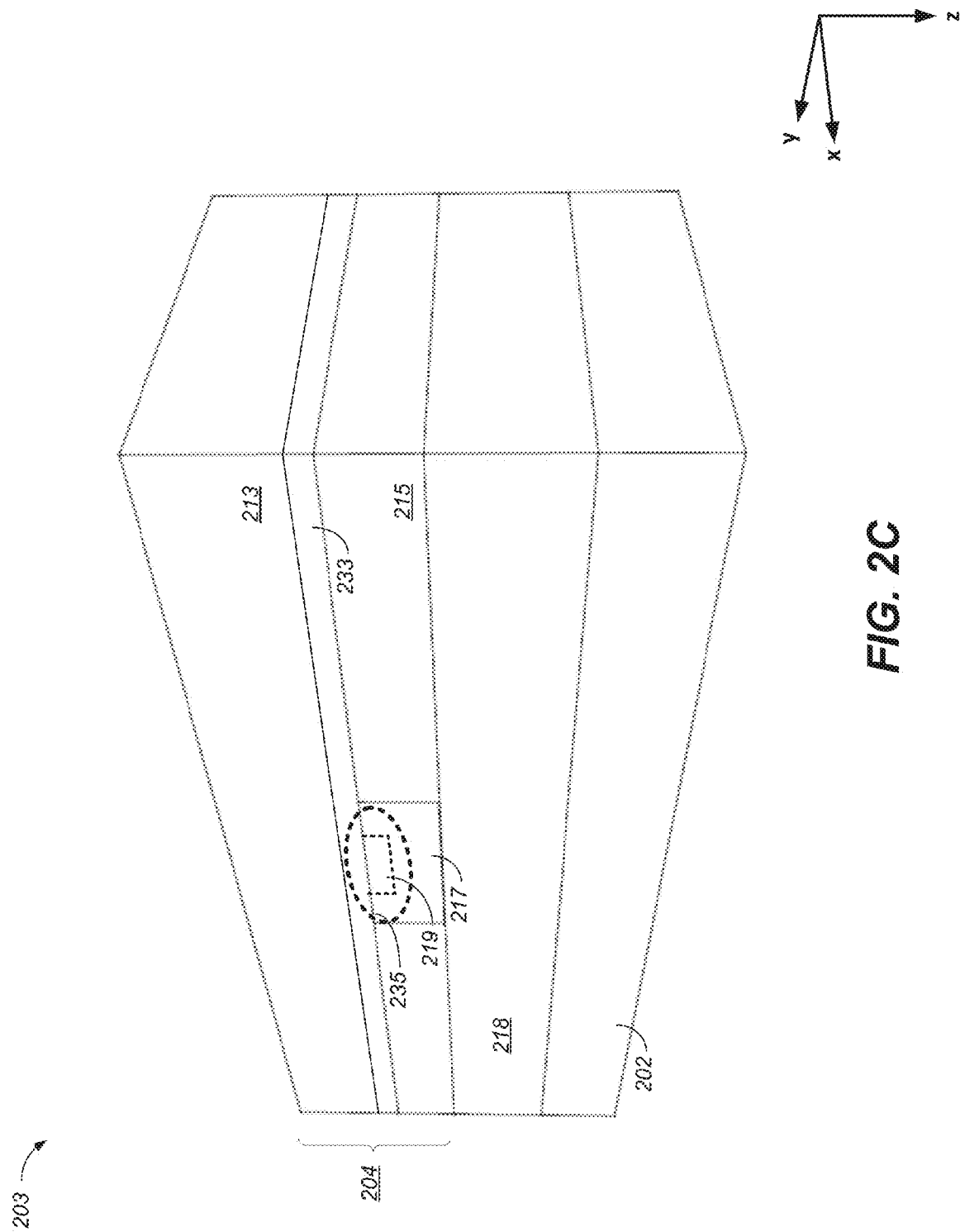

FIG. 2C shows another example package 203, where the PIC 204 includes a planar spot size converter 217 that is planarized with an upper cladding 215. The planar spot size converter 217 coverts an optical mode of a signal having a spot size matching the size of the planar spot size converter 217 to a spot size matching the size of a waveguide core 219. The buried waveguide core 219 is formed on the substrate 213 and buried in a lower cladding 233 and the upper cladding 215. An optical mode 235 propagates along the buried waveguide core 219. Consistent with the descriptions in FIG. 2A, the PIC 204 in FIG. 2C is flip-chip bonded to the interposer 202, and metallization 218 is provided on the interposer to hermetically seal and protect the elements of the PIC 204 (lasers, modulators, etc.) in a space between the interposer 202 and the PIC 204. The interposer 202 may have the additional advantage of blocking or suppressing electrical crosstalk between channels or between co-packaged chips.

Figure 3A:
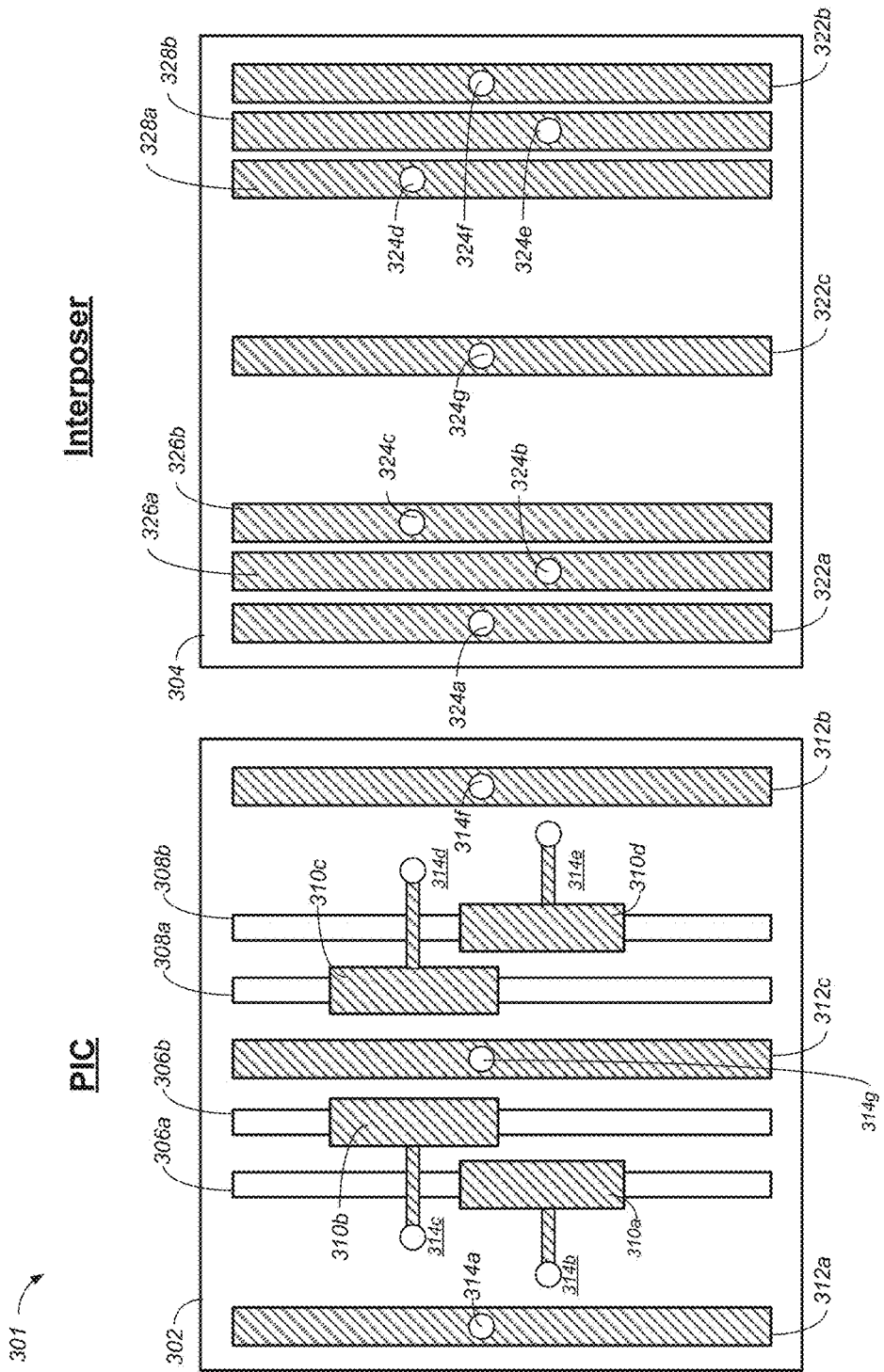
FIGS. 3A-3E illustrate example PIC and interposer layouts.

FIG. 3A illustrates an example layout 301. FIG. 3A illustrates a portion of a PIC chip 302 that includes a lumped "push-pull" MZM, where one arm of the MZM (e.g., 306a) is driven by a data signal and the other arm of the MZM (e.g., 308a) is driven by an inverted data signal. Note that in the layout 301, the portions of the MZM in which light is split and combined are not shown. The lumped MZM includes a first pair of waveguides 306a and 306b and a second pair of waveguides 308a and 308b. The lumped MZM further includes lumped signal electrodes 310a-310d overlies each waveguide in each pair. The first pair of waveguides 306a and 306b correspond to a pair of waveguide branches of a first MZ interferometer, and the second pair of waveguides 308a and 308b correspond to a pair of waveguide branches of a second MZ interferometer. Both MZ interferometers are part of the lumped MZM. The PIC chip 302 includes conductive ground electrodes 312a and 312b. In some implementations, an additional conductive ground electrode 312c may also be provided between the electrode pairs. Electrical contacts to the electrodes 310a-310d and the ground electrodes 312a-312c may be made to by bond contacts 314a-314g.

The example layout 301 includes a portion of an interposer 304 having signal traces 326a, 326b, 328a, and 328b for supplying push-pull drive signals and ground traces 322a-322c for providing a ground voltage. The interposer 304 includes bond contacts 324a-324g, which enable electrical connections from/to the signal traces 326a, 326b, 328a, and 328b and the ground traces 322a-322c of the interposer 304 to/from the electrodes 310a-310d and ground traces 312a-312c of the PIC chip 302. Although not shown, the interposer 304 may be electrically coupled to one or more ASIC chips such as a MZM driver. The PIC chip 302 may be bonded to the interposer 304 in a manner similar to the implementations described in this specification. The electrodes are shown contacted in the center, but they may be contacted near the ends instead.

During operation, the electrodes 310a and 310b overlying the first waveguide pair 306a and 306b receive a drive signal or voltage having a first polarity from bond contacts 314b and 314c, and the electrodes 310c and 310d overlying the second waveguide pair 308a and 308b receive a drive signal or voltage having a second polarity from bond contacts 314d and 314e. The ground electrodes 312a-312b and optional ground electrode 312c are biased by way of the ground traces 322a-322c. Push-pull drive signals supplied to the electrode segments 310a and 310b overlying the first waveguide pair 306a and 306b correspond to a first data stream to be carried by the modulated optical signals output from the lumped MZM, and push-pull drive signals supplied to the electrode segments 310c and 310d overlying the second waveguide pair 308a and 308b correspond a second data stream. Optical signals propagating in the waveguides of each pair are combined and each of the combined optical signals has a net phase, which is indicative of the drive signals.

Figure 3B:
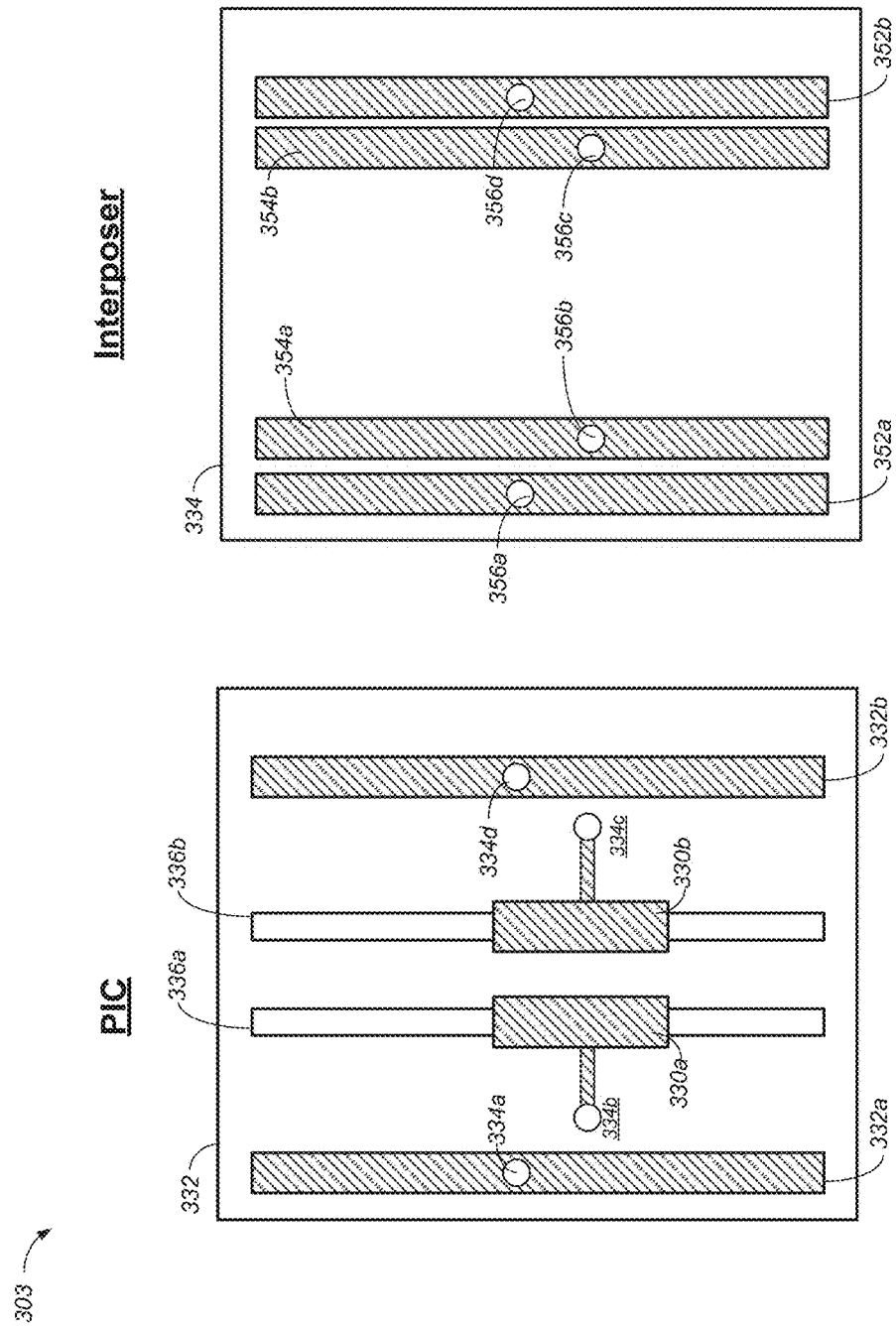

FIG. 3B illustrates an example layout 303. FIG. 3B illustrates a portion of a PIC chip 332 that includes alternative configuration to the lumped "push-pull" MZM. Note that in the layout 303, the portions of the MZM in which light is split and combined are not shown. The lumped MZM includes a pair of waveguides 336a and 336b. The lumped MZM further includes lumped signal electrodes 330a and 330b that overlay each waveguide. The PIC chip 332 includes conductive ground electrodes 332a and 332b. Electrical contacts to the electrodes 330a and 330b and the ground electrodes 332a and 332b may be made by bond contacts 334a-334d.

The example layout 303 also includes a portion of an interposer 334 having signal traces 354a and 354b for supplying push-pull drive signals and ground traces 352a and 352b for providing a ground voltage. The interposer 334 includes bond contacts 356a-356d, which enable electrical connections from/to the interposer 334 to/from the PIC chip 332. Although not shown, the interposer 334 may be electrically coupled to one or more ASIC chips such as a MZM driver. The PIC chip 332 may be bonded to the interposer 334 in a manner similar to the implementations described in this specification.

During operation, a first drive signal indicative of a first data stream is supplied to the electrode 330a overlying the waveguide 336a, and a second drive signal indicative of a second data stream is supplied to the electrode 330b overlying waveguide 336b. Bond contacts 356a-356d supply drive signals and ground biasing to the signal electrodes and ground electrodes in a manner similar to that described above with reference to FIG. 3A.

Figure 34:
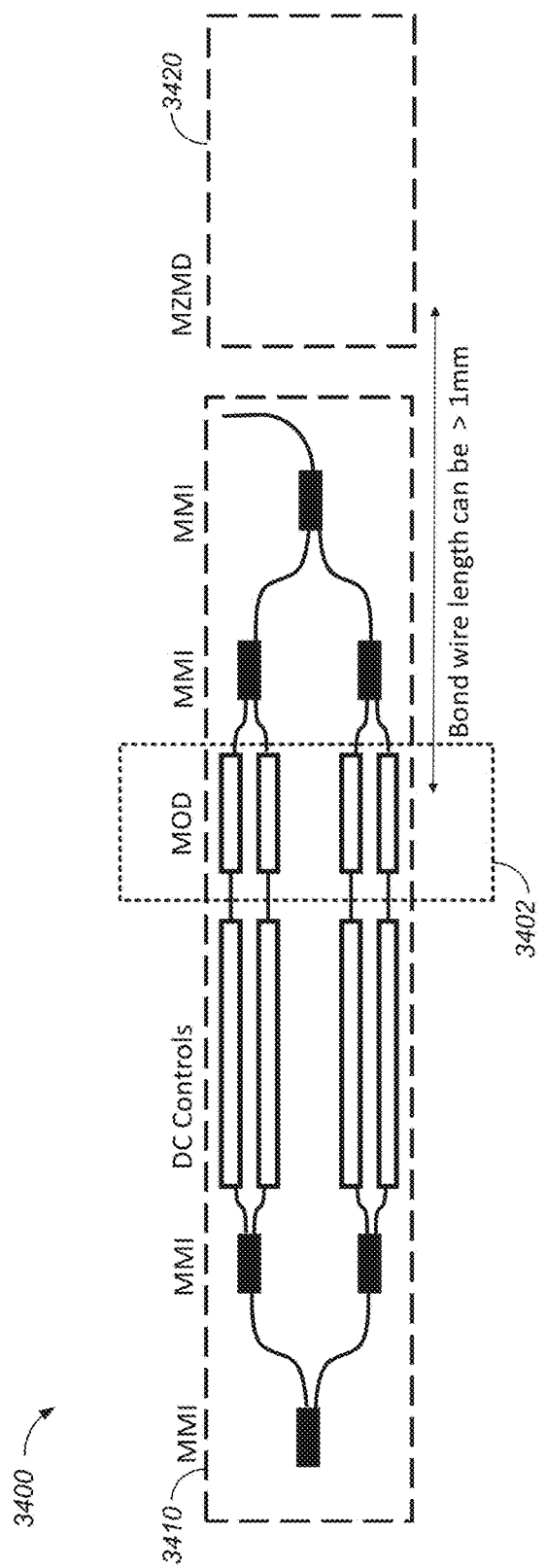
FIGS. 34 and 35 illustrate example arrangements of a PIC package.
Figure 35:
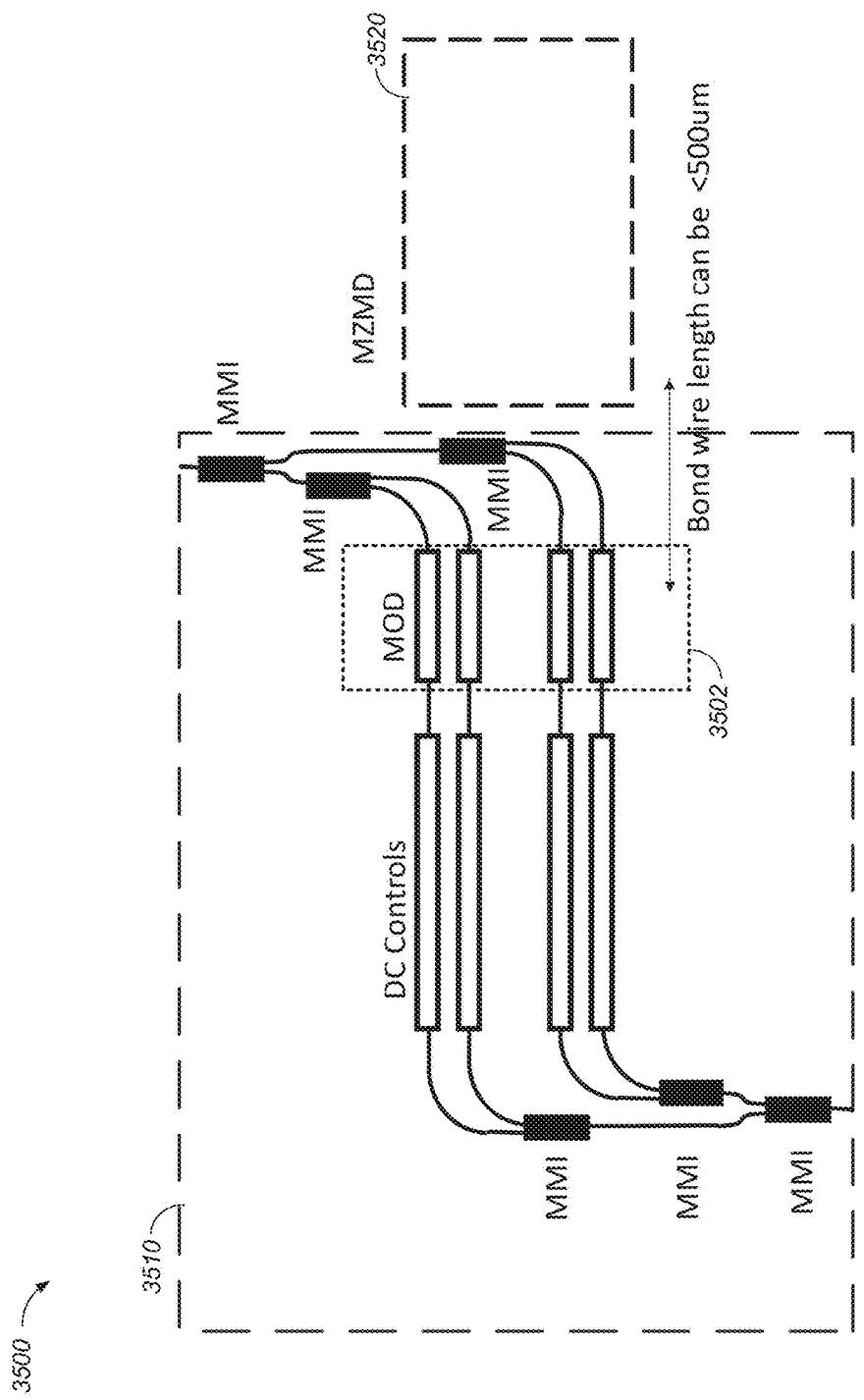

FIGS. 34 and 35 illustrate example PIC packaging arrangements that show advantages of using an interposer or a bridge chip to electrically couple active optical elements on a PIC chip and circuitry on an ASIC chip. Referring to FIG. 34, the arrangement 3400 includes a TX PIC chip 3410 and a MZMD chip 3420. The TX PIC chip 3410 includes multiple MZM arms 3402 that are in the interior of the TX PIC chip 3410. The MZM arms 3402 are electrically coupled to and controlled by the MZMD circuit on the MZMD chip 3420. As illustrated in FIG. 34, if wire bonds are used to establish the electrical connections between the MZM arms 3402 and the MZMD circuit, the distance between the MZM arms 3402 and the MZMD chip 3420 may be greater than 1 mm, which may increase complexity in wiring and may negatively impact the device performance at high speed. Flip-chip or wafer bonding between the TX PIC chip 3410 and the MZMD chip 3420 significantly decreases the wiring length, and allows more complex arrangements of the optical elements on the PIC chip.

Referring to FIG. 35, the arrangement 3500 includes a TX PIC chip 3510 and a MZMD chip 3520. The TX PIC chip 3510 includes multiple MZM arms 3502 that are arranged along the edge of the TX PIC chip 3510. The MZM arms 3502 are electrically coupled to and controlled by the MZMD circuit on the MZMD chip 3520. As illustrated in FIG. 35, if wire bonds are used to establish the electrical connections between the MZM arms 3502 and the MZMD circuit, the distance between the MZM arms 3502 and the MZMD chip 3520 may be less than 500 µm for a compact package, which may increase complexity in wiring and may negatively impact the yield. Flip-chip or wafer bonding between the TX PIC chip 3510 and the MZMD chip 3520 allows more complex arrangements of the optical elements on the PIC chip.

Figure 3C:
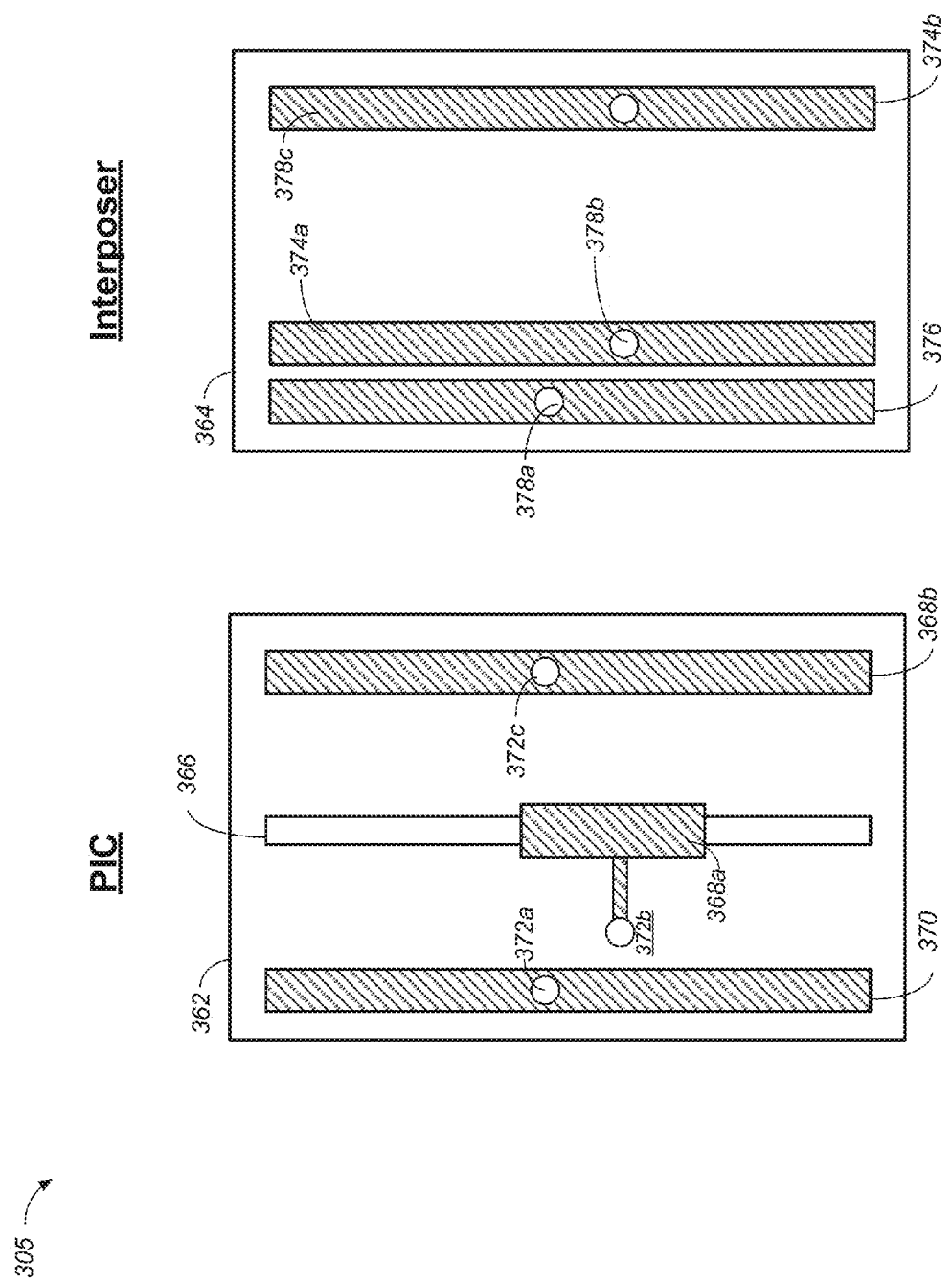

FIG. 3C illustrates an example layout 305. FIG. 3C illustrates a portion of a PIC chip 362 that includes a lumped waveguide photodiode. The lumped waveguide photodiode includes a waveguide 366. The lumped waveguide photodiode further includes lumped signal electrodes 368a and 368b. The PIC chip 302 includes a conductive ground electrode 370. Electrical contacts to the electrodes 368a and 368b and the ground electrode 370 may be made by bond contacts 372a-372c.

The example layout 305 also includes a portion of an interposer 364 having signal traces 374a and 374b and a ground trace 376. The interposer 364 includes bond contacts 378a-378c, which enable electrical connections from/to the interposer 364 to/from the PIC chip 362. Although not shown, the interposer 364 may be electrically coupled to one or more ASIC chips such as a TIA. The PIC chip 332 may be bonded to the interposer 334 in a manner similar to the implementations described in this specification. Interposer traces may constitute a coplanar waveguide or other transmission line design.

During operation, an optical signal is received by the waveguide photodetector 366, where the optical signal is absorbed by the waveguide photodetector 366 and is converted to an electrical signal. The electrical signal is collected through bond contacts to a TIA that is coupled to the interposer 364.

Figure 3D:
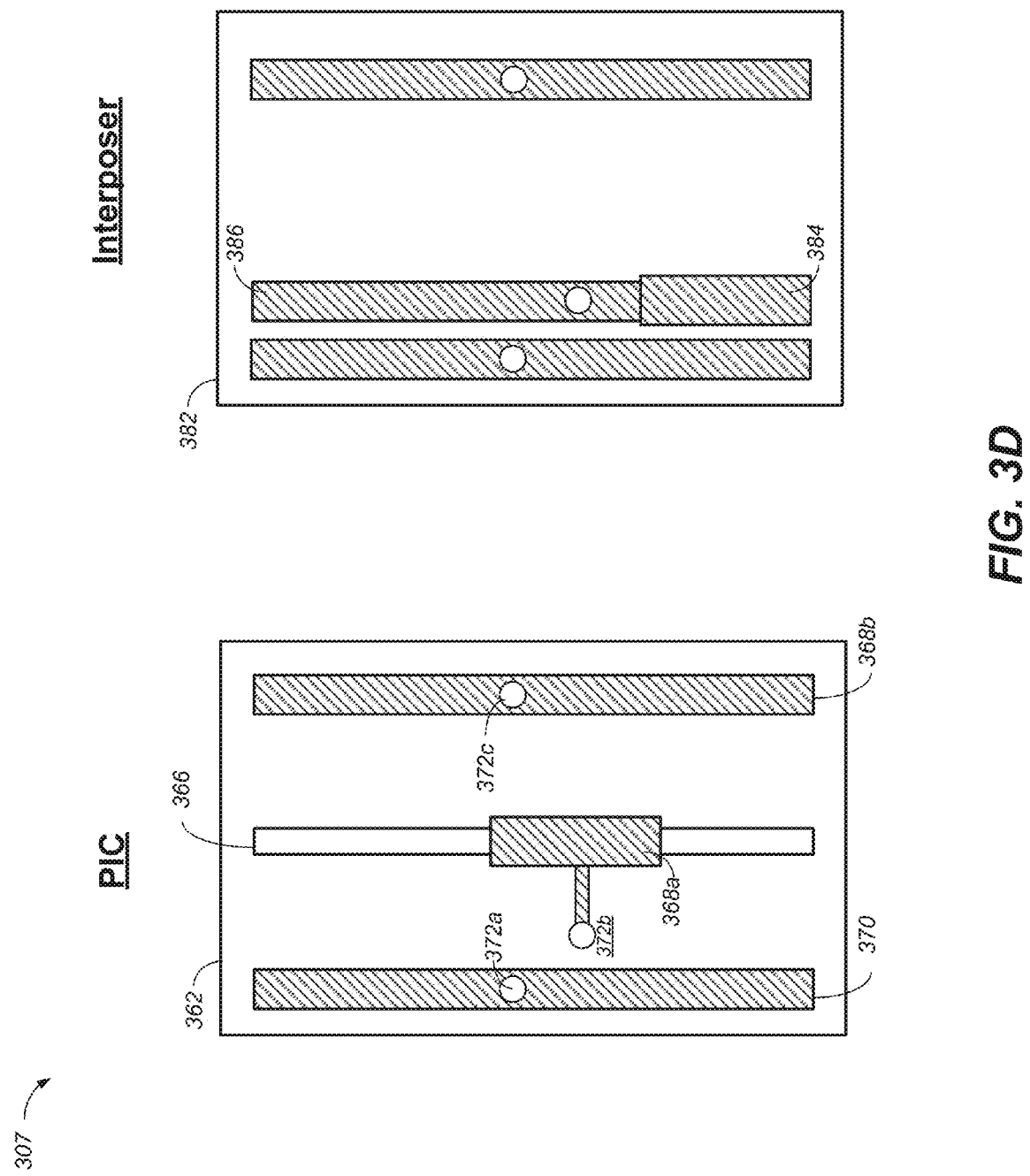

In some cases, series inductance may enhance the frequency response. FIG. 3D illustrates an example layout 307, which is similar to the layout 305 as described in reference to FIG. 3C. However, in FIG. 3D, the interposer layout 382 includes a transmission line having a first transmission line segment 384 in series with a second transmission line segment 386. In general, at high frequencies it is difficult to achieve an ideal inductor in a transmission line. Instead a transmission line is used where the length measured in wavelengths at the signal frequency determines the behavior. Hence, the serial inductance/capacitance will be frequency dependent and vary periodically. By adjusting the length of the transmission line so that a resonance peak appears where the response of the photodetector-transmission line starts to drop, the response may be equalized and the overall bandwidth may be increased. The frequency of the resonance peak may depend on the capacitance of the detector, and the length and the characteristic impedance of the waveguide 366.

With a two-segment design as shown in FIG. 3D, it is possible to freely adjust both the real and imaginary part of the load impedance seen by the detector. The first segment 384 of the transmission line may have large characteristic impedance and work mainly as an inductor that is in resonance with the detector capacitance. The second segment 386 may work mainly as a transformer that optimizes the real part of the load to adjust the Q-factor of the resonance peak. In some implementations, a frequency domain S-Parameter simulation may be used to obtain a uniform frequency response across a frequency range of interest, e.g., 1-110 GHz. In some implementations, a time domain eye diagram simulation may be used to minimize a pulse distortion.

Figure 3E:
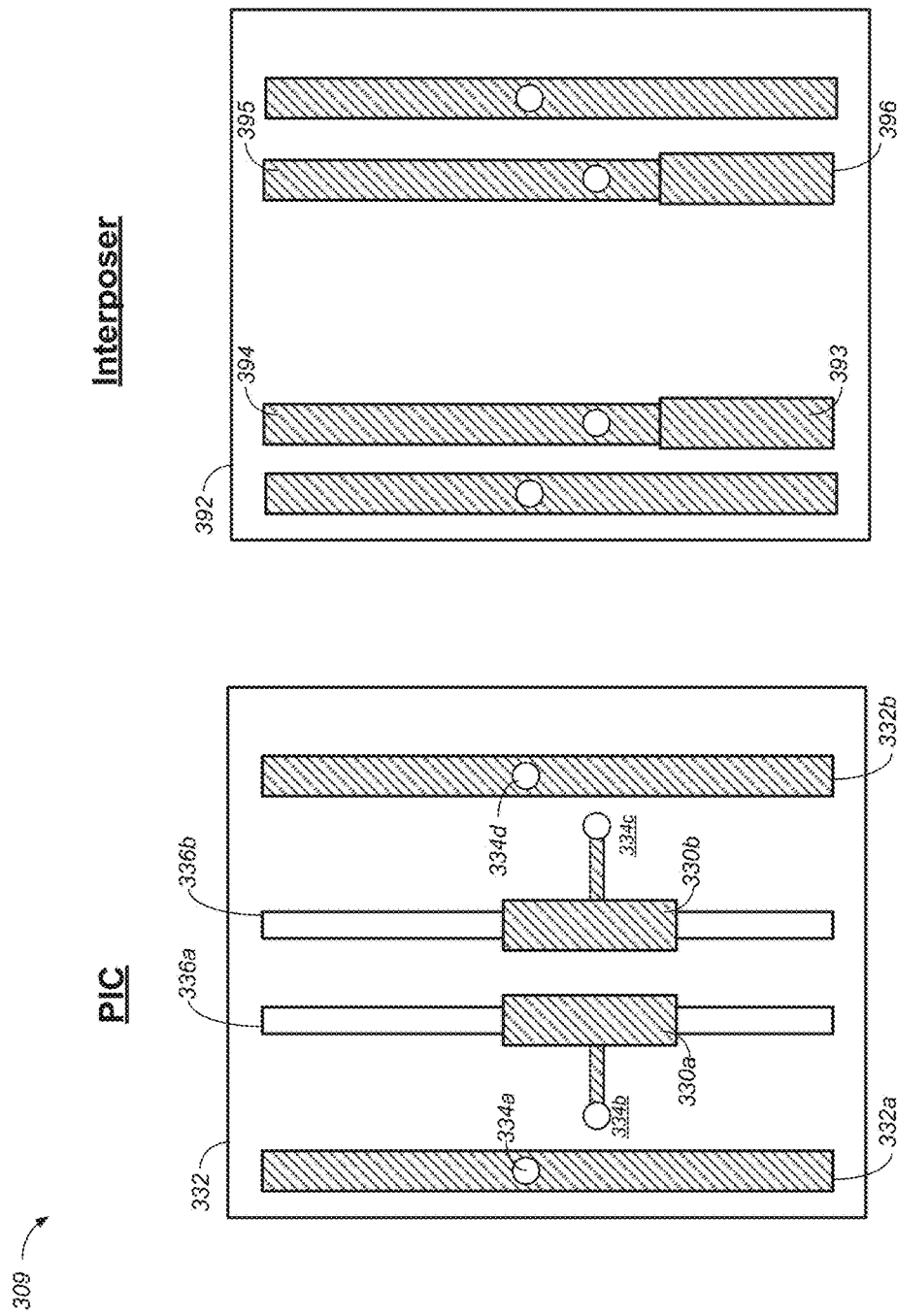

Series inductance may also be used for enhancing the frequency response for MZM-interposer-MZMD connections. FIG. 3E illustrates an example layout 309, which is similar to the layout 303 as described in reference to FIG. 3B. However, in FIG. 3E, the interposer layout 392 includes a transmission line having a first transmission line segment 393 in series with a second transmission line segment 394 for driving a first MZM arm 336a. The interposer layout 392 further includes a transmission line having a first transmission line segment 395 in series with a second transmission line segment 396 for driving a second MZM arm 336b. The two-segment design here is similar to the two-segment design described in reference to FIG. 3D.

Figure 4A:
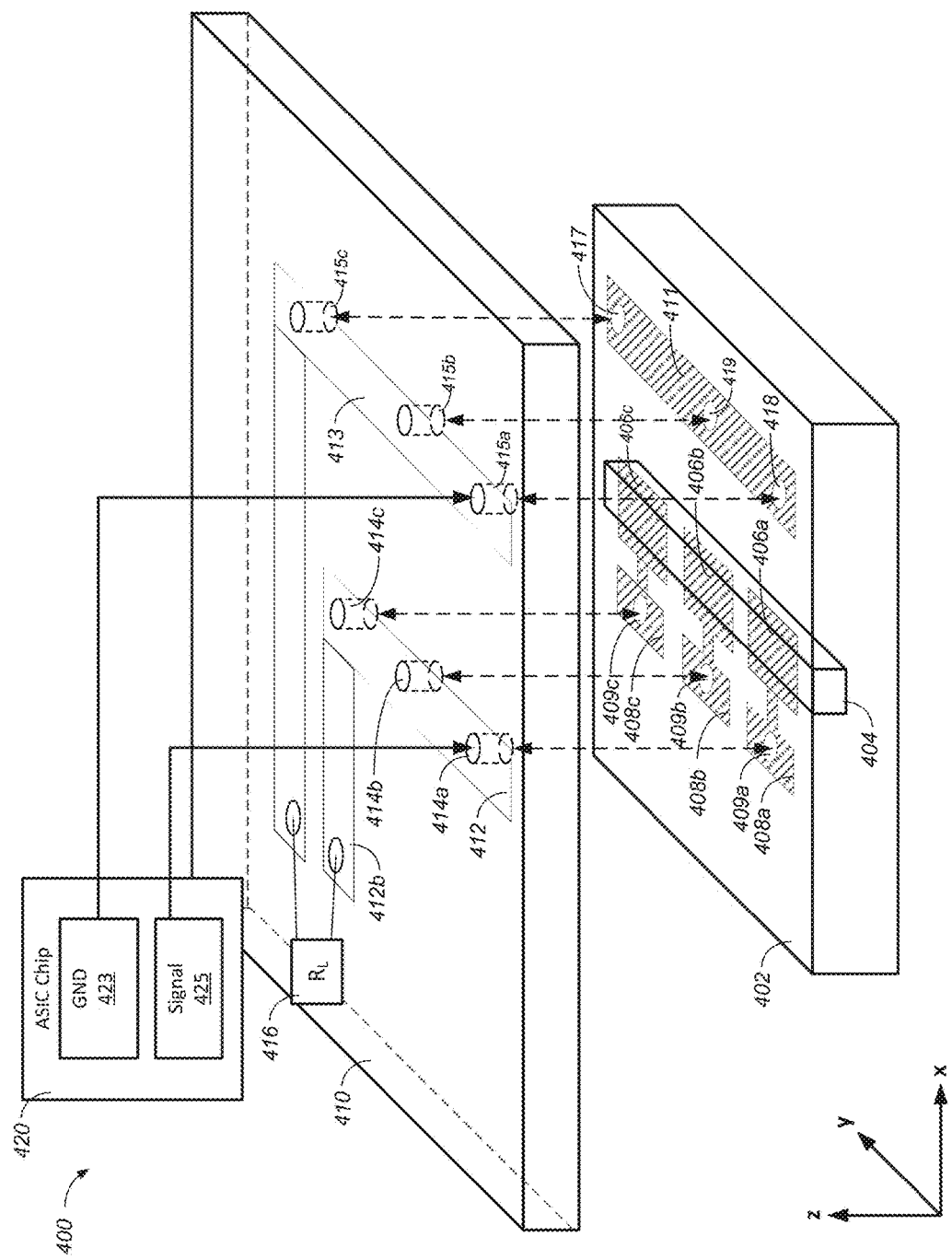
FIGS. 4A-4E illustrate example arrangements where an interposer provides electrical interconnects between a ASIC chip and a PIC chip having a traveling wave optical device.

FIG. 4A illustrates a simplified illustration of an example arrangement 400, where an interposer 410 provides electrical interconnects between a ASIC chip 420 and a PIC chip 402 having a traveling wave (TW) active optical device 404. In general, a lumped optical device, e.g., a modulator, has no need for controlled transmission line impedance within the element itself. The lumped optical element is modelled most simply as an RC circuit contacted by inductive contact with designed MZMD output impedance. The lumped element on a PIC may be contacted anywhere along the length of the conductive trace since the entire length is short compared to the bit length. A TW optical element, e.g., a TW modulator, has a defined/architected transmission line impedance, such that reflections back toward the driver are minimized, and the electrical RF signal exits the end of the modulator opposite the launch. Either the modulator contacts (e.g., signal and ground along with the p-n junction) are the transmission line with designed impedance, or there is a separate RF transmission line with designed impedance that feeds lumped sections of the modulator as the traveling RF wave runs past. A TW device is typically longer and has wider bandgap than a lumped device, and electrical wave is phase-matched to the optical wave velocity along the TW device. For example, the electrical signal effective index is matched the optical wave group index. The bandwidth of the TW modulator is limited by the inverse of the difference in arrival time between the optical and electrical waves at the end of the electrode.

The PIC chip 402 includes a traveling wave (TW) active optical device 404, TW electrodes 406a-406c, a ground electrode 411, contact regions 408a-408c, bond contacts 409a-409c formed on the contact regions 408a-408c, and bond contacts 417, 418, and 419 formed on the ground electrode 411. Although the TW active optical device 404 is shown as being embedded in a substrate, in some implementations, the TW active optical device 404 may be formed on the surface of a substrate. The PIC chip 402 may be implemented based on indium-phosphide (InP), silicon, or any other suitable PIC platform. The TW active optical device 404 may be a traveling wave MZM (TW MZM), a traveling wave photodetector, or any suitable traveling wave active optical device that may be implemented on a PIC. An optical signal may propagate along the +y direction in the TW active optical device 404. The TW electrodes 406a-406c and the contact regions 408a-408c are electrically coupled, and may be formed using a conductive material such as gold, aluminum, copper, titanium, or any other suitable layers or combinations of conductors or alloys. The bond contacts 410a-410c may include a gold bump, a solder bump or any other conductive adhesive material. Although FIG. 4A only shows a set of three TW electrodes 406a-406c, the contact regions 408a-408c, and the bond contacts 410a-410c, more or fewer TW electrodes/contact regions/bond contacts may be formed for a TW active optical device 404 depending on device designs. Although the driver is shown directly above the modulator, it may be located further away, connected by a coplanar waveguide or other transmission line or electrical connection.

In some implementations, the ASIC chip 420 may include circuitry that provides a high-speed data signal to the TW electrodes 406a-406c to control the TW active optical device 404. For example, the ASIC chip 420 may be a MZM driver that provides a high-speed data signal to the TW electrodes 406a-406c to control a TW MZM modulator (i.e., the active optical device 404). In some implementations, the ASIC chip 420 may include circuitry that senses a high-speed data signal from the TW electrodes 406a-406c. For example, the ASIC chip 420 may be a TIA that converts a sensed current from the TW electrodes 406a-406c that is generated by a TW photodetector (i.e., the active optical device 404). In some implementations, the ASIC chip 420 may include circuitry that provides a DC signal such as a ground voltage or a biased voltage.

The interposer 410 includes a conductive trace 412, a ground trace 413, and conductive vias 414a-414c and 415a-415c. The interposer 410 may be made of a semiconductor material (e.g., silicon), a ceramic, an insulating material (e.g., silicon oxide), or an organic material. In some implementations, the interposer 410 may be bonded to the PIC chip 402 using flip-chip bonding techniques. The conductive trace 412 formed on a smooth surface of the interposer 410 opposite the surface facing the PIC chip 402 is electrically coupled to the signal contact 425 of the ASIC chip 420. In some implementations, the conductive trace 412 may be electrically coupled to the signal contact 425 of the ASIC chip 420 through wire bonding. In some other implementations, the conductive trace 412 may be electrically coupled to the signal contact 425 of the ASIC chip 420 through flip-chip bonding or wafer bonding. Metal or other conductive material provided in the vias 414a-414c through the interposer 410 electrically connects the conductive trace 412 to the TW electrodes 406a-406c, so that electrical signals may be supplied from the ASIC chip 420 to the PIC chip 402, or vice versa.

The ground trace 413 formed on the smooth surface of the interposer 410 opposite the surface facing the PIC chip 402 is electrically coupled to a reference voltage or ground 423 of the ASIC chip 420. Metal or other conductive material provided in the vias 415a-415c through the interposer 410 electrically connects the ground trace 413 to the ground electrode 411, so that a ground voltage may be provided to the PIC chip 402.

As shown in FIG. 4A, the conductive trace 412 may be a transmission line, where an electrical signal supplied by the ASIC chip 420 travels in the +y direction along the conductive trace 412. The electrical signal is supplied sequentially to the electrode 406a, the electrode 406b, and the electrode 406c through the vias 414a, 414b, and 414c. In some implementations, a conductive trace 412b may be extended from the conductive trace 412, where a matched impedance load 416 may be implemented to reduce or eliminate reflection on the transmission line. As an example, the matched impedance load 416 may be a matched impedance termination resistor that is connected between the conductive trace 412b on the interposer 410 and ground. The termination resistor 416 may be a conductive trace having a specific resistivity. The resistance may be determined based on the resistivity ($\rho$) of the conductive trace material, the length (L) of the conductive trace, and the area (A) of the conductive trace as:

$$R = \frac{\rho L}{A}. \qquad (1)$$

The conductive trace 412b may be designed along the x-y plane to thermally isolate the photonic devices in the PIC chip 402 from heat generated from the matched impedance load 416. The termination resistor 416 is connected from the signal (i.e., conductive trace 412b) to ground (i.e., ground trace 413), which dissipates the power of the traveling wave, and prevents or minimizes RF reflections.

Although not shown in FIG. 4A, the PIC chip 402 may include multiple TW active optical devices, and the interposer 410 may include multiple conductive traces to electrically couple the ASIC chip 420 to the multiple TW active optical devices of the PIC chip 402 similar to the technique as described in FIG. 4A. As described in more detail in reference to FIGS. 31A, 31B, 33A, and 33B, the PIC chip 402 may include multiple TW active optical devices, and the interposer 410 may include multiple conductive traces to electrically couple the ASIC chip 420 to the multiple TW active optical devices of the PIC chip 402 similar to the technique as described in FIG. 4A. In addition, the interposer 410 may be used to establish electrical connections between a TW ASIC chip and one or more DC, quasi-DC, lumped, and/or TW elements implemented on a PIC.

Figure 4B:
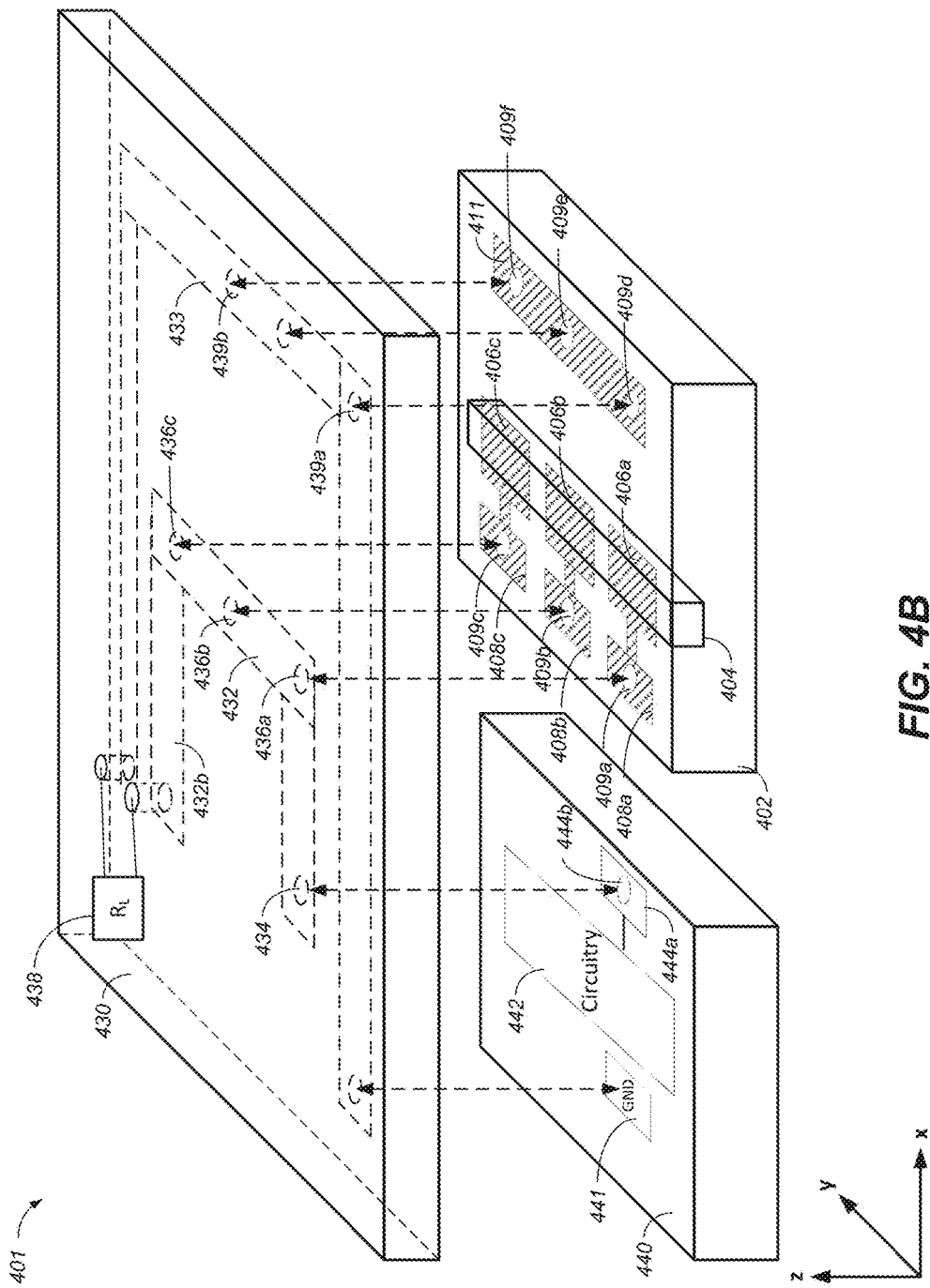

FIG. 4B illustrates a simplified illustration of an example arrangement 401, where an interposer 430 (bridge chip) provides electrical interconnects between a ASIC chip 440 and a PIC chip 402 having a TW active optical device 404. Similar to the descriptions in reference to FIG. 4A, the PIC chip 402 includes a TW active optical device 404, TW electrodes 406a-406c, a ground electrode 411, contact regions 408a-408c, bond contacts 409a-409c formed on the contact regions 408a-408c, and bond contacts 409d-409f formed on the ground electrode 411.

The ASIC chip 440 includes circuitry 442, a ground contact 441, a contact region 444a, and a bond contact 444b. The circuitry 442 may include circuitry for a MZM driver, a TIA, a DC voltage, or any other suitable driver circuitry. The contact region 444a is electrically coupled to the circuitry 442, and may be formed using a conductive material such as aluminum, copper, titanium, or any other suitable conductors or alloys. The bond contact 444b may include a gold or solder bump or any other conductive adhesive material.

The interposer 430 (a bridge chip) includes a conductive trace 432, a ground trace 433, and conductive pads 434, 436a-436c, and 439a-439b. The interposer 430 may be made of a semiconductor material (e.g., silicon), a ceramic, an insulating material (e.g., silicon oxide), or an organic material. In some implementations, the interposer 430 may be a very thin silicon, organic or other material that does not need to provide hermetic sealing between the interposer 430 and the PIC chip 402 or between the interposer 430 and the ASIC chip 440. In some implementations, the interposer 430 may be bonded to the PIC chip 402 and the ASIC chip 440 using flip-chip bonding techniques. Metal or other conductive material provided on the conductive pads 434 and 436a-436c of the interposer 430 electrically connects the conductive trace 432 to the circuitry 442 and the TW electrodes 406a-406c, so that electrical signals may be supplied from the ASIC chip 440 to the PIC chip 402, or vice versa. Metal or other conductive material provided on the conductive pads 439a and 439b of the interposer 430 electrically connects the ground trace 433 to the ground electrode 411 and the ground 441 of the ASIC chip 440. The interposer 430 may be referred to as a "bridge chip" because the interposer 430 bridges between two chips, e.g., the PIC chip 402 and the ASIC chip 440.

As shown in FIG. 4B, the conductive trace 432 is a transmission line, where an electrical signal supplied by the ASIC chip 440 travels in the +x direction followed by the +y direction along the conductive trace 432. The electrical signal is supplied sequentially to the electrode 406a, the electrode 406b, and the electrode 406c through the conductive pads 436a, 436b, and 436c, respectively. For example, the electrical signal first travels to the electrode 406a through the conductive pad 436a, and then travels to the electrode 406b through the conductive pad 436b, and then travels to the electrode 406c through the conductive pad 436c. In some implementations, a conductive trace 432b may be extended from the conductive trace 432, where a matched impedance load 438 may be implemented to reduce or eliminate reflection on the transmission line, similar to the matched impedance load 416 described in reference to FIG. 4A.

Although not shown in FIG. 4B, the PIC chip 402 may include multiple TW active optical devices, and the interposer 430 may include multiple conductive traces to electrically couple the ASIC chip 440 to the multiple TW active optical devices of the PIC chip 402 similar to the technique as described in FIG. 4B. As described in more detail in reference to FIGS. 31A, 31B, 33A, and 33B, the PIC chip 402 may include multiple TW active optical devices, and the interposer 430 may include multiple conductive traces to electrically couple the ASIC chip 440 to the multiple TW active optical devices of the PIC chip 402 similar to the technique as described in FIG. 4B. In addition, the interposer 430 may be used to establish electrical connections between a TW ASIC chip and one or more DC, quasi-DC, lumped, and/or TW elements implemented on a PIC.

Figure 4C:
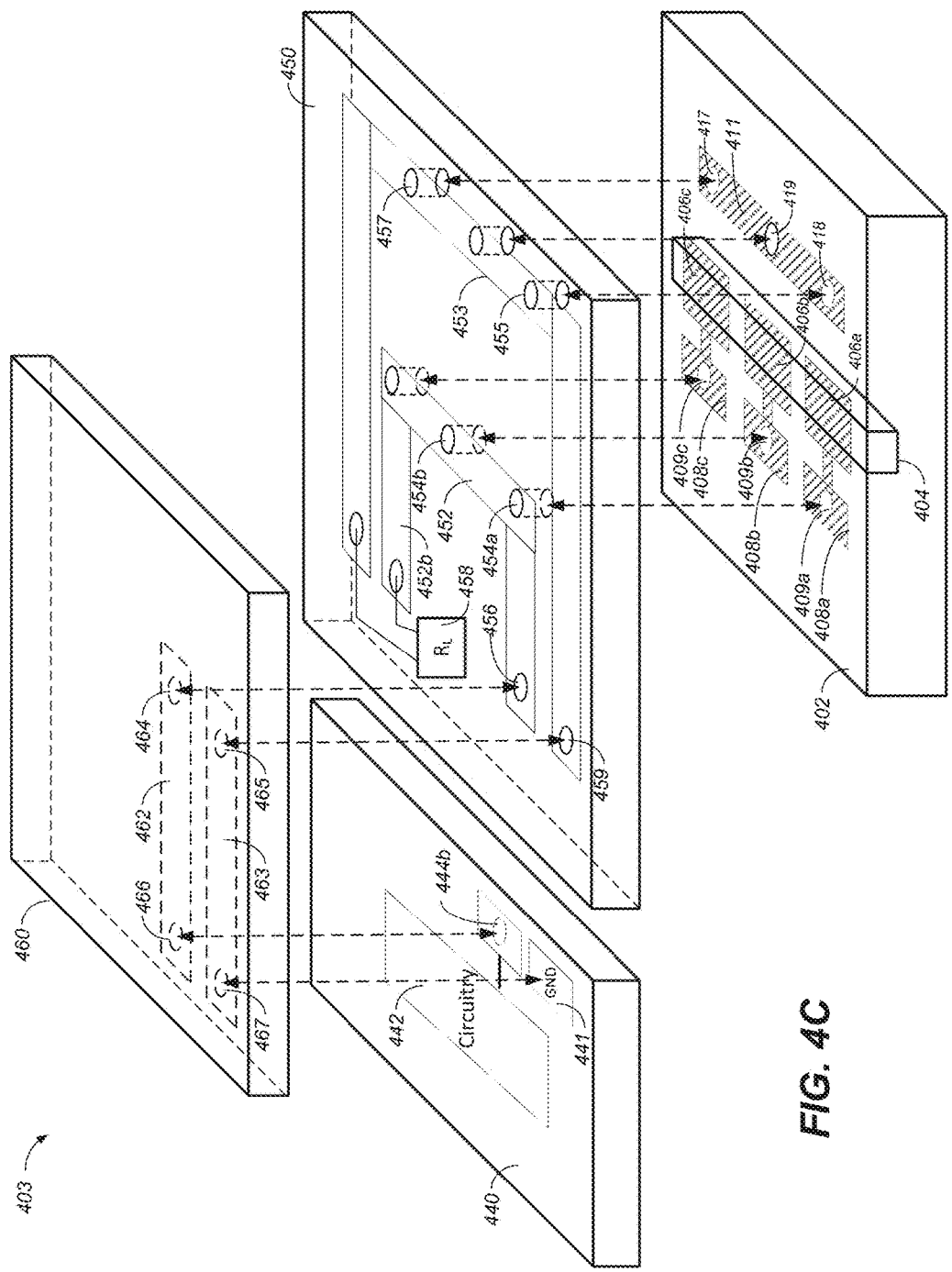

FIG. 4C illustrates a simplified illustration of an example arrangement 403, where a first interposer 450 and a second interposer 460 provide electrical interconnects between a ASIC chip 440 and a PIC chip 402 having a TW optical device 404. Similar to the descriptions in reference to FIG. 4A, the PIC chip 402 includes a TW active optical device 404, TW electrodes 406a-406c, a ground electrode 411, contact regions 408a-408c, and bond contacts 409a-409c formed on the contact regions 408a-408c, and bond contacts 417, 418, and 419 formed on the ground electrode 411. Similar to the descriptions in reference to FIG. 1B, the ASIC chip 440 includes circuitry 442, a contact region 444a, and a bond contact 444b.

The first interposer 450 includes a conductive trace 452, a ground trace 453, conductive vias 454a-454c and 457, and bond contacts 456 and 459. The first interposer 450 may be made of a semiconductor material (e.g., silicon), a ceramic, an insulating material (e.g., silicon oxide), or an organic material. In some implementations, the first interposer 450 may be bonded to the PIC chip 402 using flip-chip bonding techniques.

The second interposer 460 (a bridge chip) includes a conductive trace 462, a ground trace 463, conductive bond pads 464 and 466 formed on the conductive trace 462, and bond pads 465 and 467 formed on the ground trace 463. The second interposer 460 may be made of a semiconductor material (e.g., silicon), a ceramic, an insulating material (e.g., silicon oxide), or an organic material. In some implementations, the interposer 460 may be bonded to the first interposer 450 and the ASIC chip 440 using flip-chip bonding techniques. The conductive trace 462 provides electrical interconnects between the conductive trace 452 and the circuitry 442, so that electrical signals may be supplied from the ASIC chip 440 to the PIC chip 402, or vice versa. Metal or other conductive material in the ground trace 463 of the second interposer 460 and the ground trace 452 of the first interposer 450 provide electrical interconnects between the ground trace 411 of the PIC 402 and the ground 441 of the ASIC chip 440.

As shown in FIG. 4C, the conductive traces 462 and 452 form a transmission line. The electrical signal is supplied by the ASIC chip 440 is sequentially supplied to the electrode 406a, the electrode 406b, and the electrode 406c through the vias 454a, 454b, and 454c, respectively. In some implementations, a conductive trace 452b may be extended from the conductive trace 452, where a matched impedance load 458 may be implemented to reduce or eliminate reflection on the transmission line, similar to the matched impedance load 416 described in reference to FIG. 4A.

Although not shown in FIG. 4C, the PIC chip 402 may include multiple TW active optical devices, and the first interposer 450 and the second interposer 460 may include multiple conductive traces to electrically couple the ASIC chip 440 to the multiple TW active optical devices of the PIC chip 402 similar to the technique as described in FIG. 4C. As described in more detail in reference to FIGS. 31A, 31B, 33A, and 33B, the PIC chip 402 may include multiple TW active optical devices, and the first interposer 450 and the second interposer 460 may include multiple conductive traces to electrically couple the ASIC chip 440 to the multiple TW active optical devices of the PIC chip 402 similar to the technique as described in FIG. 4C. In addition, the first interposer 450 and the second interposer 460 may be used to establish electrical connections between a TW ASIC chip and one or more DC, quasi-DC, lumped, and/or TW elements implemented on a PIC.

Figure 4D:
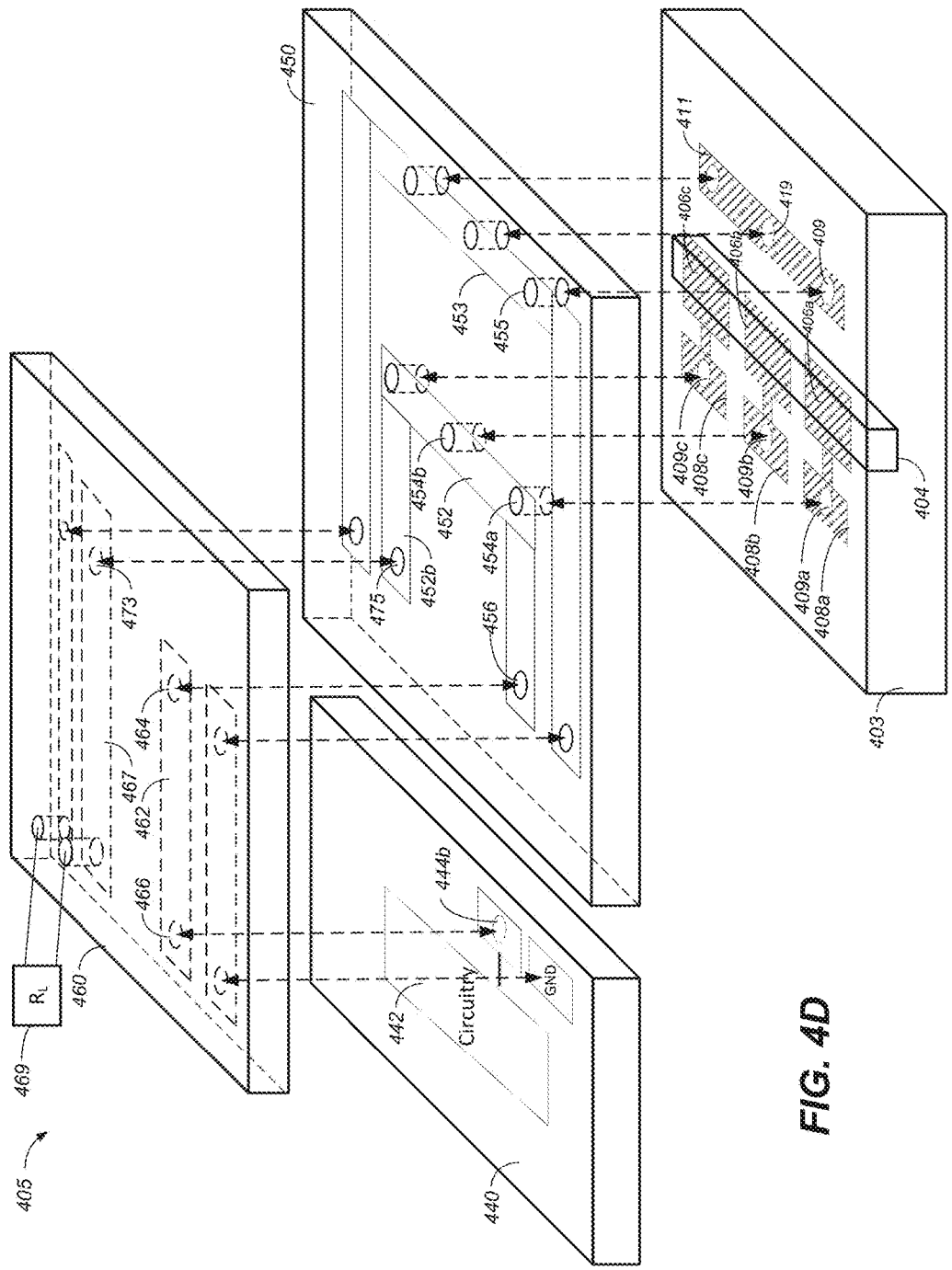

In some implementations, a matched impedance load may be formed in the second interposer 460. For example, referring to FIG. 4D, instead of forming the matched impedance load 458 on the conductive trace 452b, a matched impedance load 469 may be formed on a conductive trace 467 of the second interposer 460, where the conductive trace 467 and the conductive trace 452b may be electrically connected by conductive pads 473 and 475.

Figure 4E:
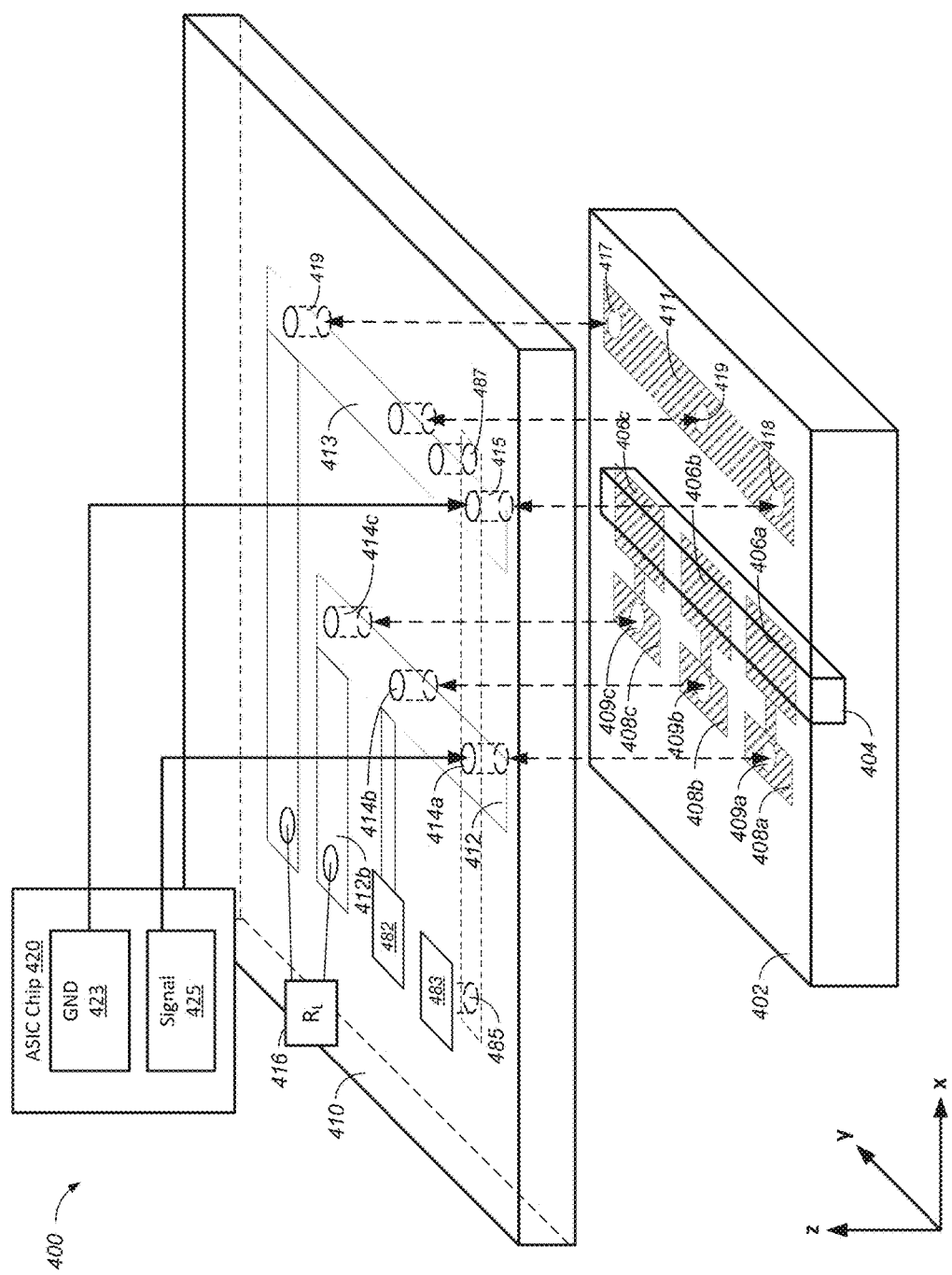

FIG. 4E illustrates a simplified illustration of an example arrangement 407. The example arrangement 407 is similar to the example arrangement 400 as described in reference to FIG. 4A. Here, the PIC 410 further includes a testing contact 482 that is electrically coupled to the conductive trace 412 and a testing contact 483 that is electrically coupled to the ground trace 413 through conductive vias 485 and 487. The testing contacts 482 and 483 may be used to test one or more DC and/or RF characteristics of the TW active optical device 404 or the ASIC circuit. Additionally, some of the characteristics of the interconnects may be tested. In some implementations, the testing may be performed after the PIC chip 402 is bonded to the interposer 410 but before the PIC 402 chip is packaged with the rest of the components, or after the ASIC chip 120 is bonded but before it is packaged, or after the ASIC and PIC chip(s) are both bonded. The testing contacts 482 and 483 allow the PIC chip 402 to be tested through the interposer 410 without causing damages to the contact pads formed on the PIC. In some implementations, the testing contacts 482 and 483 may be electrically isolated from the conductive trace 412 after testing. For example, the testing contacts 482 and 483 may be mechanically removed (e.g., through polishing) from the interposer 410. As another example, the testing contacts 482 and 483 may be removed by a laser or by a fuse that can be "blown" open by electrically overstress. In some implementations, the testing contact 482 may be designed to match an impedance of the transmission line, for instance as an RF tuning stub, such that the testing contact 482 may remain on the interposer 410 after testing.

Although not shown in FIG. 4E, the interposer 410 may include multiple testing contacts for performing DC and RF tests. For example, to measure a S parameter of a TW active optical device, multiple testing contacts including a first testing contact for ground, a second testing contact for signal, and a third testing contact for ground may be formed on the interposer 410. As described in more detail in reference to FIGS. 31A, 31B, 33A, and 33B, the PIC chip 402 may include multiple TW active optical devices, and the interposer 410 may include multiple conductive traces to electrically couple the ASIC chip 420 to the multiple TW active optical devices of the PIC chip 402 similar to the technique as described in FIG. 4A. In addition, the interposer 410 may be used to establish electrical connections between a TW ASIC chip and one or more DC, quasi-DC, lumped, and/or TW elements implemented on a PIC.

Figure 5:
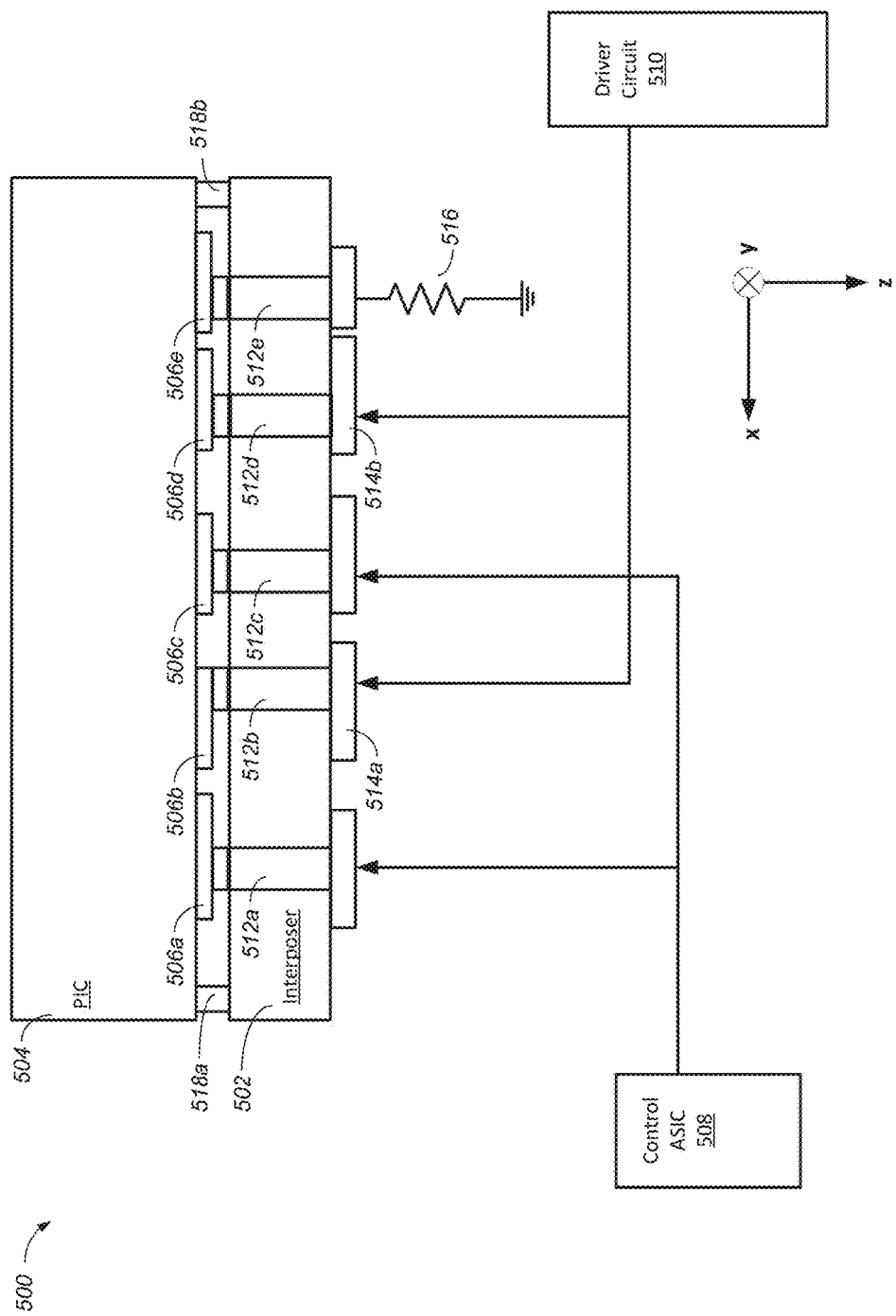
FIG. 5 illustrates a package where an interposer provides electrical interconnects between a ASIC chip and a PIC chip having a traveling wave optical device.

FIG. 5 illustrates a simplified view of a package 500 consistent with the present disclosure. Package 500 includes a substrate or interposer 502 that may be made of a semiconductor material, such as silicon, a ceramic, or an organic material. An example of the interposer 502 may be the interposer 410 as described in FIG. 4A. Package 500 also includes a PIC 504 having one or more TW active optical devices other optical devices integrated on a common substrate, along with conductive traces, signal and ground electrodes, and bonding pads 506a-506e. An example of the PIC 504 may be the PIC chip 402 as described in FIG. 4A. In one example, the signal electrode is divided into segments and each segment contacts a continuous trace that runs along a surface of the InP PIC.

Traces on a smooth surface of the interposer 502 opposite the surface facing the PIC 504 electrically connect to a control application specific integrated circuit (ASIC) 508 and a driver circuit 510. An example of the control ASIC 508 and the driver circuit 510 may be the ASIC chip 420 as described in FIG. 4A. Metal or other conductive material provided in vias 512a-512e through the interposer 502 electrically connect such traces to the conductive traces, signal/ground electrodes and bonding pads 506a-506e on the PIC 504, so that control signals may be applied from the control ASIC 508 to the PIC 504 and monitoring signals from the PIC 504 may be supplied to the control ASIC 508. Also, drive signals from the driver circuit 510 may be applied to signal electrodes on the PIC 504 through connections by way of interposer traces on the interposer conductive vias 512a-512e through it. As an example, modulator drive signals may be supplied to one or more continuous signal traces on the conductive traces 514a and 514b formed on a surface of the interposer 502 opposite the PIC 504. As discussed in greater detail below with respect to FIGS. 6A-6C, the signal electrode on the PIC 504 may be divided into segments and each segment contacts the continuous signal trace on the interposer 502 through a corresponding conductive via. In some implementations, a matched impedance termination resistor 516 may also be connected between a continuous signal trace on the interposer 502 and ground. The termination resistor 516 may advantageously be provided off the PIC 504 and may be easily connected in such a way as to maintain impedance matching and associated power dissipation does not substantially heat the PIC or load the TEC.

In some implementations, connections from the driver circuit 510 and/or the control ASIC 508 to the interposer traces may be made with a bridge chip, as discussed with respect to FIG. 4C. In some implementations, the bridge chip may be thermally insulating. Accordingly, wire bonding can be avoided and inductance may be reduced to optimize performance.

In some implementations, an additional metallization 518a and 518b may optionally be provided on the interposer in order to hermetically seal and protect the elements of the PIC 504 (lasers, modulators, etc.) in a space between the interposer 502 and the PIC 504. In this case, the entire outside edge of the PIC 504 should have minimal topography, or height variations. This is not difficult to achieve except for the input and output waveguides located at the optical facet. These input/output waveguides therefore may have buried cores or else relatively planar spot size converters at the facet rather than deeply-etched ridge waveguides or spot size convertors. The interposer 502 may have the additional advantage of blocking or suppressing electrical crosstalk between channels or between co-packaged chips. In some implementations, an additional metallization 518a and 518b may optionally be provided on the interposer in order to quasi-hermetically seal and protect the elements of the PIC 504 from the environment.

Figure 6A:
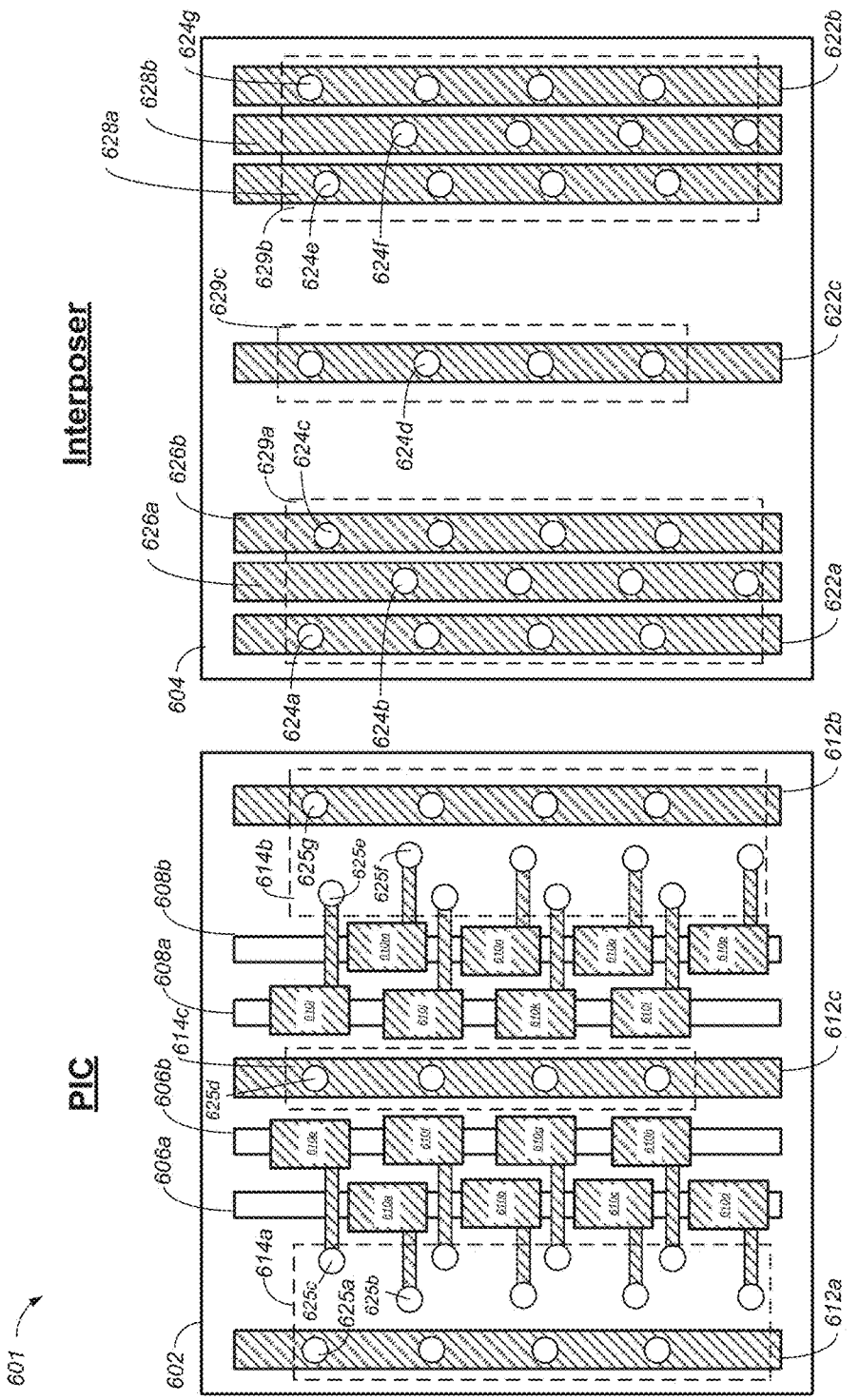
FIGS. 6A-6C illustrate example PIC and interposer layouts.

FIG. 6A illustrates an example layout 601. FIG. 6A illustrates a portion of a PIC chip 602 that includes a TW "push-pull" MZM. Note that in the layout 601, the portions of the MZM in which light is split and combined are not shown. The TW MZM includes a first pair of waveguides 606a and 606b and a second pair of waveguides 608a and 608b. The TW MZM further includes TW signal electrodes 610a-610p overlay each waveguide in each pair. The first pair of waveguides 606a and 606b correspond to a pair of waveguide branches of a first MZ interferometer, and the second pair of waveguides 608a and 608b correspond to a pair of waveguide branches of a second MZ interferometer. Both MZ interferometers are part of the TW MZM. The PIC chip 602 includes conductive ground electrodes 612a and 612b. In some implementations, an additional conductive ground electrode 612c may also be provided between the electrode pairs. Electrical contacts to the electrodes 610a-610p and the ground electrodes 612a-612c may be made to by bond contacts included in regions 614a, 614b, and 614c.

The example layout 601 includes a portion of an interposer 604 having signal traces 626a, 626b, 628a, and 628b for supplying push-pull drive signals and ground traces 622a-622c for providing a ground voltage. The interposer 604 includes bond contacts (e.g., 624a, 624b, 624c, 624d, 624e, 624f, 624g) included in regions 629a, 629b, and 629c, which may be bonded or attached to bond contacts (e.g., 625a, 625b, 625c, 625d, 625e, 625f, 625g) included in regions 614a, 614b, and 614c to provide electrical connections to electrodes (e.g., 610a-610p, 612a-612c) on PIC chip 602. Although not shown, the interposer 604 may be electrically coupled to one or more ASIC chips such as a TW MZM driver. The PIC chip 602 may be bonded to the interposer 604 in a manner similar to the implementations described in this specification.

During operation, the PIC chip 602 may receive one more electrical signals from the interposer 604. The electrode segments 610a-610d overlying a first waveguide 606a in the first waveguide pair receive a drive signal or voltage having a first polarity from first bond contacts, and electrode segments 610i-610l overlying a second waveguide 608a in the second waveguide pair receive a drive signal or voltage having a second polarity from second bond contacts. The ground electrodes are biased by way of the ground contacts. Push-pull drive signals supplied to the electrode segments overlying the first waveguide pair 606a and 606b correspond to a first data stream to be carried by the modulated optical signals output from the TW MZM, and push-pull drive signals supplied to the electrode segments overlying the waveguides 608a and 608b of the second waveguide pair correspond a second data stream. Optical signals propagating in the waveguides of each pair are combined and each of the combined optical signals has a net phase, which is indicative of the drive signals. Accordingly, optical signals output from the TW MZM may have any one of a variety of modulation forms, including, for example, frequency shift keying (FSK), phase shift keying (PSK), binary phase shift keying (BPSK), quadrature phase shift keying (QPSK), and m-quadrature amplitude modulation (m-QAM, where m is a positive integer).

Figure 6B:
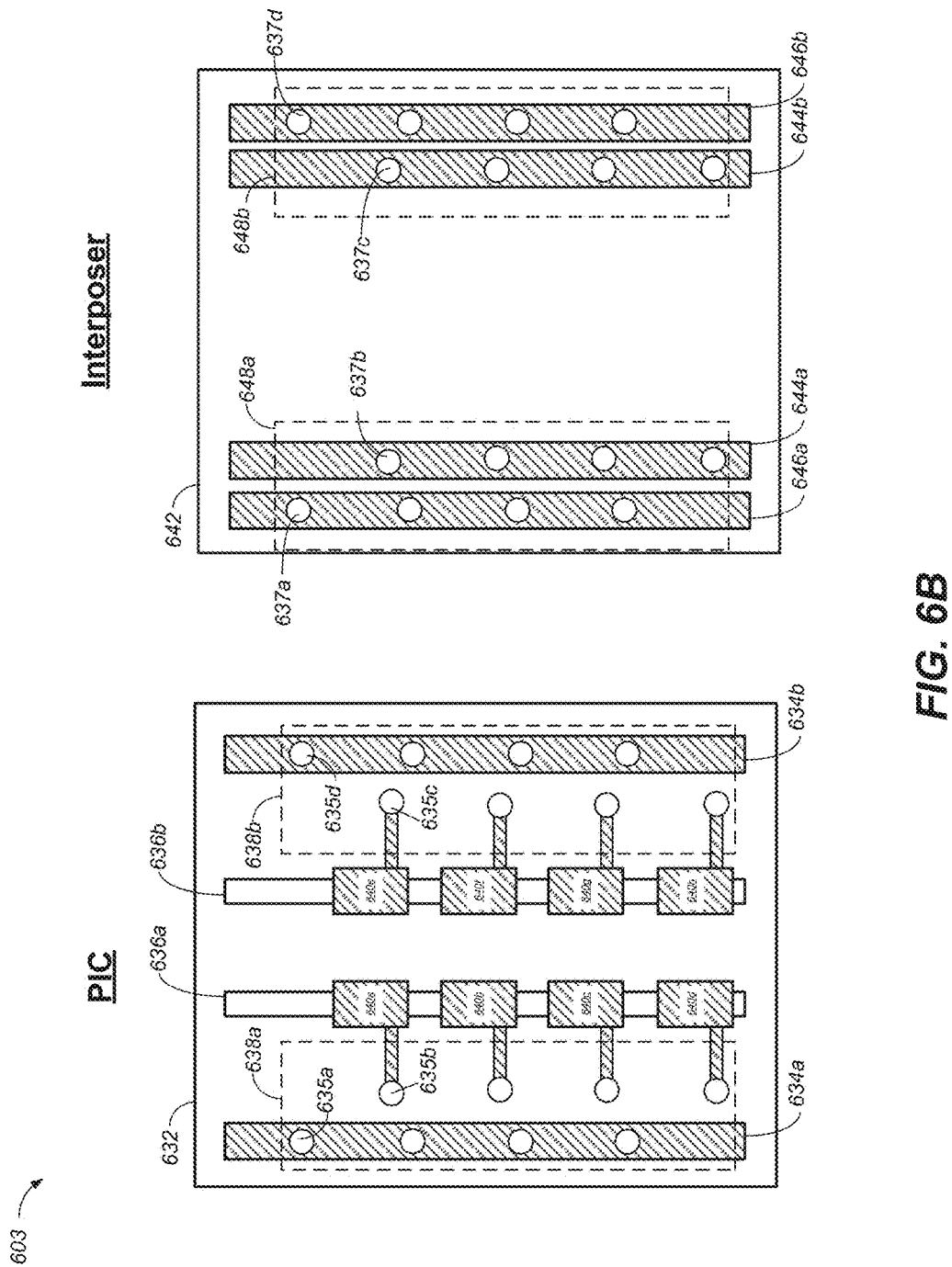

FIG. 6B illustrates an example layout 603. FIG. 6B illustrates a portion of a PIC chip 632 that includes alternative configuration to the TW "push-pull" MZM. Note that in the layout 603, the portions of the MZM in which light is split and combined are not shown. The TW MZM includes a pair of waveguides 636a and 636b. The TW MZM further includes TW signal electrodes 640a-640h that overlay each waveguide. The PIC chip 632 includes conductive ground electrodes 634a and 634b. Electrical contacts to the electrodes 640a-640h and the ground electrodes 634a and 634b may be made by bond contacts (e.g., 635a, 635b, 635c, 635d) that are included in regions 638a and 638b.

The example layout 603 also includes a portion of an interposer 642 having signal traces 644a and 644b for supplying push-pull drive signals and ground traces 646a and 646b for providing a ground voltage. The interposer 642 includes bond contacts (e.g., 637a, 637b, 637c, 637d) included in regions 648a and 648b, which may be bonded or attached to bond contacts (e.g., 635a, 635b, 635c, 635d) included in regions 638a and 638b to provide electrical connections to electrodes on the PIC chip 632. Although not shown, the interposer 642 may be electrically coupled to one or more ASIC chips such as a MZM driver. The PIC chip 632 may be bonded to the interposer 642 in a manner similar to the implementations described in this specification.

During operation, the PIC chip 632 may receive one more electrical signals from the interposer 642. A first drive signal indicative of a first data stream is supplied from the signal tracer 644a to the electrode 640a-640d overlying the waveguide 636a, and a second drive signal indicative of a second data stream is supplied from the signal trace 644b to the electrode 640e-640h overlying waveguide 636b. Bond contacts supply drive signals and ground biasing to the signal electrodes and ground electrodes in a manner similar to that described above with reference to FIG. 6A.

Figure 6C:
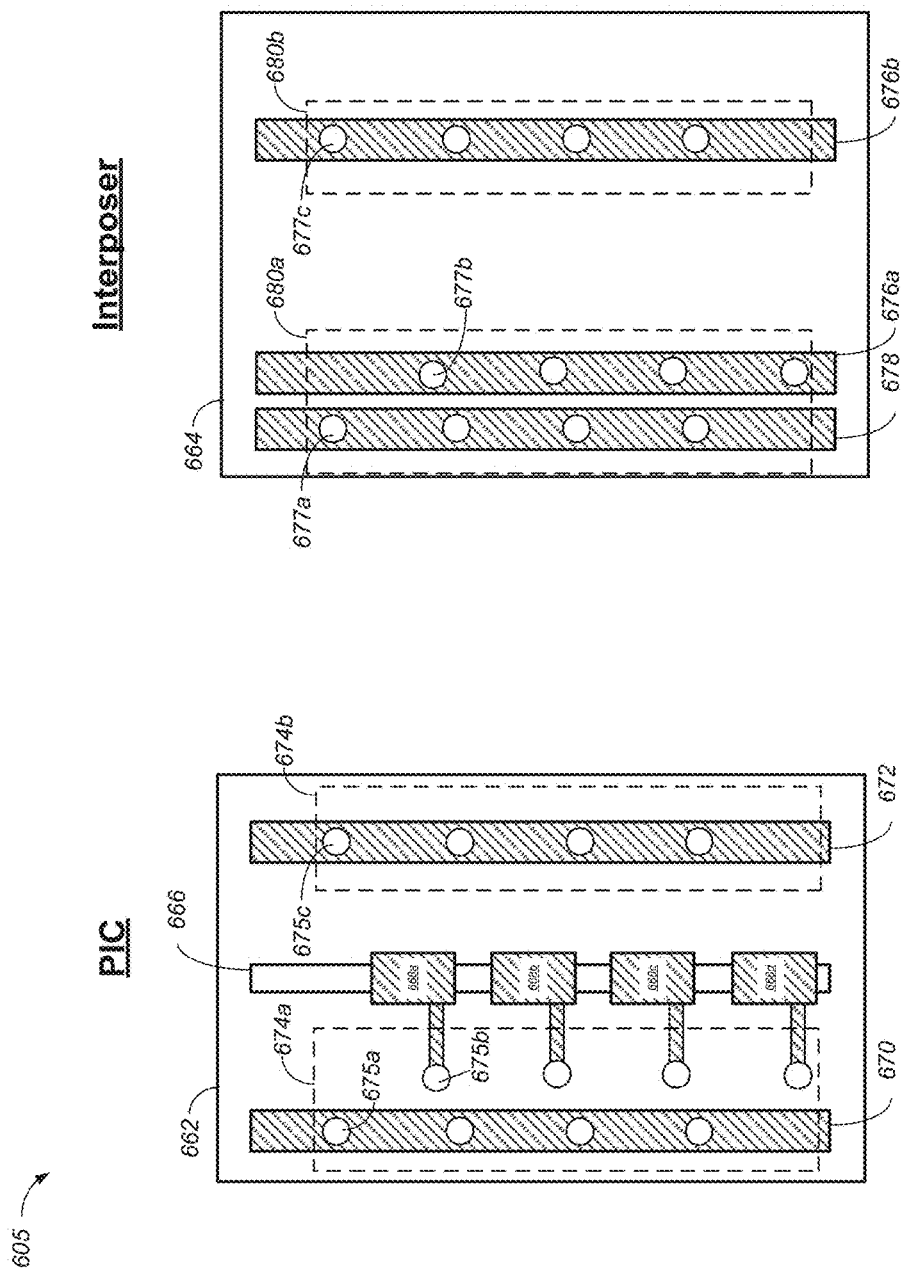

FIG. 6C illustrates an example layout 605. FIG. 6C illustrates a portion of a PIC chip 662 that includes a TW waveguide photodiode. The TW waveguide photodiode includes a waveguide 666. The TW waveguide photodiode further includes TW signal electrodes 668a-668d and 672.

The PIC chip 662 includes a conductive ground electrode 670. Electrical contacts to the electrodes 668a-668d and 672 and the ground electrode 670 may be made by bond contacts (e.g., 675a, 675b, 675c) included in regions 674a and 674b.

The example layout 605 also includes a portion of an interposer 664 having signal traces 676a and 676b and a ground trace 678. The interposer 664 includes bond contacts that are included in regions 680a and 680b, which may be bonded or attached to bond contacts (e.g., 677a, 677b, 677c) included in regions 674a and 674b to provide electrical connections to the PIC chip 662. Although not shown, the interposer 664 may be electrically coupled to one or more ASIC chips such as a TIA. The PIC chip 662 may be bonded to the interposer 664 in a manner similar to the implementations described in this specification.

During operation, an optical signal is received by the waveguide photodetector 666. As the optical signal propagates in the waveguide photodetector 666, the optical signal is absorbed by the waveguide photodetector 666 and is converted to an electrical signal. The electrical signal is collected through bond contacts (e.g., 675b) to the interposer 664, and then to a TIA that is coupled to the interposer 664.

As shown in FIGS. 6A-6C, the signal traces (e.g., the signal trace 626a, 626b, 628a, and 628b in FIG. 6A) run straight, since the velocity of the electric wave is the same as that of the optical wave in these examples. On the other hand, if the velocity of the electric wave exceeds that of the optical wave, for example, the path length of signal traces over which the electric wave propagates may be extended, such as by providing serpentine push-pull signal traces 702, 704, 706, and 708 as shown in the example interposer layout 700 in FIG. 7A. Other signal trace shapes or configurations may also be contemplated. By providing a longer signal path, the time required for the electric wave to travel through the signal trace (e.g., signal trace 702) is increased. Put another way, the electric wave experiences a delay, and such delay may be set so that the electric wave reaches each bond contact (712a, 712b, 712c, and 712d) and thus each electrode segment (e.g., 610a, 610b, 610c, 610d), at an instant in time when the optical wave reaches a corresponding portion of the waveguide. As such, the phase of the electric wave can be matched to that of the optical wave through the length of the electrode.

Figure 7A:
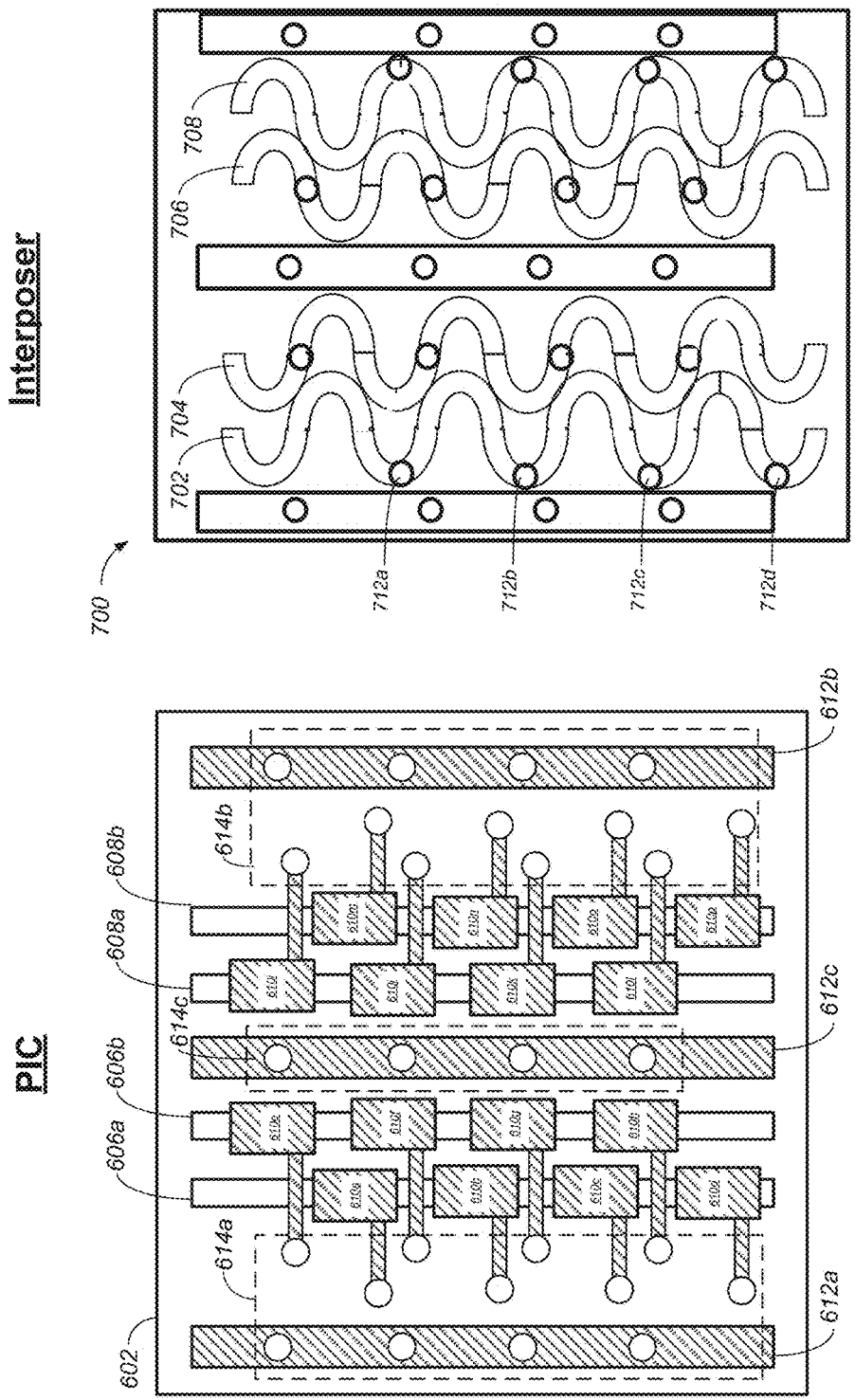
FIGS. 7A-7B illustrate example PIC and interposer layouts for matching electrical and optical waves.
Figure 7B:
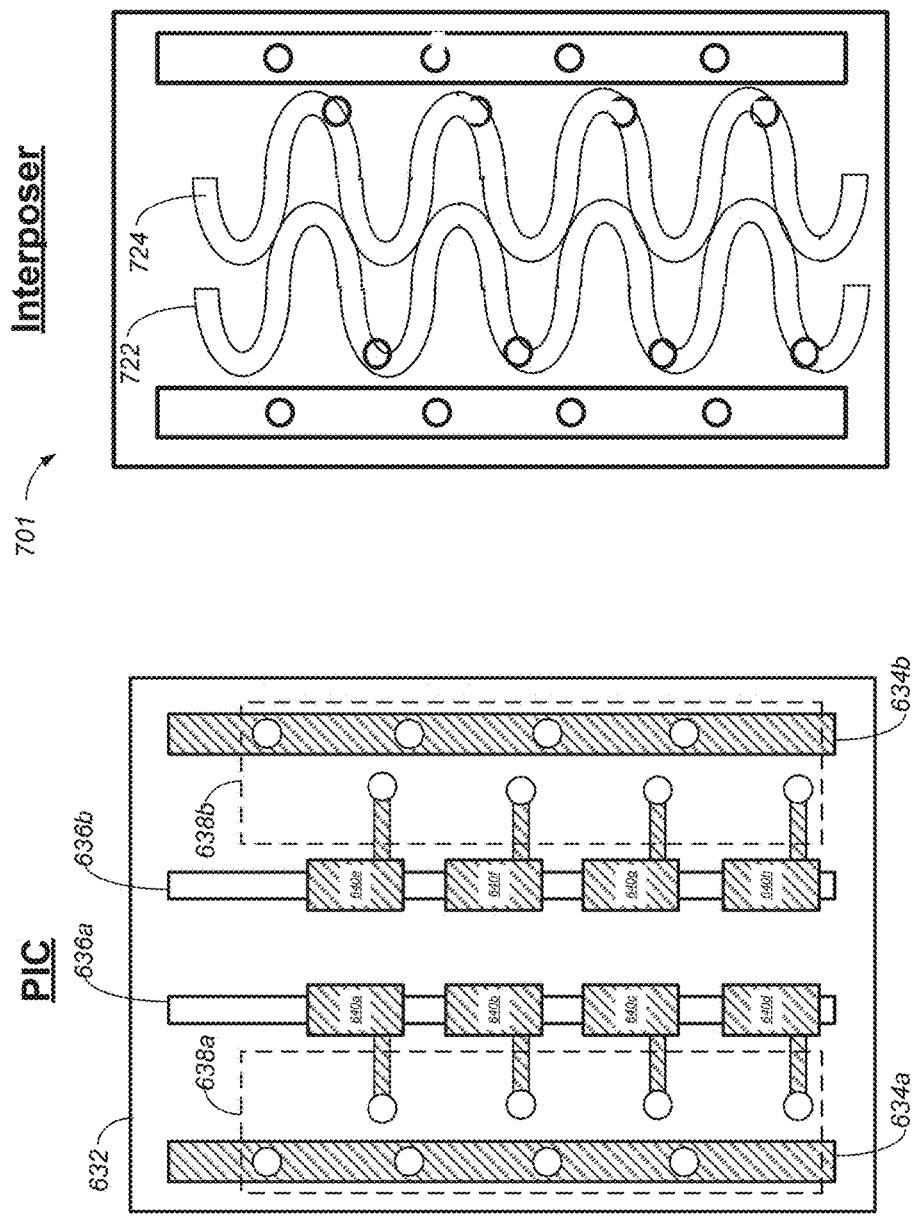

The traces 702, 704, 706, and 708 shown in FIG. 7A may thus provide push-pull drive signals to the electrode segments 606a, 606b, 608a, and 608b shown in FIG. 6A, for example, when the velocity of the electric wave is not matched to the optical wave. Moreover, the traces 722 and 724 shown in the example interposer layout 701 in FIG. 7B may be provided to supply non-push-pull velocity mismatched drive signals to the electrode segments 636a and 636b in PIC 632 as shown in FIG. 6B, for example.

Figure 8:
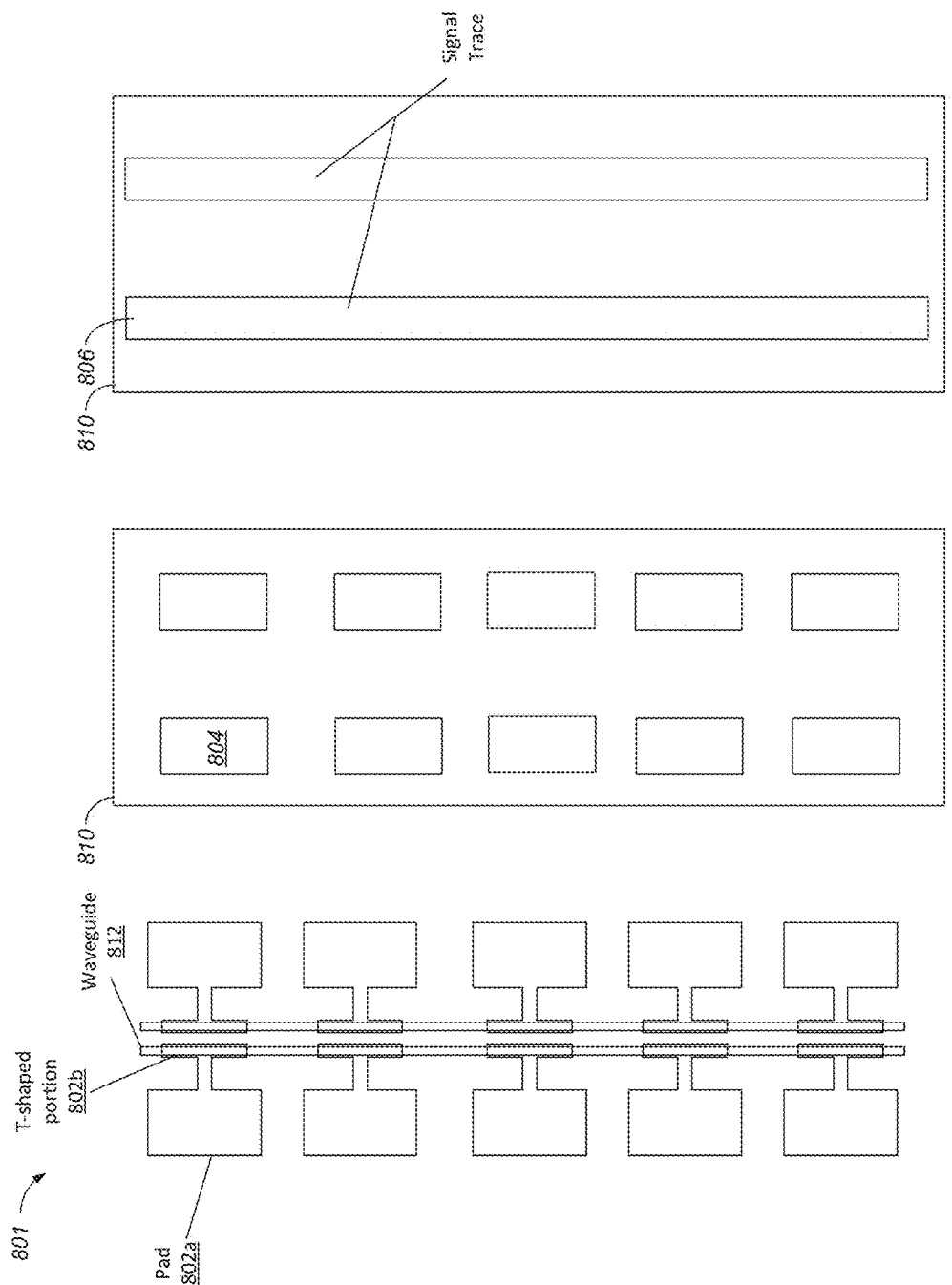
FIG. 8 illustrates example PIC and interposer layouts.

FIG. 8 shows further examples of signal electrode segments, bond contacts, and signal traces consistent with the present disclosure. Referring to the example PIC layout 801, each signal electrode segment may include a pad portion 802a and a T-shaped portion 802b connected to the pad portion 802a. The pad portion 802a may be aligned with a bond contact 804 formed on an interposer 810, which, in turn, is aligned with a signal trace 806 on a surface of the interposer 810 opposite the PIC 801. The bond contact 804 may be electrically coupled to the signal trace 806 through a via (not shown). As described above in reference to FIGS. 4A-4C, the drive signal may be applied to the signal trace 806, down the via (not shown) to the bond contact 804, to the PIC pad portion 802a, and to the T-shaped portion 802b. At which point, the voltage creates an electric field in an underlying waveguide to change the refractive index of the waveguide 812. As a result, the phase and/or amplitude of light propagating in the waveguide 812 is changed or modulated in accordance with the electrical drive signal and thus the data to be carried by the optical signal. Although not shown in the figure, there may be gold or solder bumps, termination resistors and so forth.

Figure 9A:
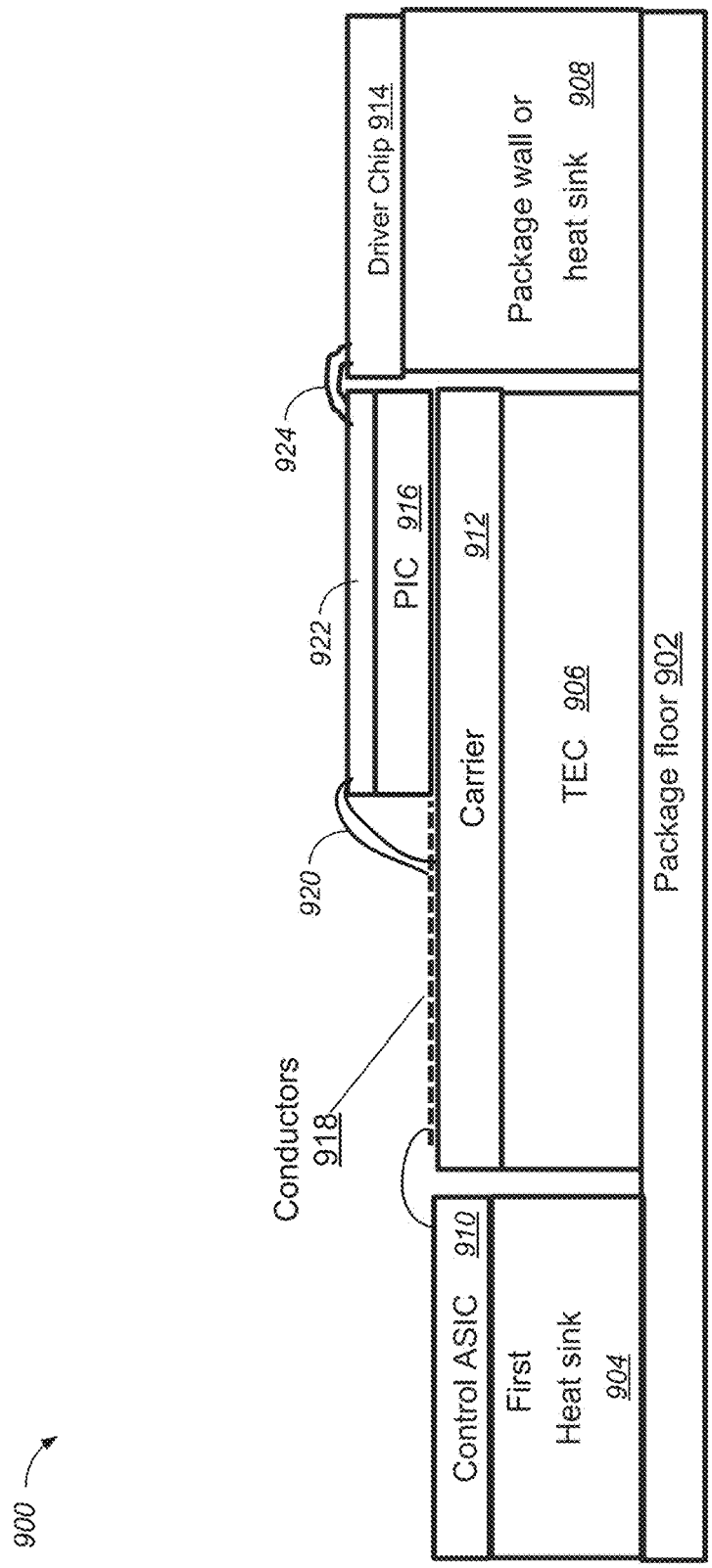

FIG. 9A shows an example packaging arrangement 900 including a substrate or package floor 902 upon which a first heat sink 904, a thermal-electric cooler (TEC) 906, and package wall (or second heat sink) 908 are provided. The first heat sink 904 cools the control ASIC 910, and the TEC 906 can be provided to cool and thermally regulate the carrier 912, respectively. The package wall or alternatively a second heat sink 908 may regulate the temperature or cool a high-speed ASIC chip 914 (e.g., a MZM driver or a TIA).

As further shown in FIG. 9A, the control ASIC 910 is electrically connected to the PIC 916 by conductors 918 provided on the carrier 912 and wires 920 that are attached or bonded to traces on the interposer 922. As noted above, vias in the interposer 922 are filled with conductive material to electrically connect the traces to one side or surface of the interposer 922 with various PIC elements provided adjacent the opposite surface of the interposer 922.

The ASIC chip 914 may provide drive signals to wires 924 that connect to signal traces on the interposer 922. The signal traces are also connected through the interposer 922 to signal electrodes on the PIC 916 in a manner similar to that described above for lumped and/or TW active optical devices. Preferably, the wires connecting the ASIC chip 914 with the interposer signal traces are relatively short in length to reduce any unwanted inductance.

Figure 9B:
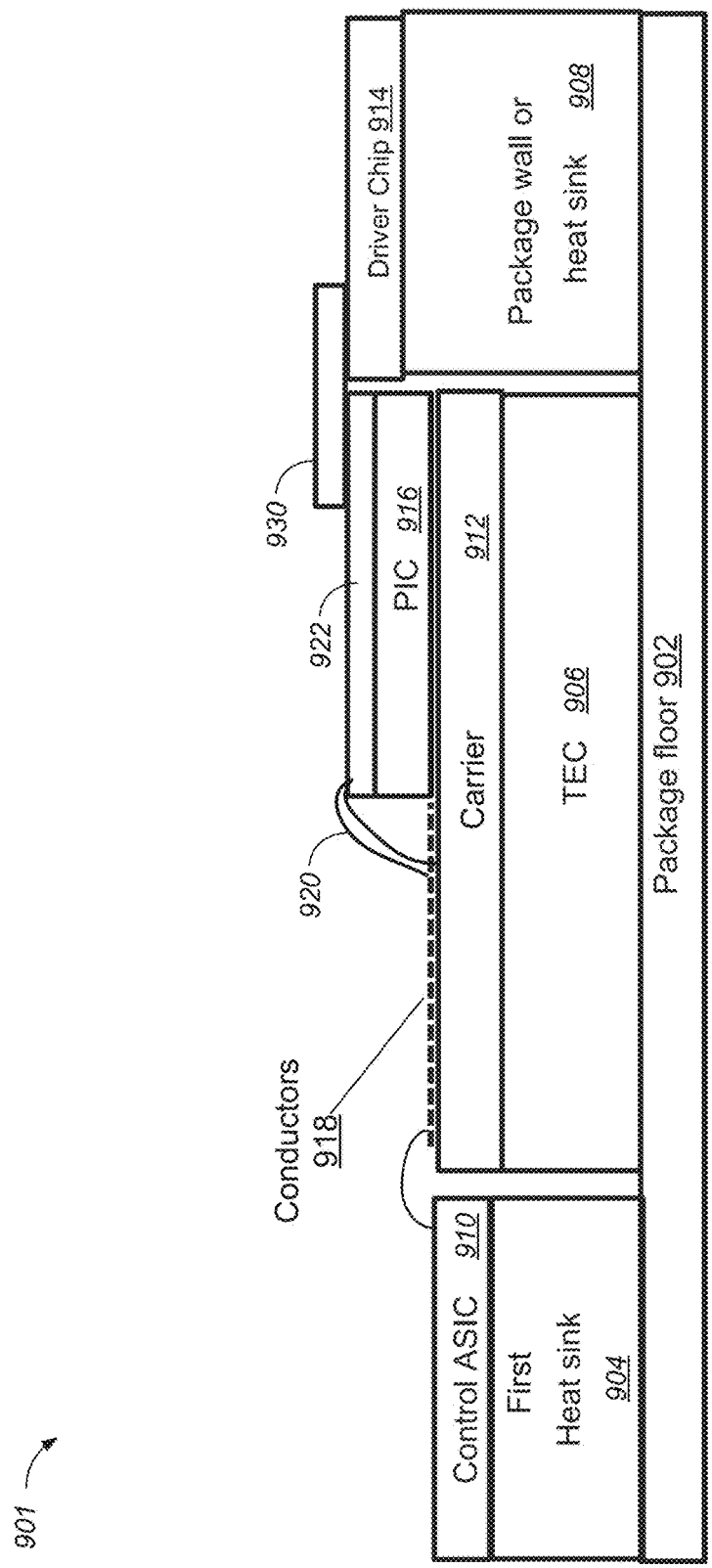

FIG. 9B shows an example packaging arrangement 901 that is similar to that shown in FIG. 8A, but a second interposer (also referred to as a "bridge chip") 930, instead of short wires 924, connects the ASIC chip 914 with the signal traces on the interposer 922. The conductors especially on the bottom of the bridge chip 930 may form coplanar waveguides or other short transmission lines that may have less inductance than the short wires 924 shown in FIG. 9A and thus the embodiment shown in FIG. 9B may be preferable over the embodiment shown in FIG. 9A in this respect. Examples of bridge chips may include the second interposer 160 described in reference to FIG. 1C, the second interposer 460 described in reference to FIG. 4C, and bridge chips described with reference to FIGS. 10A-10B below.

Figure 10A:
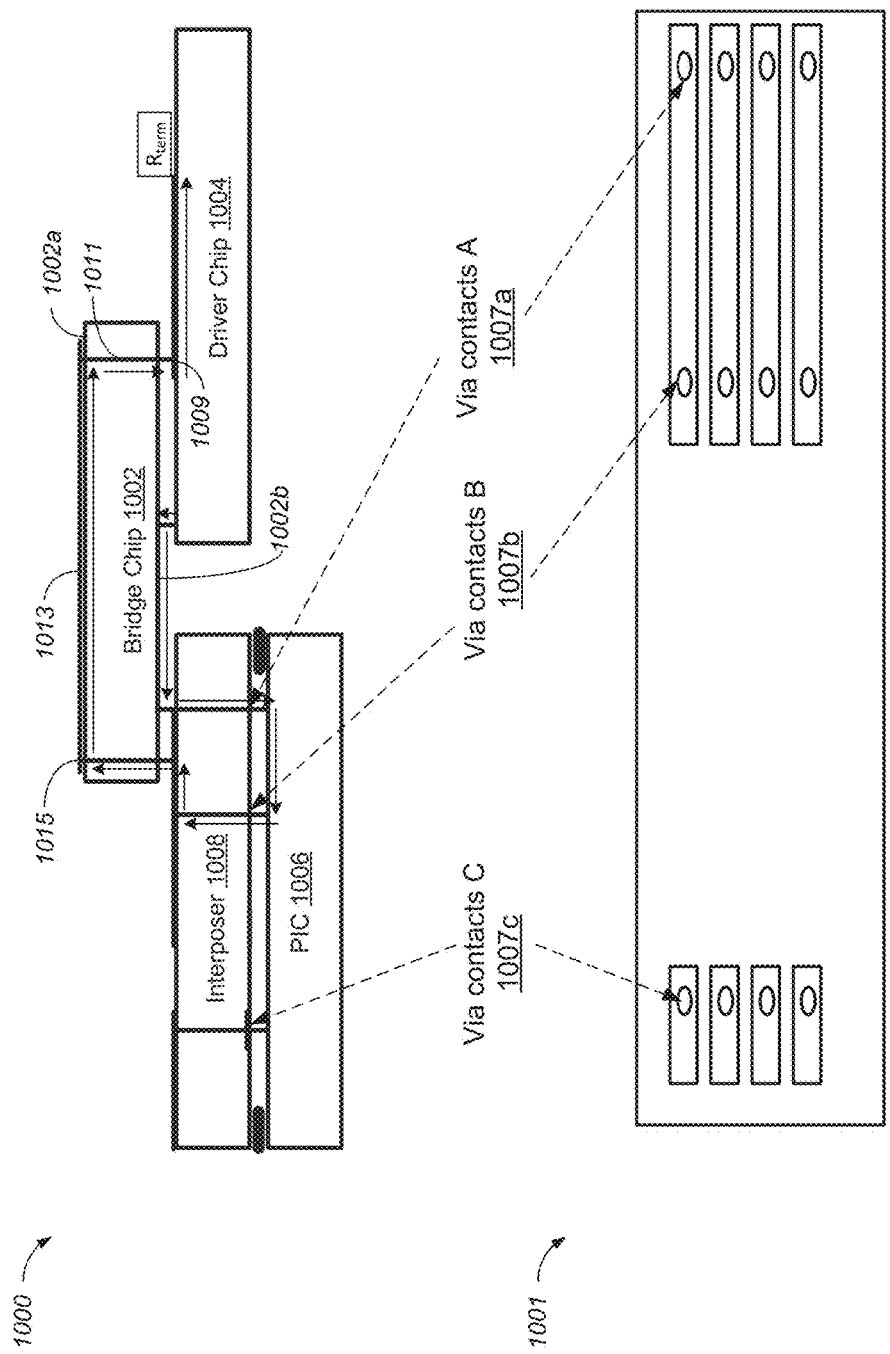

FIG. 10A illustrates an example packaging arrangement 1000, where a bridge chip 1002 including silicon or silicon dioxide (SiO$_2$) may be provided that has vias 1007a-1007c including a conductive material, such as gold or another metal. The bridge chip 1002 may also be very thin Si, organic or other material that does not need to provide hermetic sealing. A gold bump, solder bump, pad or other conductor at the end of trace 1009 on the ASIC chip 1004 electrically connects to the bridge chip 1002 by a first via 1011. Following the arrows shown in FIG. 10A, the first via 1011 carries drive signals to a conductor or trace 1013 provided on a first surface 1002a of the bridge chip 1002 opposite a second surface 1002b facing the ASIC chip 1004. A second conductive via 1015 supplies the drive signals to signal electrodes on the PIC 1006 by way of signal traces on the interposer 1008 in a manner similar to that described above. As an example, the interposer 1008 may include a silicon substrate, and the PIC 1006 may include an indium phosphide (InP) substrate. The PIC 1006 may include a TW active optical device, and in some implementations the electrodes on the interposer 1008 supplying drive signals to the PIC 1006 may not be segmented or resistively terminated because the speed requirement of the TW active optical device does not require segmented electrodes or impedance matching.

FIG. 10A further shows a plan view 1001 of the bottom surface of the interposer 1008. As shown in FIG. 10A, bond contacts A, B and C are connected to signal traces and aligned with vias extending through the interposer 1008, as discussed above. Since the signal electrode on the PIC 1006 in this example is not segmented, vias corresponding to contacts B and C are only provided at locations adjacent opposite ends of the signal electrodes. Following the arrows shown in FIG. 10A, the bond contacts A provide drive signals to the bond contacts B, which in turn, supply the drive signals to corresponding signal electrodes.

Figure 10B:
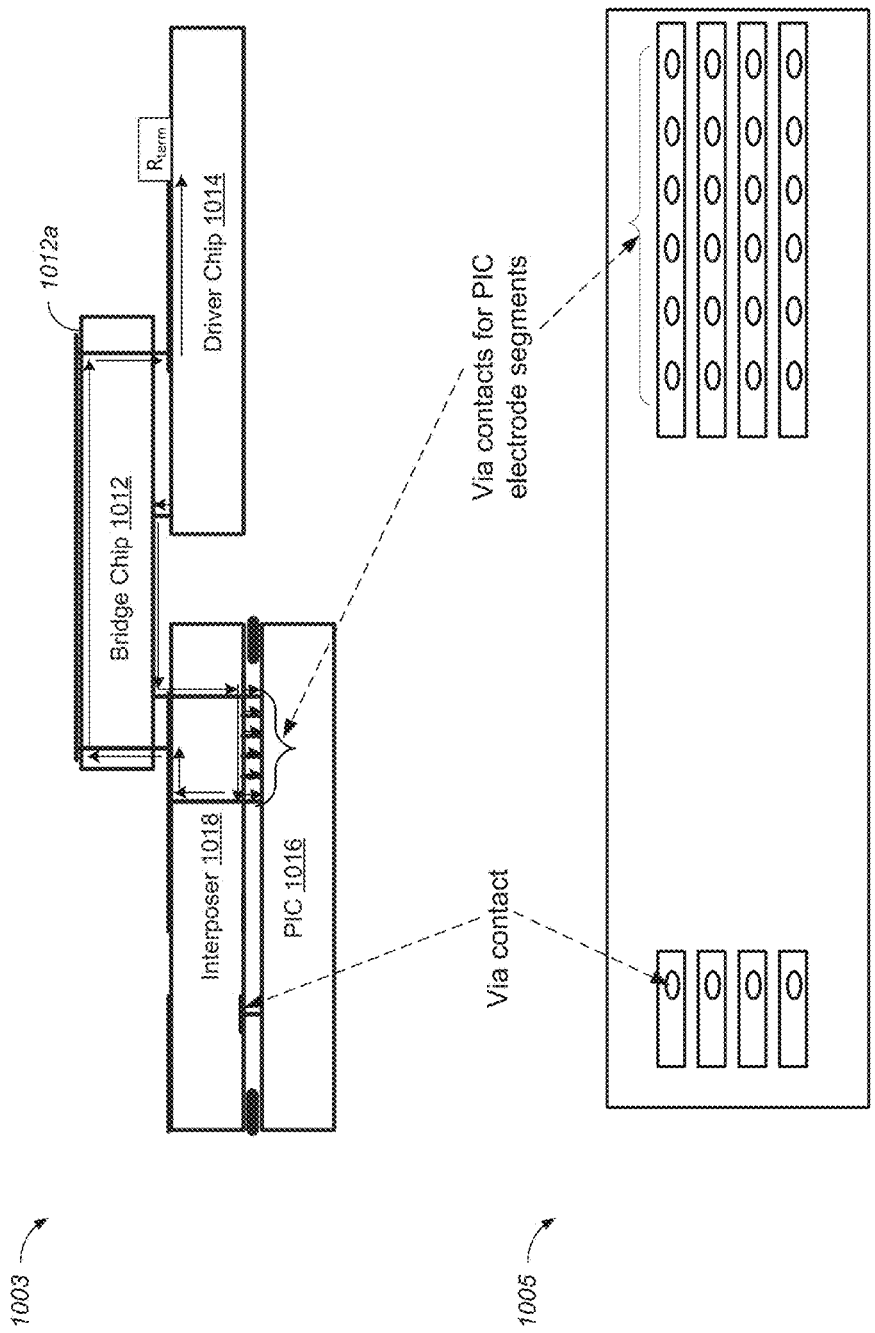

FIG. 10B illustrates an example packaging arrangement 1003. The example shown in FIG. 10B is similar to that shown in FIG. 10A, but the signal electrodes on the PIC 1016 are segmented (e.g., electrodes 610a-610d as shown in FIG. 6A). FIG. 10B further shows a plan view 1005 of the bottom surface of the interposer 1018. Since the signal electrodes on the PIC 1016 are segmented, each segment is contacted by a corresponding metal bumps or connections. The segments are provided along a length corresponding to the interposer signal traces. Accordingly, bond contacts are likewise provided along the length of the signal trace of the interposer 1018.

Figure 10C:
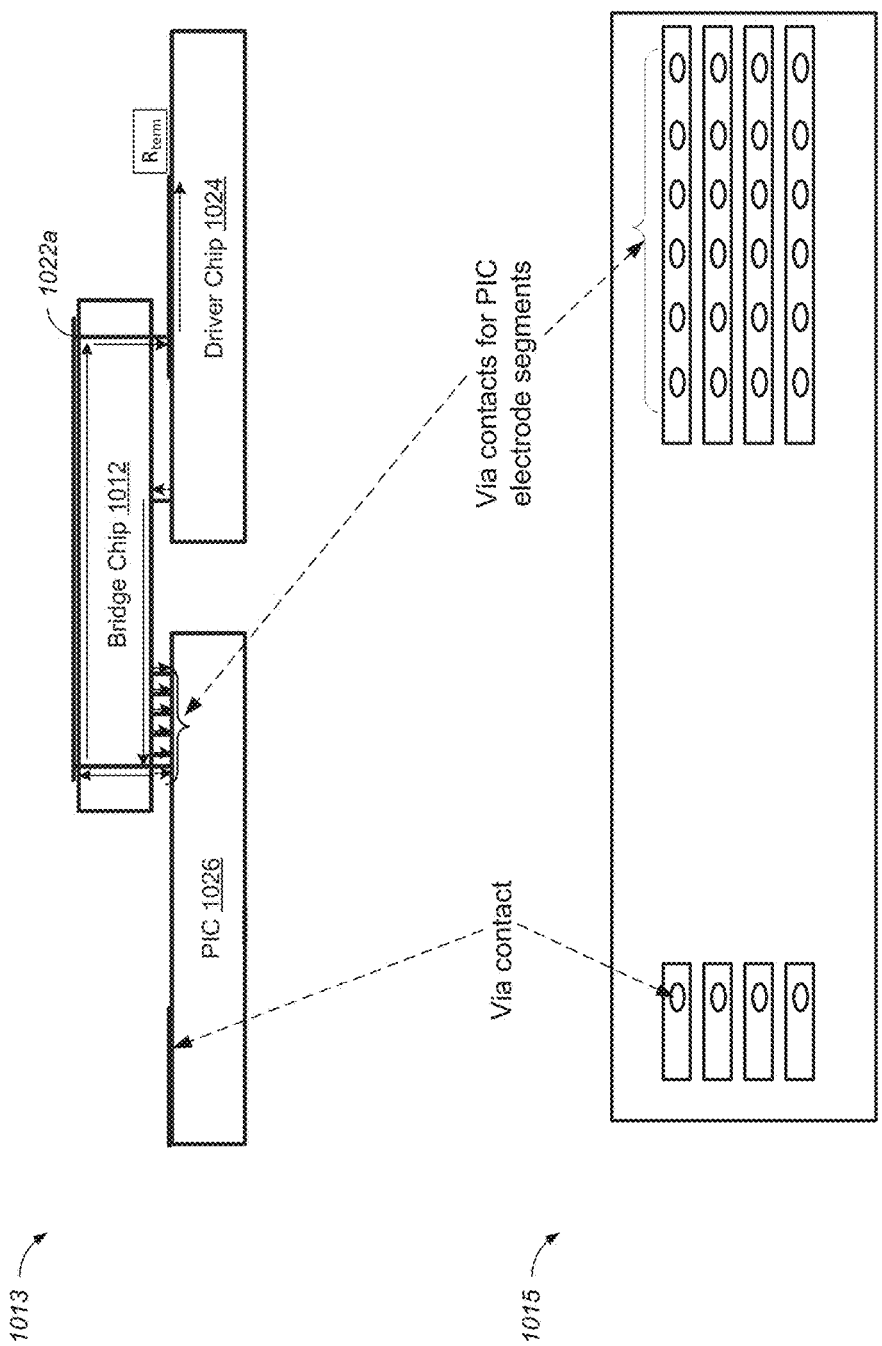

FIG. 10C illustrates an example packaging arrangement 1013. The example shown in FIG. 10C is similar to that shown in FIG. 10B, but the segmented signal electrodes on the PIC 1026 are bonded to a bridge chip 1022 without an interposer. FIG. 10C further shows a plan view 1015 of the bottom surface of the bridge chip 1022. Since the signal electrodes on the PIC 1026 are segmented, each segment is contacted by a corresponding metal bumps or connections. The segments are provided along a length corresponding to the interposer signal traces. Accordingly, bond contacts are likewise provided along the length of the signal trace of the bridge chip 1022. In some implementations, the DC control for the PIC 1026 may be wire-bonded to the PIC 1026.

FIG. 11A shows a simplified plan view of an example package 1100 consistent with a further aspect of the present disclosure. The package 1100 shown in FIG. 11A includes a mounting substrate 1102, upon which two control circuit integrated circuits (ICs) 1104 and 1106, a driver IC 1108, and a transmitter PIC 1110 including integrated widely tunable lasers (WTLs) and modulators are provided. The modulators may be lumped MZMs or TW MZMs. FIG. 11B shows a cross section of the package 1100 consistent with an aspect of the present disclosure. As shown in FIG. 11B, the package 1100 further includes a top covering or package floor 1112. The substrate 1114 shown in FIG. 11B constitutes a base or mount having first gold or solder bumps 1116 that receive and output electrical signals for the control and driver ICs from external circuitry (not shown). Hereafter, whenever solder bumps are mentioned, they may refer to either gold or solder bumps inclusively. The package 1110 also includes a DC ASIC 1118 that provides DC voltages to appropriately bias certain PIC elements. The DC ASIC 1118, as well as the driver IC 1108 and the interposer 1120 may be flip chip or solder bonded via second solder bumps 1122 to the substrate 1114. The second solder bumps 1122 may be micro-solder bumps. Drive signals output from the driver IC 1108 are supplied to selected second solder bumps 1122 adjacent to the driver IC 1108 and are then transmitted on traces on the substrate 1114 to second solder bumps 1122 that connect to signal traces on the interposer 1120. The second solder bumps may include either gold, copper, indium, or other metal. The signal traces supply the drive signals to the MZM signal electrodes in a manner similar to that described above. Electrical contacts on the interposer are aligned to the underlying solder bumps.

As further shown in the cross-sectional view of FIG. 11B, a heat spreader or heat sink 1124 is provided for the driver IC 1108, and a TEC 1126 is provided to cool the transmitter PIC 1110. A compliant thermal filler 1128a and 1128b may also be provided to fill the space between the heat spreader 1124 and the package floor 1112, as well as the space between the DC ASIC 1118 and the package floor 1112.

The DC ASIC 1118 shown in FIG. 11B is provided on the same surface of the interposer 1120 as the transmitter PIC 1110, such that DC voltages are supplied to the transmitter PIC 1110 by way of conductive traces on the interposer 1120. As shown in the cross-sectional view of FIG. 11C, however, the DC ASIC 1118 may be flip chip bonded to the substrate 1114, and the DC voltages may be supplied to the transmitter PIC 1110 via solder bumps and traces on the substrate 1114 in a manner similar to that discussed above with respect to the drive signals output from the driver IC circuit 1108.

Figure 12A:
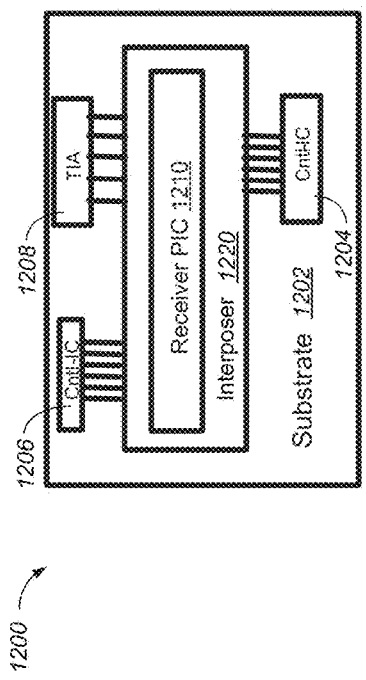
Figure 12B:
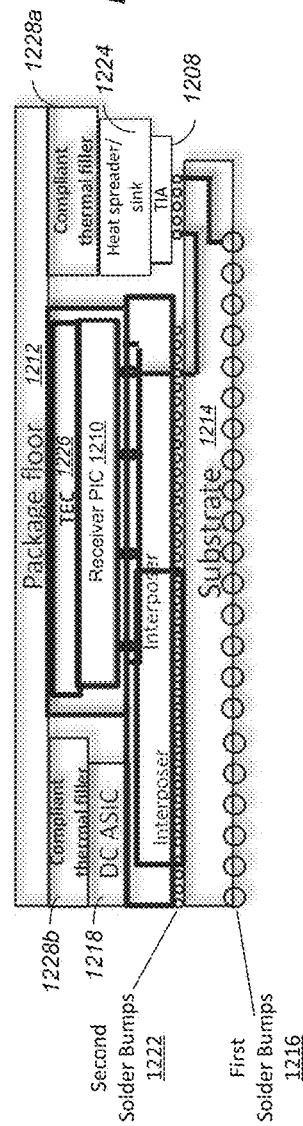
Figure 12C:
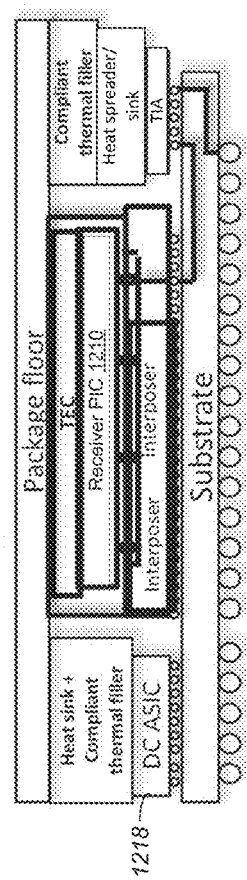

FIGS. 12A-12C shows an example package 1200. The package 1200 shown in FIG. 12A is similar to the package 1100 as described in reference to FIG. 11A. However, the PIC in the package 1200 is a receiver PIC 1210. The receiver PIC 1210 includes lumped or TW waveguide photodiode. A TIA 1208 is used to collect electrical signals converted from optical signals.

Figure 13A:
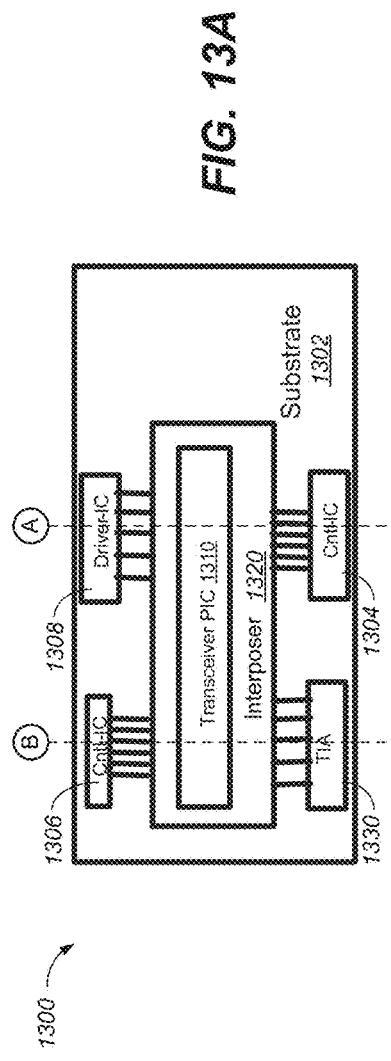

FIG. 13A shows an example package 1300. The package 1300 is similar to the package 1100 as described in reference to FIG. 11A. However, the PIC in the package 1300 is a transceiver PIC 1310. The transceiver PIC 1310 includes laser sources, lumped or TW modulators, and lumped or TW waveguide photodiodes. The transmitter and receiver functions on the transceiver PIC 1310 may be fully integrated on a same chip, or separately integrated on separate chips. A ASIC chip 1308 is used to drive the modulators on the transceiver PIC 1310. A TIA 1330 may be provided to amplify the electrical signals converted from optical signals.

Figure 13B:
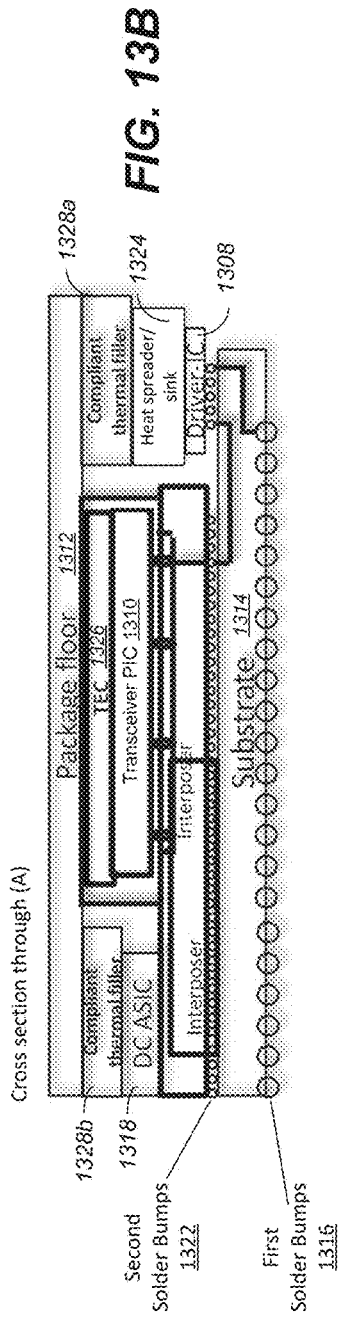
Figure 13C:
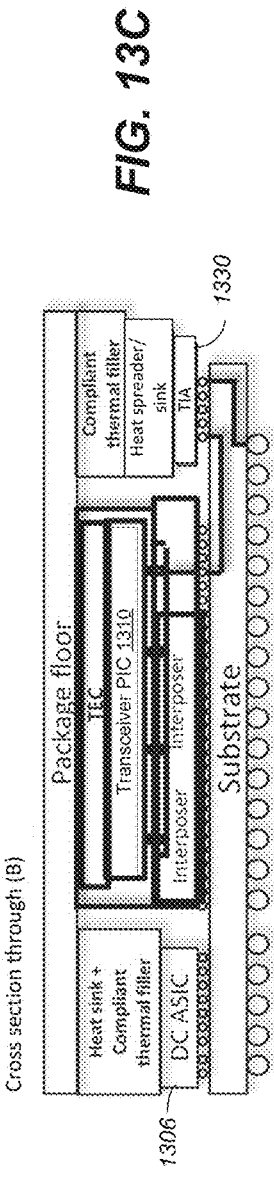

FIG. 13B shows a cross-sectional view of the package 1300 across an axis as denoted by (A), which is similar to the cross-sectional view of the package 1100 as described in reference to FIG. 11B. FIG. 13C shows a cross-sectional view of the package 1300 across an axis as denoted by (B) which is similar to the cross-sectional view of the package 1200 as described in reference to FIG. 12B. Figs.

Figure 13D:
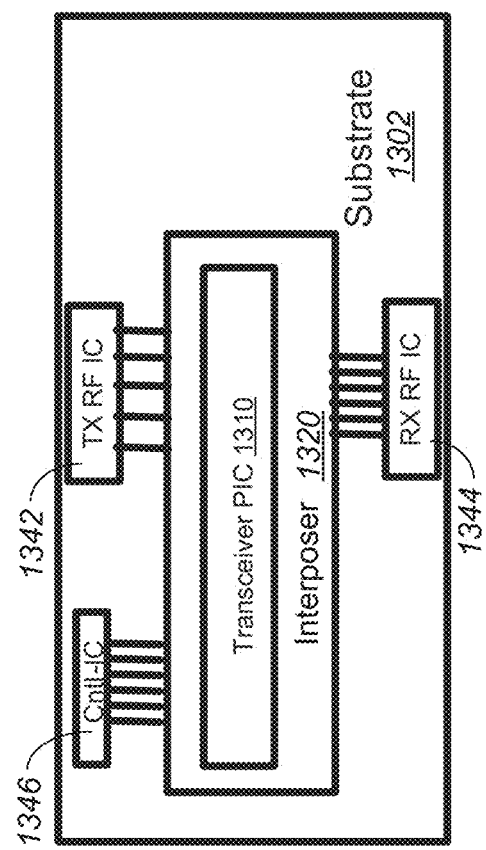

FIG. 13D shows an example package 1301. The package 1301 is similar to the package 1300 as described in reference to FIG. 13A. However, the ASIC for the transmitter and the receiver is separated into a transmitter RF IC 1342 and a receiver RF IC 1344. The transmitter RF IC 1342 is arranged on one side of the interposer 1320, while the receiver RF IC 1344 is arranged on the other side of the interposer 1320.

Figure 14A:
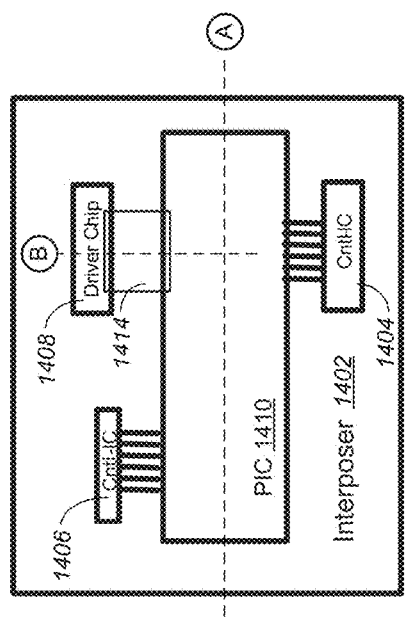
Figure 14B:
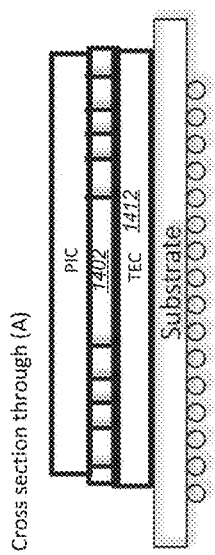
Figure 14C:
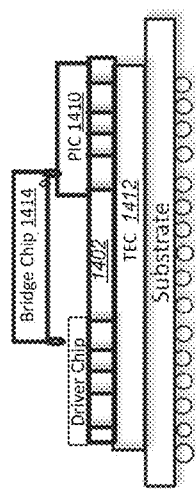

14A-14C show plan and cross-sectional views of an example package 1400 consistent with the present disclosure. The package 1400 shown in FIGS. 14A-14C includes an interposer 1402, control IC 1404 and 1406, a ASIC chip 1408, a PIC 1410, and a TEC 1412 similar to those of the examples discussed above. The PIC 1410 may be a transmitter, a receiver, or a transceiver, and may include lumped or TW active optical devices. As an example, the PIC 1410 may have a single laser (WTL) and a modulator. The package 1400 further includes a bridge chip 1414, similar that discussed above in regard to FIGS. 1C and 4C, provides electric drive signals to the modulator on the PIC 1410.

FIGS. 15A-15C show plan and cross-sectional view of a package 1500 which includes a discrete laser and modulator. An electric bridge chip 1502 provides electric drive signals from the driver IC to the modulator, and an optical bridge chip 1504 including waveguides supplies light from the laser (WTL) 1506 to the modulator 1508. The optical bridge chip 1504 may include turning mirrors or grating couplers to direct light from the WTL 1506 to a waveguide on the optical bridge chip 1504. The bridge chip waveguide may further supply the light to another turning mirror or grating coupler, which directs the light to waveguides on the substrate that includes the modulator 1508. In some implementations, a bridge chip may include optical access on one side and have RF access on different sides including an opposite side to the optical access.

As noted above, in a multi-channel PIC, multiple termination resistors, such as that shown in FIG. 5, may be provided off the PIC in order to reduce the thermal load of the PIC. For example, in the packages shown in each of FIGS. 9A, 9B, 10A-10C, 11A-11C, 12A-12C, 13A-13D13D, 14A-14C, and 15A-15C, termination resistors may be provided on any one of the interposer, the bridge chip, the mounting substrate, or the package floor. Further, placement of and connection to the termination resistors is more convenient off the PIC than on it, so that impedance matching can be more easily maintained. Preferably, the termination resistor is placed so that the insulating or high thermal resistance bridge is thermally in between the terminating resistor and the PIC. In some implementations, in the packages shown in each of FIGS. 9A, 9B, 10A-10C, 11A-11D, 12A-12C, 13A-13D, 14A-14C, and 15A-15C, the control ICs may be arranged outside of the package, and DC control traces may be implemented for electrical connections with the control ICs.

Additional details of a transmitter PIC will be described below with reference to FIGS. 16-19, 20A-20E, and 21-23.

Figure 16:
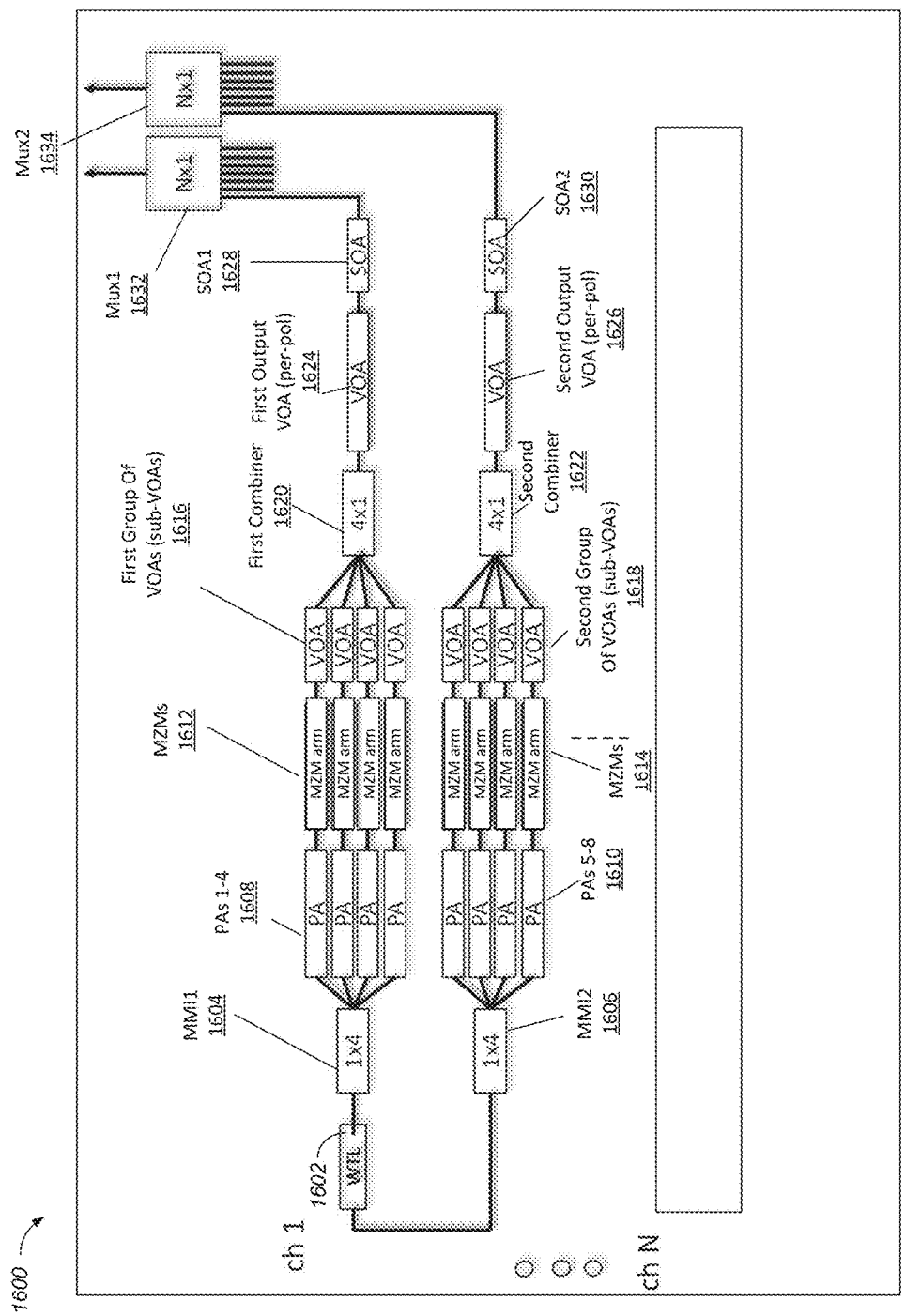
FIG. 16 illustrates a block diagram of an example multi-channel transmitter PIC.

FIG. 16 illustrates a block diagram of a multi-channel transmitter PIC 1600 consistent with an aspect of the present disclosure. PIC 1600 includes multiple "channels", i.e. channels 1 to N, one of which, channel 1, is shown in detail. It is understood that remaining channels 2 to N may have the same or similar structure as channel. Each channel supplies a first group of modulated optical signals, each having a corresponding one of wavelengths λ1 to λn, to a first multiplexer Mux1, as well as a second group of modulated optical signals, each having a corresponding one of the wavelengths λ1 to λn, to a second multiplexer Mux2. Mux1 and Mux2 may include, for example, a power combiner or an arrayed waveguide grating (AWG). Alternately, the waveguides may be routed directly to the facet without a multiplexer or coupler.

As further shown in FIG. 16, channel 1 includes a widely tunable laser (WTL) 1602, for example, which may include a distributed Bragg reflector (DBR) or distributed feedback (DFB) laser or other suitable laser. CW light output from a first side or facet of the WTL 1602 is supplied to a first 1×4 multimode interference (MMI1) coupler 1604, for example, and light from a second side or facet of the WTL is supplied to a second 1×4 MMI coupler (MMI2) 1606. Each of the outputs of MMI1 1604 is supplied to a corresponding one of a first group of phase adjusters 1608 (PA, PAs 1-4), and each of the outputs of MMI2 1606 is supplied to a corresponding one of a second group of PAs 1610 (PAs 1-5). Each PA in the first and second groups of PAs 1608 and 1610 may include a semiconductor p-i-n structure made of InP, for example, and may be controlled either thermally or by application of an appropriate current to adjust the phase of light supplied thereto. Each PA supplied a phase adjust optical signal to a corresponding one of MZMs 1612 and 1614 (shown as MZM in FIG. 16). The MZMs may be lumped MZMs or TW MZMs. Each pair of MZMs may modulate light in corresponding waveguides in accordance with the push-pull mechanism discussed above. Alternatively, mechanisms other than the push-pull mechanism may also be employed. Each modulated optical signal may be provided to a corresponding one of VOAs ("sub-VOAs"), which are provided as first and second groups. The outputs of the first group of VOAs 1616 are provided to a first combiner 1620, such as a 4×1 MIMI coupler (or 4×4 coupler with 3 anti-reflective terminations or power monitoring detectors), and the outputs of the second group of VOAs 1618 are provided to a second combiner 1622, such as a 4×1 MIMI coupler (or 4×4 coupler with 3 anti-reflective terminations or power monitoring detectors). The outputs of the first and second combiners 1620 and 1622 are provided to a first and second output VOAs 1624 and 1626, respectively, which, in turn, supply attenuated outputs to a corresponding one of semiconductor optical amplifiers SOA1 and SOA2 1628 and 1630. Alternately, the SOAs may precede the VOAs in the circuit or one or the other of the SOAs and VOAs may be omitted, depending on the overall PIC performance and the optical system link requirements. The amplified outputs of SOA1 and SOA2 are then supplied as inputs to multiplexers Mux1 1632 and Mux2 1634, respectively. Alternately, the multiplexers may be omitted from the circuit, and the waveguides routed directly to the facet, again depending on the optical system architectural requirements.

The optical signals output from Mux1 1632 and Mux2 1634 have the same transverse electric (TE) polarization. In order combine the outputs of Mux1 1632 and Mux2 1634, therefore, the polarization of the output from Mux2 1634, for example, may be rotated to have a transverse magnetic (TM) polarization. The resulting TM polarized signals may then be combined with a polarization beam combiner onto a single optical fiber.

Figure 17:
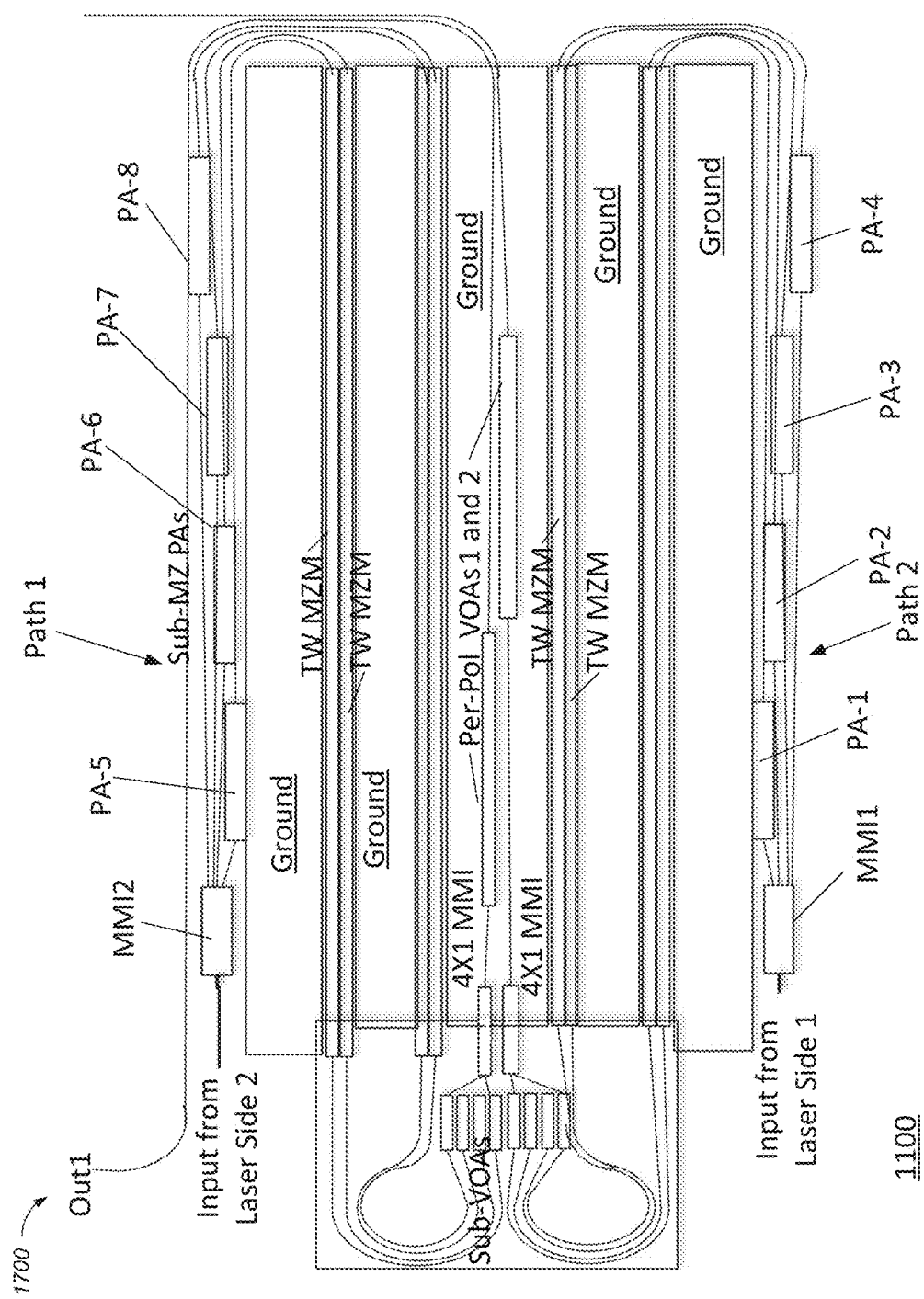
FIG. 17 illustrates an example layout for a multi-channel transmitter PIC.

FIG. 17 an example of a detailed layout 1700 of the elements shown in FIG. 16. WTL 1602 and SOAs 1628 and 1630 are not shown to simplify the drawing. It is noted that SOAs 1628 and 1630 may be optionally provided. In particular, as shown in FIG. 17, MMI1 and PAs 1-4 are provided along a first part of a first optical path ("Path 1") and the TW MZMs are provided along a second part of Path 1 that is folded or looped back on first part of the first path. Similarly, MMI2 and PAs 4-8 are provided along a first part of a second path ("Path 2") that is folded or looped back on a second part of Path 2 including additional TW MZMs.

Because Paths 1 and 2 have a generally serpentine configuration, the overall chip area occupied by the MMIs, PAs, TW MZMs, and VOAs is less than the area occupied by these devices if connected linearly, as in FIG. 16.

Figure 18:
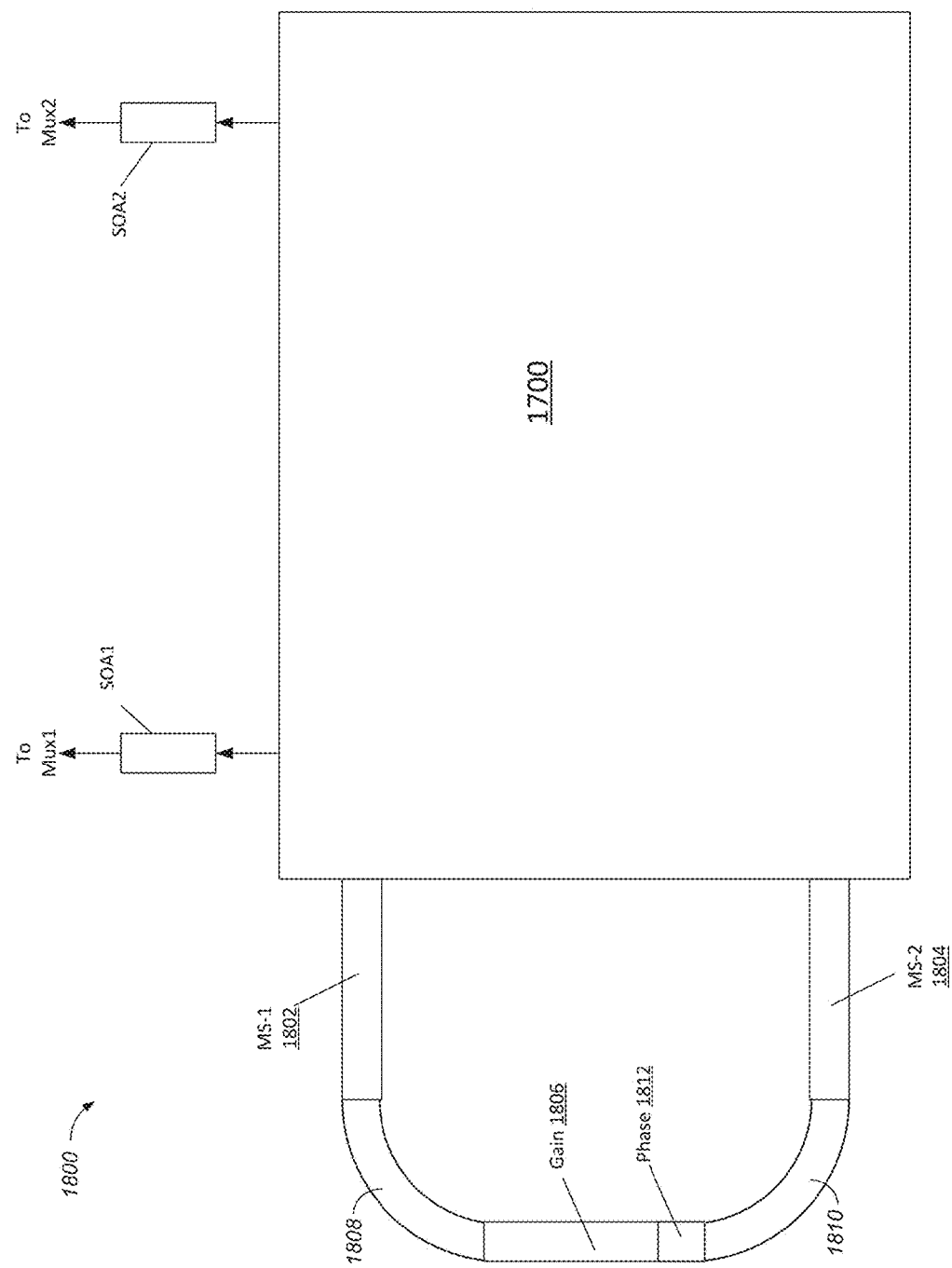
FIGS. 18 and 19 illustrate example layouts for a laser design.

FIG. 18 incorporates the layout 1700 shown in FIG. 17, but for ease of illustration, the elements of FIG. 17 are simply shown as a block labeled 1700. As further shown in FIG. 18, the outputs of the per pol VOAs (or output VOAs) are fed to corresponding SOAs 1 and 2 (e.g., SOA1 1628 and SOA2 1630 as described in FIG. 16). Again the order of the VOAs and the SOAs in the circuit may be reversed and the SOAs or VOAs may either or both be omitted from the circuit, depending upon the optical system architecture requirements. Moreover, the WTL is shown in greater detail as including mirror sections MS1 1802 and MS2 1804 which are optically coupled to a gain (G) section 1806 by curved or bent portions 1808 and 1810. Accordingly, the WTL shown in FIG. 18 may have a U-shape, for example, which also takes up less chip area than if the WTL had a linear shape. In some implementations, the WTL may include a phase tuning section 1812, where a phase inside the cavity may be adjusted.

Figure 19:
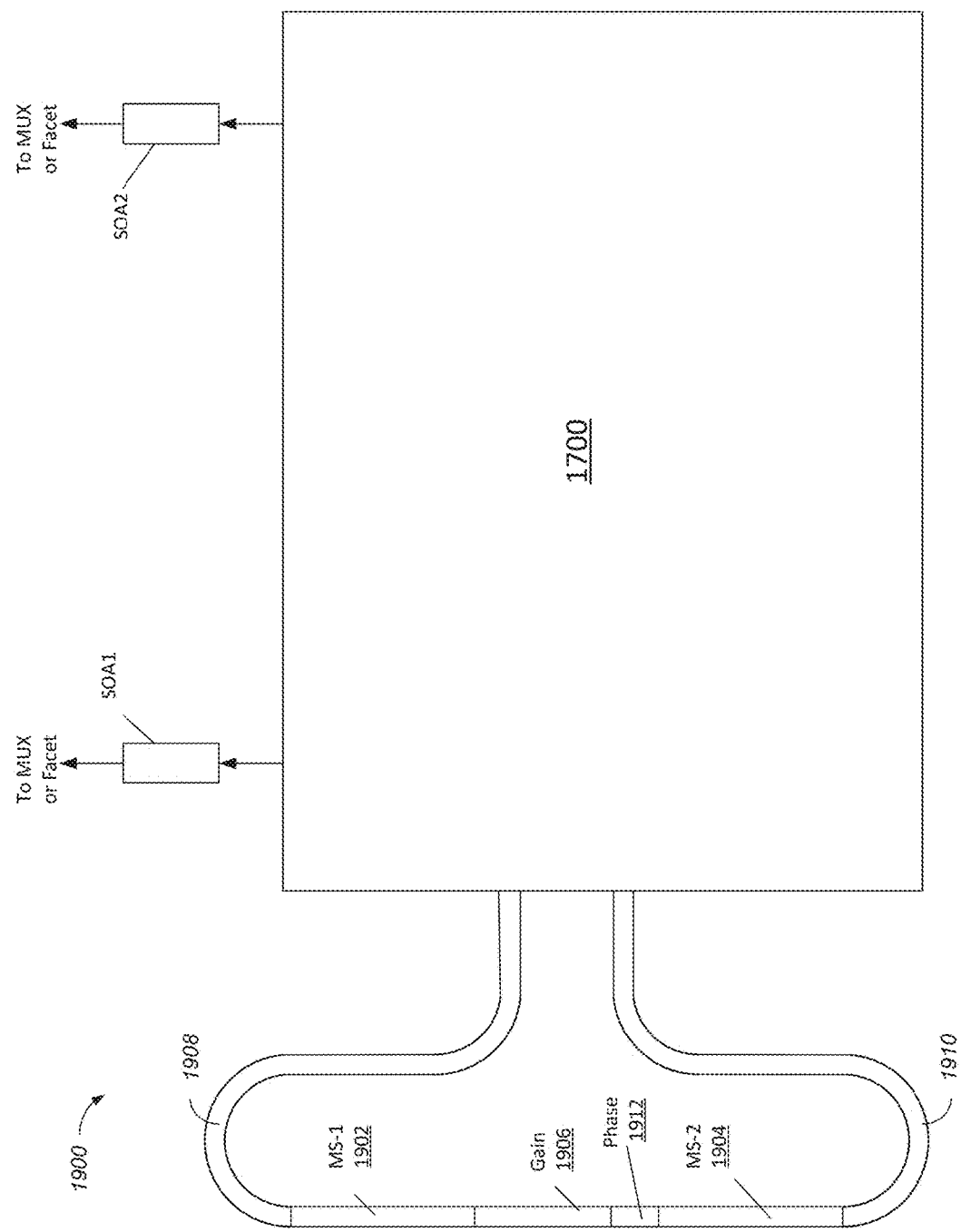
Figure 20:
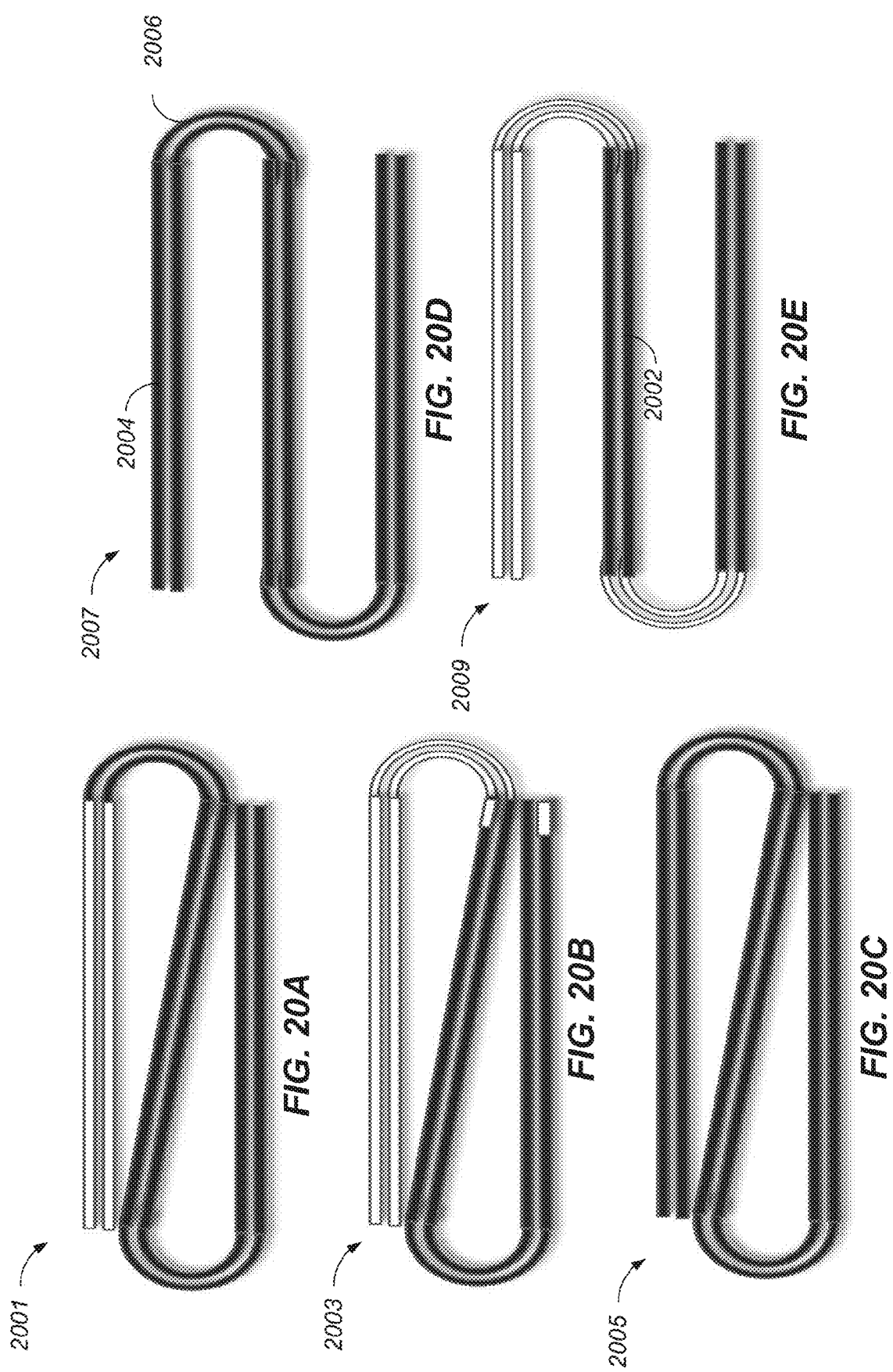
FIGS. 20A-20E show example PIC signal electrode or interposer signal trace configurations

FIG. 19 illustrates another example of a compact laser design 1900. Here, the gain (G) section 1906, as well as mirror sections MS1 1902 and MS2 1904 are arranged linearly, but output waveguides 1908 and 1910 extending from the MS1 1902 and MS2 1904 loop back to provide CW inputs to block 1700. The loop back waveguide sections are further configured to minimize space. In some implementations, the WTL may include a phase tuning section 1912, where a phase inside the cavity may be adjusted.

FIGS. 18 and 19 show a single channel, e.g. channel 1. It is understood, however, that the PIC may include multiple channels, which may, for example, have lasers arranged in rows or columns and staggered relative to one another to conserve additional chip area. The use of an interposer or a bridge chip arrangement enables the optimal placements of electrical interconnects between the multi-channel PIC and the ASIC, as the electrical connections are not constrained to the edges of the chips as in the case of a wire-bond.

FIGS. 20A-20E show various PIC signal electrode or interposer signal trace configurations consistent with the present disclosure. Unshaded regions in these figures represents passive routing or other elements such as PAs or VOAs. The signal electrodes/traces may be continuous, length-matched or discontinuous. In some implementations, such as the configuration 2009 shown in FIG. 20E, only straight segments of a waveguide are driven by interposer signal traces (e.g., 2002). In some implementations, such as the configurations 2001, 2003, 2005, and 2007 as shown in FIGS. 20A-20D, both straight segments and bent segments of a waveguide are driven by interposer signal traces (e.g., 2004 and 2006).

Figure 21:
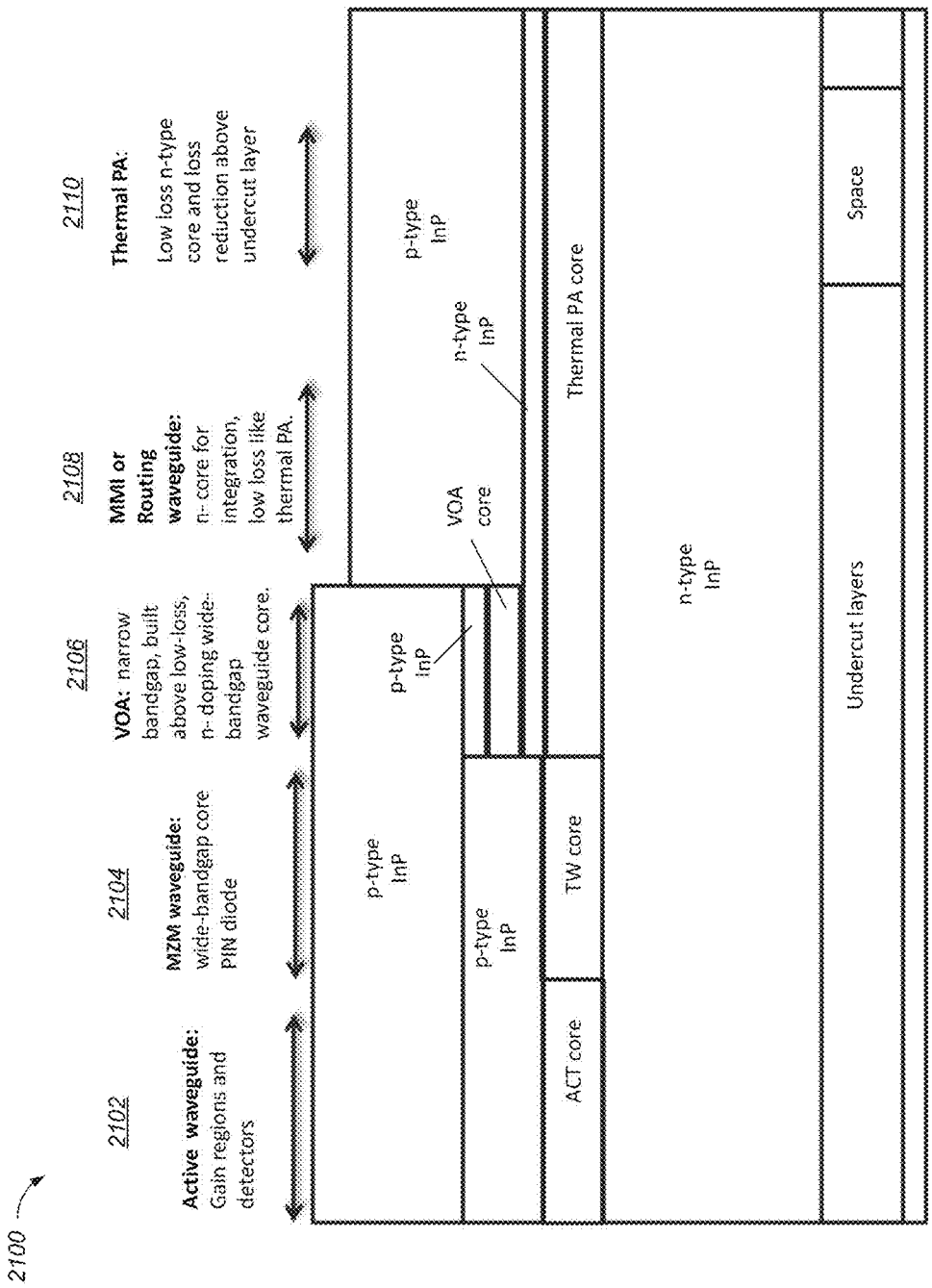
FIG. 21 shows a longitudinal cross-sectional view of a portions of an example PIC waveguide.

FIG. 21 shows a longitudinal cross-sectional view of a portions of an example PIC waveguide 2100. The PIC 2100 includes an active waveguide 2102, MZM waveguide 2104, VOA 2106, MMI (or routing waveguide) 2108, and thermal PA sections 2110. In some implementations, an undercut layer (see a related devices having an undercut layer in FIG. 22), as well as an n-doped InP layer may extend beneath each of the above-identified sections. The active waveguide section 2102 constitutes gain sections of the lasers, as well as active portions of monitoring photodiodes on the PIC. The active waveguide section 2102 includes, in addition to portions of the undercut and n-doped InP layers, a core region, and portions two p-doped InP layers. The MZM waveguide section 2104 includes a wide bandgap core layer.

The VOA section 2106 includes a narrow bandgap VOA core layer provided on a wide bandgap waveguide core and n-type (e.g., silicon doped) InP layer that reduces loss. An electrode (not shown) may be provided on the p-doped InP layer above the VOA core to regulate the amount of absorption in the VOA core. The narrow bandgap of the VOA core is between 1.3 and 1.5 microns (i.e., the energy associated with a photon having a wavelength of 1.3 to 1.5 microns.) and thus absorbs optical signals having common transmission wavelengths of approximately 1550 nm. The wide bandgap of the waveguide core is between 1.2 to 1.3 microns.

The VOA section 2106 shown in FIG. 21 has minimal discontinuities and thus less reflection than that of conventional, absorptive VOAs.

As further shown in FIG. 21, the MMI (routing waveguide) section 2108 and thermal PA section 2110 both include a layer of n-type InP provided between a p-doped InP layer and a core layer. The n-type layer reduces loss associated with optical signal propagating in the core. In some implementations, the section 2104 may also be used as a VOA if bandgap is narrow enough and voltage supply is high enough. In some implementations, the section 2110 may form a Mach-Zehnder VOA using phase adjustors.

Figure 22:
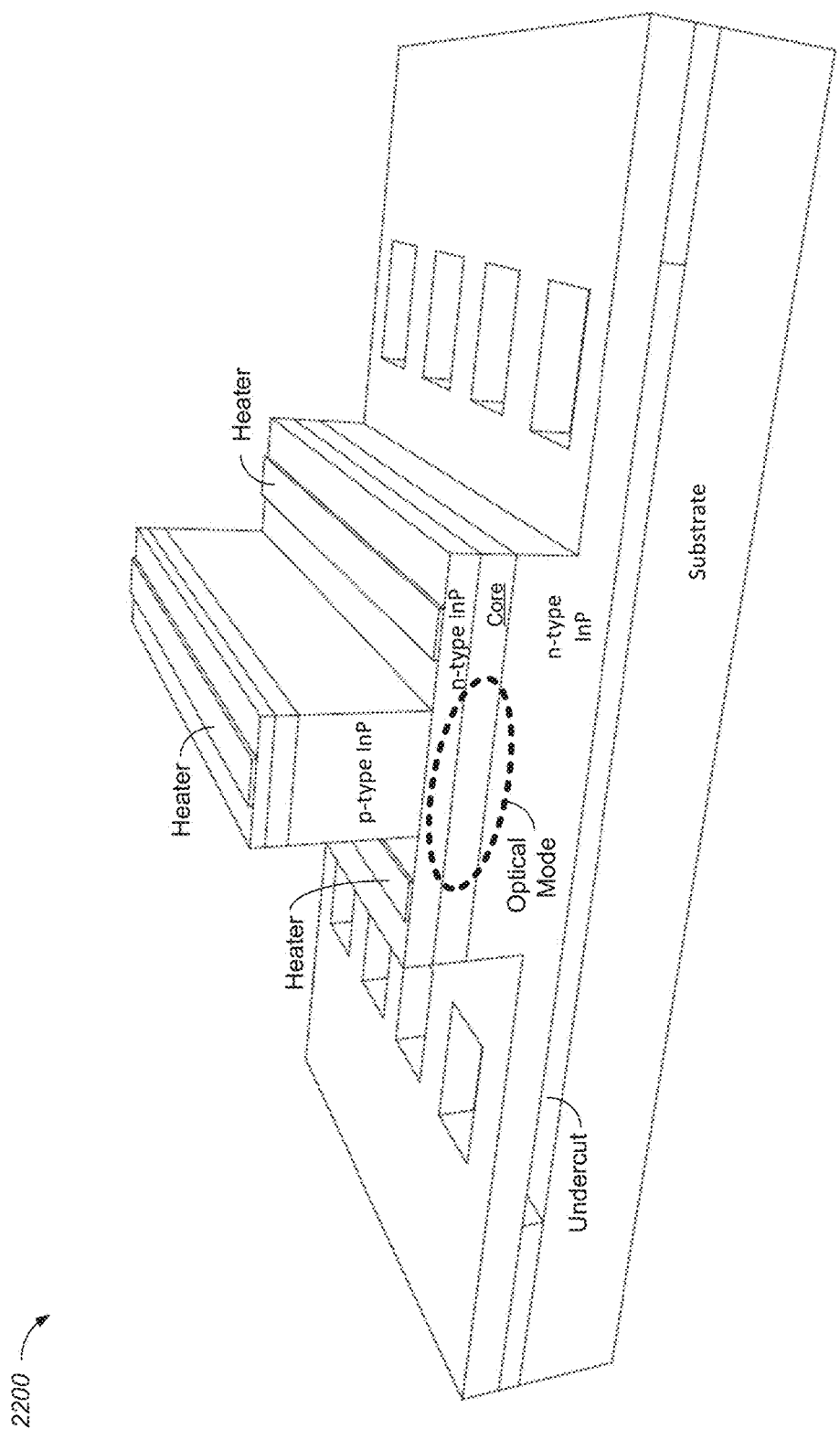
FIG. 22 illustrates a perspective view of an example laser having undercut regions.

FIG. 22 illustrates a perspective view of an example laser 2200 having undercut regions similar to those shown in the cross-sectional view of FIG. 21. The undercut layers may thermally isolate the laser from the underlying substrate, so that thermal tuning of the mirror sections of the laser (e.g., FIGS. 18 and 19) may be more efficient.

Figure 23:
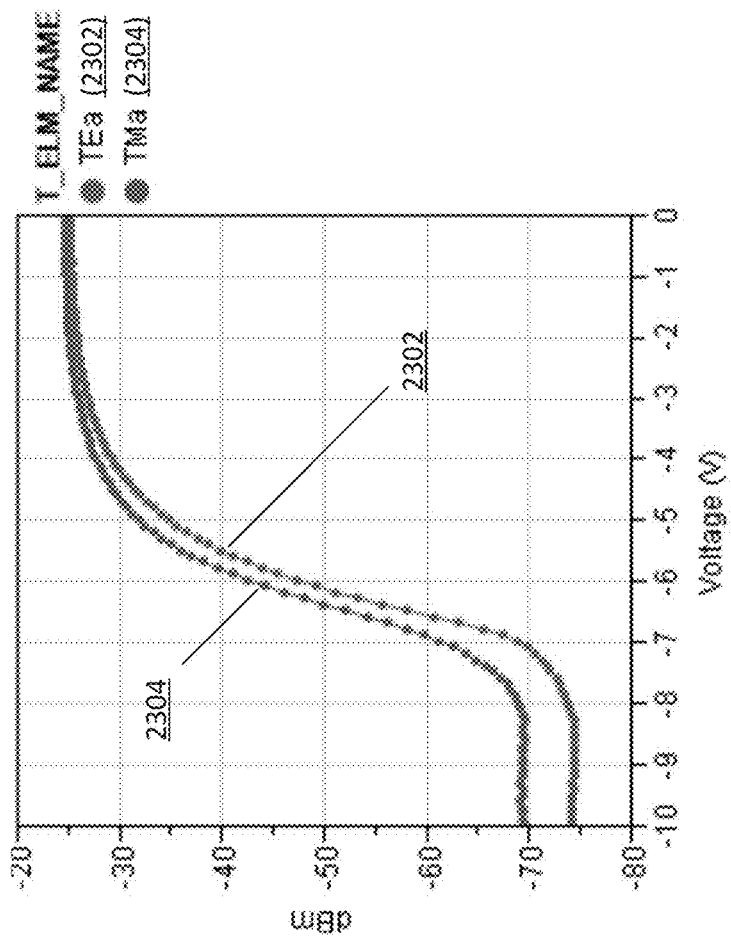
FIG. 23 illustrates loss versus applied voltage for TE and TM polarized light.

FIG. 23 illustrates plots 2302 and 2304 of loss in dBm v. applied voltage (to the VOA electrode) for both TE and TM polarized light propagating through the VOA section. As shown in FIG. 23, at voltages of −7V to −10V the VOA loss can be up to 50 dB, effectively blocking light supplied to the VOA section. At applied voltages −4V to 0V, however, the loss is considerably reduced. Accordingly, operation of the VOA section has been demonstrated. Narrow bandgap cores typically have lower tuning voltage but increased insertion loss unless configured like the VOA section shown in FIG. 21, device section 2106.

Figure 24:
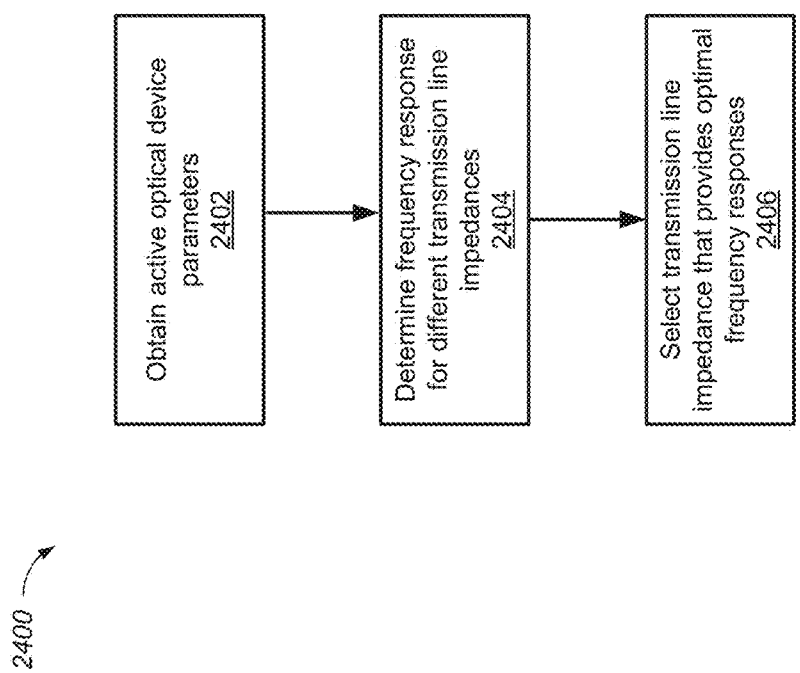
FIG. 24 is a flow diagram that illustrates an example process for designing an impedance of a transmission line that matches the impedance of a load.

FIG. 24 is a flow diagram that illustrates an example of a process 2400 for designing an impedance of a transmission line that matches the impedance of a load, e.g., a lumped active optical device. The process 2400 may be performed by a system, such as a general or special purpose computer system that runs simulation software for modeling transmission line impedances.

The system obtains parameters of an active optical device to be connected to the interposer (2402). As an example, an interposer may provide electrical interconnects to a lumped MZM on a PIC chip. The lumped MZM may have a length of 300 μm.

The system determines a frequency response for different transmission line impedances (2404). As an example, a designer may select several impedance values from transmission line impedances that ranges from 10 to 200 ohms, and simulates an electrical frequency response (e.g., $|H^2|$ response from 0 to 40 GHz) for various transmission line lengths.

Figure 25:
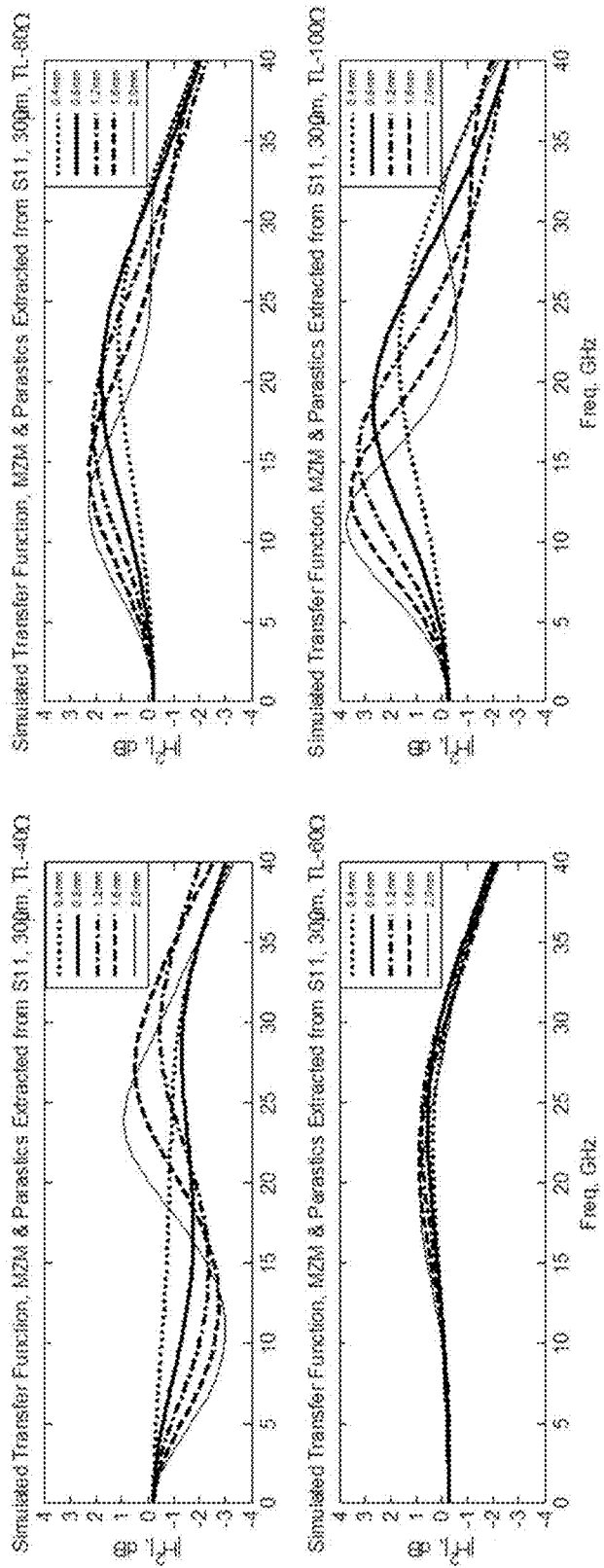
FIG. 25 illustrates an example simulation result for the frequency responses for various transmission line lengths.

The system selects a transmission line impedance that provides frequency responses (2406). Referring to FIG. 25 as an example, FIG. 25 shows an example simulation result for the frequency responses for various transmission line lengths associated with four different transmission line impedances values of 40 ohm, 60 ohm, 80 ohm, and 100 ohm. The result for a transmission line impedance of 60 ohm provides the best match because of the flat shape and high frequency roll-off curves for the simulated transmission line lengths. In this example, a transmission line impedance of 60 ohm may be implemented on the interposer that is to be packaged with the lumped MZM having a length of 300 μm.

Figure 26:
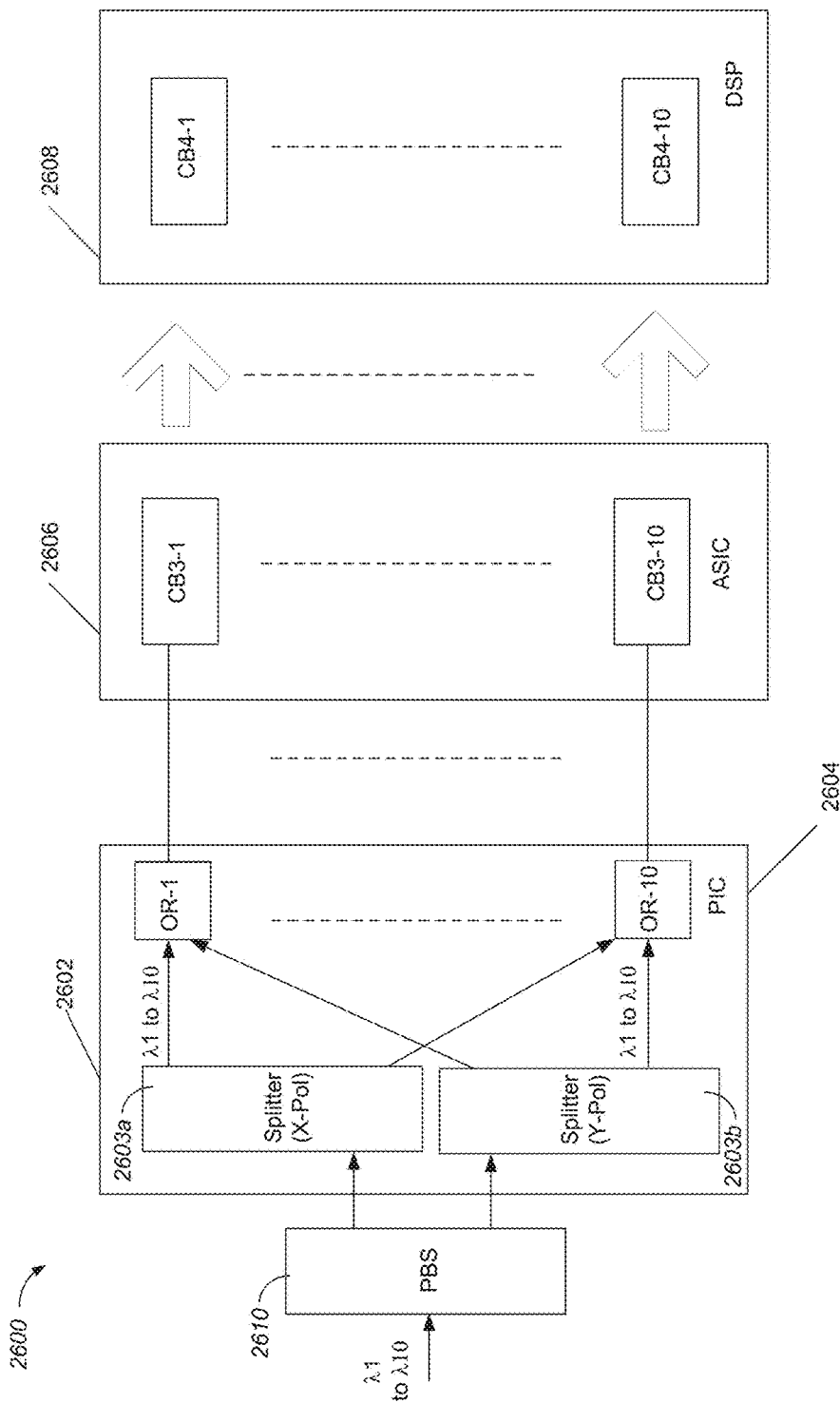
FIG. 26 illustrates an example layout for a receiver PIC.
Figure 27:
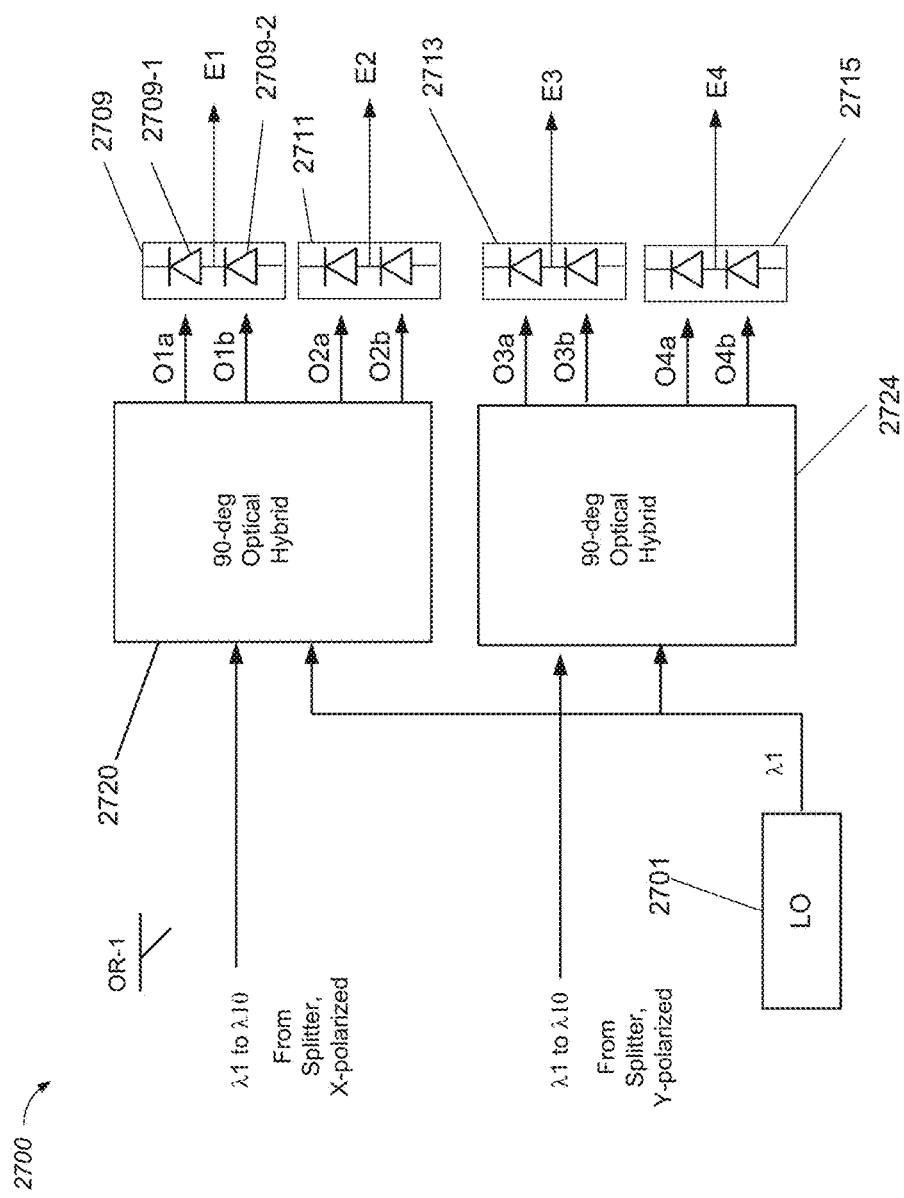
FIG. 27 illustrates an example layout for a receiver PIC.

FIGS. 26 and 27 illustrate examples of receiver PICs. FIG. 26 illustrates a receiver block 2600. The receiver block 2600 includes a polarization beam splitter (PBS) 2610 that splits a received optical signal, e.g., an optical signal having wavelengths λ1 to λ10 into two optical signals having orthogonal polarizations, i.e., X and Y polarization representing vector components of the optical E-field of the incoming optical signals transmitted on optical fiber medium. The PBS 2610 may be a discrete optical component or may be integrated on the substrate 2604. The receiver block 2600 further includes a receiver PIC 2602 provided on substrate 2604. The PIC 2602 includes an optical power splitter 2603a that receives optical signals having a X polarization and wavelengths λ1 to λ10, for example, and supplies a power split portion of each optical signal (each of which itself may be considered an optical signal) to each of optical receivers OR-1 to OR-10. The PIC 2602 further includes an optical power splitter 2603b that receives optical signals having a Y polarization and wavelengths λ1 to λ10, for example, and supplies a power split portion of each optical signal (each of which itself may be considered an optical signal) to each of optical receivers OR-1 to OR-10. Each optical receiver OR-1 to OR-10, in turn, supplies a corresponding output to a respective one of circuit blocks CB3-1 to CB3-10 of ASIC 2606, and each of circuit blocks CB3-1 to CB3-10, supplies a respective output to a corresponding one of circuit blocks CB4-1 to CB4-10 of Digital Signal Processing chip (DSP) 2608. DSP 2608, in turn, outputs a copy of data in response to the input to circuit blocks CB4-1 to CB4-10.

FIG. 27 illustrates an example 2700 of an optical receiver OR-1. It is understood that in a multi-receiver PIC, other optical receivers on the PIC may have the same or similar structure as optical receiver OR-1. The optical receiver OR-1 receives optical signals having X and Y orthogonal polarizations, i.e., vector components of the optical E-field of the incoming optical signals transmitted on optical fiber medium. The orthogonal polarizations are then mixed in 90 degree optical hybrid circuits ("hybrids") 2720 and 2724 with light from local oscillator (LO) laser 2701 having wavelength λ1. Hybrid circuit 2720 outputs four optical signals O1a, O1b, O2a, O2b and hybrid circuit 2724 outputs four optical signals O3a, O3b, O4a, and O4b, each representing the in-phase and quadrature components of the optical E-field on X (TE) and Y (TM) polarizations, and each including light from local oscillator 2701 and light from polarization beam splitter 2702. Optical signals O1a, O1b, O2a, O2b, O3a, O3b, O4a, and O4b are supplied to a respective one of photodetector circuits 2709, 2711, 2713, and 2715. Each photodetector circuit includes a pair of photodiodes (such as photodiodes 2709-1 and 2709-2) configured as a balanced detector, for example, and each photodector circuit supplies a corresponding one of electrical signals E1, E2, E3, and E4. Alternatively, each photodetector may include one photodiode (such as photodiode 2709-1) or else the circuit may be configured with single-ended photodiodes and twice the number of signal paths to the TIA. Electrical signals E1 to E4 are indicative of data carried by optical signals λ1 to λ10 input to PBS 2702. For example, these electrical signals may comprise four base-band analog electrical signals linearly proportional to the in-phase and quadrature components of the optical E-field on X and Y polarizations.

Figure 28:
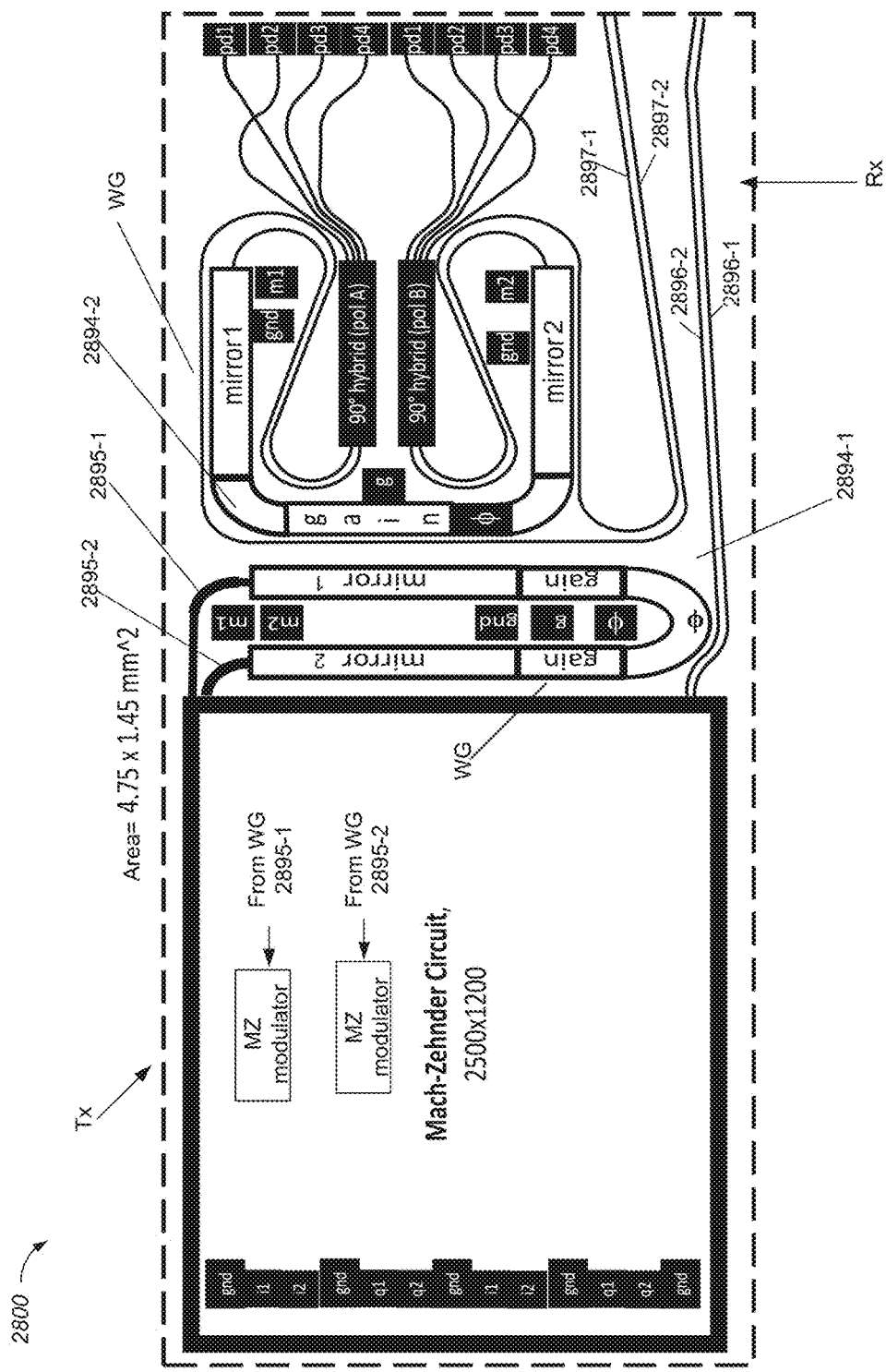
FIG. 28 illustrates an example layout for a transceiver PIC.
Figure 29:
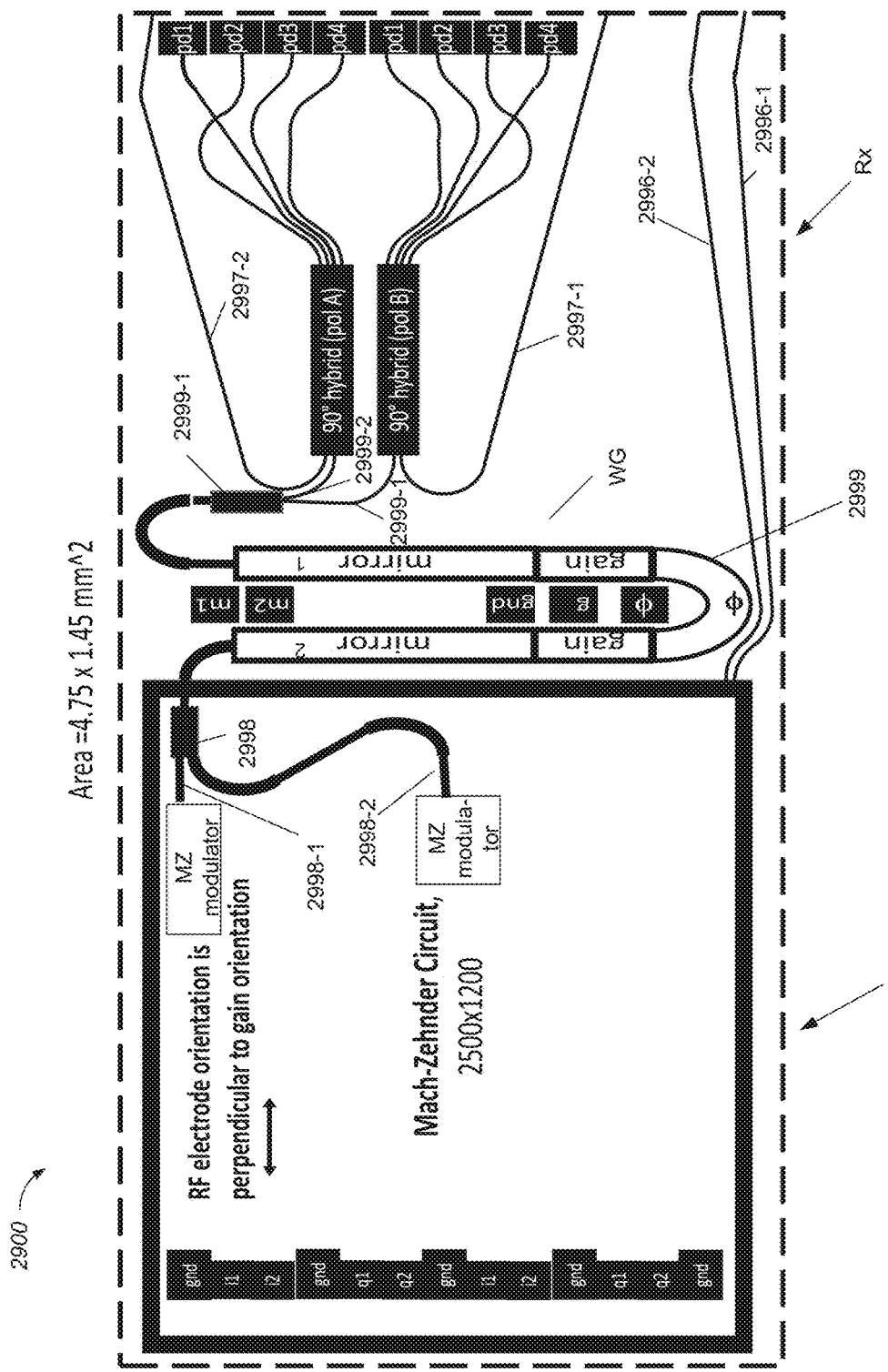
FIG. 29 illustrates an example layout for a transceiver PIC.

FIGS. 28 and 29 illustrate examples of transceiver PICs including compact lasers with extended tunability (CLETs) consistent with the present disclosure. The term CLET, as used herein, refers to any of the laser configurations disclosed herein having mirrors and a bent, angled or curved part, portion or section between such mirrors. In FIG. 28, the transceiver PIC includes first and second CLETs 2894-1 and 2894-2, each of which having a curved or bent portion, such as phase section φ of waveguide WG. CLET 2894-1 is associated with the transmit (Tx) section of the transceiver PIC and supplies first and second lights from respective mirror sections to corresponding waveguides 2895-1 and 2895-2. Waveguides 2895-1 and 2895-2, in turn, supply light to corresponding Mach-Zehnder modulators in the Mach-Zehnder circuit. Modulated light or optical signals output from the Mach-Zehnder circuit is supplied on waveguides 2896-1 and 2896-2.

Preferably, the gain section of waveguides WG in both the receiver (Rx) and Tx sections should be defined on the same, preferred crystal axis for wet-etch-defined, ridge waveguiding. In this case, the laser axis requirement forces a different type of laser for the Rx section. Differences in Rx and Tx pitch, i.e., the distance between Rx devices and the distance between Tx devices, may lead to wasted space on the chip. Other requirements such as minimizing the size of CLETs and location of high-speed pads and devices at particular edges of the chip influence layout optimization of the PIC.

Also, the gain section of the laser and semiconductor optical amplifiers (SOAs discussed below) will typically be oriented on a preferred crystal axis so that a wet chemical etch may form substantially vertical sidewalls to define a ridge, with the etch stopping on a quaternary layer (e.g. GaInAsP). Mach-Zehnder phase elements operated with a reverse bias (e.g. phase adjustors, and RF modulators) are typically (but not exclusively) oriented orthogonal to the axis preferred for lasers and SOAs because the phase tuning efficiency may be twice compared to the "preferred gain" axis, while absorption is the same for any orientation.

As further shown in FIG. 28, CLET 2894-2 operates as a local oscillator laser and is associated with the receiver (Rx) portion of the transceiver PIC 2800. The Rx portion receives optical inputs on waveguides 2897-1 and 2897-2, which are supplied to optical hybrid (pol B) and optical hybrid (pol A), respectively. In this example, CLET 2894-2 wraps around optical hybrids pol A and pol B to realize a compact design.

In the above example and as noted above, each CLET includes a waveguide that includes the mirror, gain, and phase (φ) sections. In each of these CLETs, the waveguide has a bent or curved portion, so that the CLET is also bent or curved to achieve a compact design. Bonding pads, represented as darkened squares and rectangles labeled, φ (for phase control), g (for gain), m1 and m2 (for mirrors) provide electrical signals to tune or adjust each of these waveguide sections to achieve an optical signal with the desired wavelength and power. Bonding pads m1 and m2 provide current, for example, for tuning mirror 1 and mirror 2, respectively, in each of the figures herein.

FIG. 29 illustrates another example of a transceiver PIC 2900 including Tx and Rx sections. Here, CLET 2999 is provided having a first output or waveguide that extends from a first mirror to a first splitter 2998 and a second output or waveguide that extends from a second mirror to a second splitter 2999. First splitter 2998 has first and second outputs 2998-1 and 2998-2 that supply optical outputs to corresponding Mach-Zehnder modulators in the Mach-Zehnder circuit, and second splitter 2999 has first and second output waveguides that provide optical outputs to hybrid (pol A) and hybrid (pol B), respectively. Hybrid (pol A) also receives incoming light carrying data on waveguide 2997-1, and hybrid (pol B) receives incoming light carrying data on waveguide 2997-2.

In this example, the RF bias electrodes, such as the electrodes labeled gnd (ground), and RF electrodes (i1 (in-phase signal), i2 (in-phase signal), q1 (quadrature signal), q2 (quadrature signal) for driving the MZ circuit) can easily be configured perpendicular to the gain sections. Separate CLETs may be preferably deployed for each channel in a transceiver (as in FIGS. 4n and 4o) in order to provide higher power to each of the transmitter and receiver and/or to minimize optical feedback from the transmitter elements and/or receiver elements to the laser. Specifically, a separate CLET may be preferred in a transceiver PIC to minimize the optical feedback from the transmitter circuit to the CLET and linewidth broadening from modulation. This may improve the linewidth of the receiver local oscillator signal (which may require reduced linewidth and/or phase noise compared to the transmitter). In the case of the shared CLET (e.g., FIG. 28), the output power of the CLET may be asymmetrical to account for the different power requirements in the transmitter versus receiver part of the circuit (where the transmitter often requires higher power). In addition, in any transmitter PIC or part of a PIC, if light is taken from both sides of the CLET for each polarization, the output may be unbalanced to account for differing loss and/or gain in the different polarizations of the circuit.

In the example shown in FIG. 29, one CLET supplies first light to the Mach-Zehnder modulator circuit on waveguides 2998-1 and 2998-2, as well as second light (local oscillator light) that is provided to optical hybrids (pol A) and (pol B).

In the above example, the CLET has a staple-shaped configuration in which the phase section of the CLET waveguide is curved. Additional CLET configurations will now be described consistent with further aspects of the present disclosure. PICs disclosed herein may include multiple CLETs as noted above or one CLET. In addition, the CLETs disclosed herein may be provided as a discrete device or a single device on a substrate or as multiple device provided in an array.

Figure 30A:
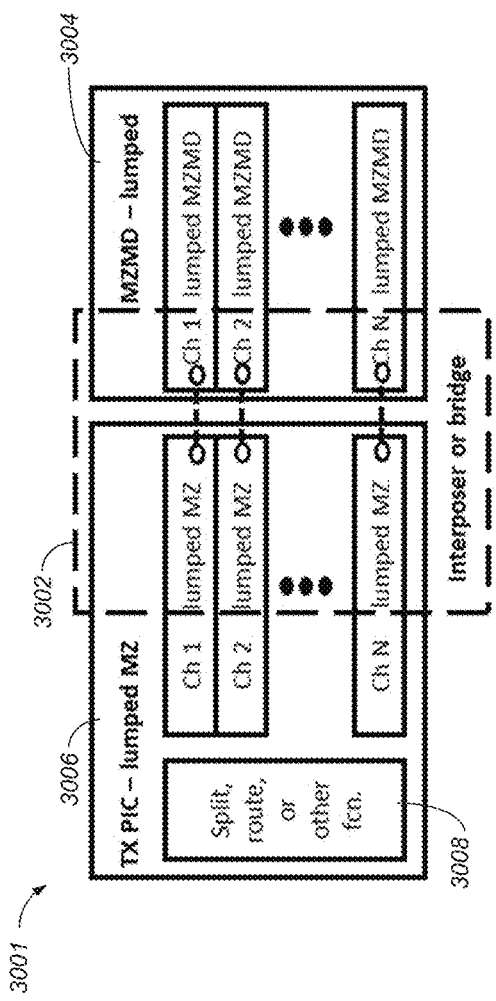
FIGS. 30A and 30B illustrate example arrangements where an interposer or a bridge chip provides electrical interconnects between a lumped modulator driver and a transmitter PIC chip.

FIG. 30A illustrates an example arrangement 3001 where an interposer (or a bridge chip) 3002 provides electrical interconnects between a lumped modulator driver 3004 and a transmitter (TX) PIC chip 3006. The TX PIC chip 3006 includes optical elements 3008 that may perform split, route, or other passive or low-speed functions. The TX PIC chip 3006 further includes lumped MZMs for N-channels, where N is an integer larger than one. The lumped modulator driver (MZMD) chip 3004 includes circuitry for N lumped MZMD drivers that correspond to the N channels of the TX PIC chip 3006. The interposer (or a bridge chip) 3002 may provide electrical interconnects between the lumped modulator driver 3004 and the TX PIC chip 3006 similar to the descriptions in FIGS. 1A-1D, 2A-2C, and 3A-3E.

Figure 30B:
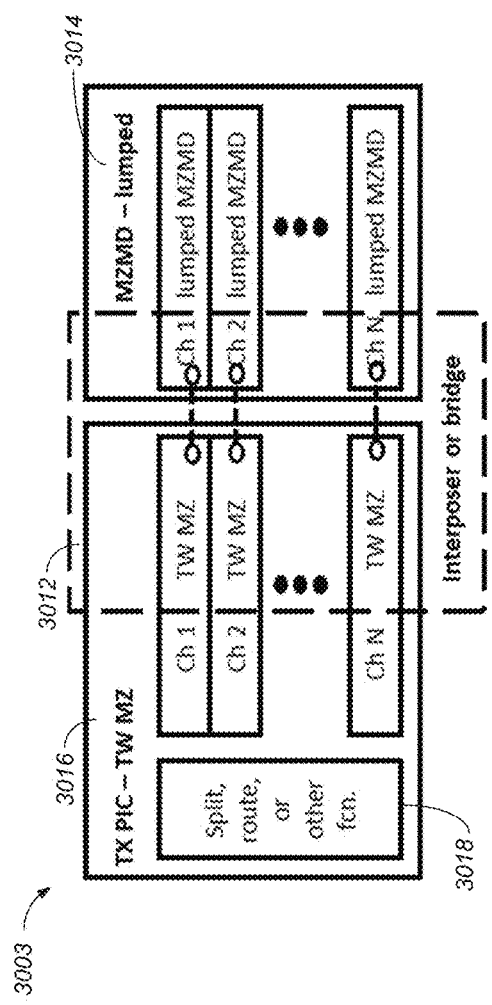

FIG. 30B illustrates an example arrangement 3003 where an interposer (or a bridge chip) 3012 provides electrical interconnects between a lumped modulator driver 3014 and a transmitter (TX) PIC chip 3016. The TX PIC chip 3016 includes optical elements 3018 that may perform split, route, or other passive or low-speed functions. The TX PIC chip 3016 further includes TW MZMs for N-channels. The lumped modulator driver (MZMD) chip 3014 includes circuitry for N lumped MZMD drivers that correspond to the N channels of the TX PIC chip 3016. The interposer (or a bridge chip) 3012 may provide electrical interconnects between the lumped modulator driver 3014 and the TX PIC chip 3016 similar to the descriptions in FIGS. 4A-4E, 5, 6A-6C, 7A-7B, and 8.

Figure 31A:
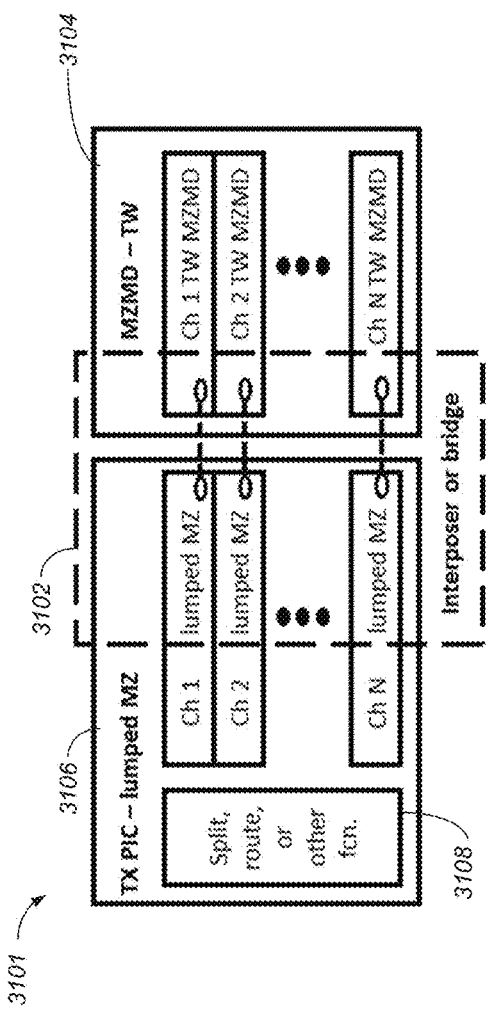
FIGS. 31A and 31B illustrate example arrangements where an interposer or a bridge chip provides electrical interconnects between a TW modulator driver and a transmitter PIC chip.

FIG. 31A illustrates an example arrangement 3101 where an interposer (or a bridge chip) 3102 provides electrical interconnects between a TW modulator driver 3104 and a TX PIC chip 3106. The TX PIC chip 3106 includes optical elements 3108 that may perform split, route, or other passive or low-speed functions. The TX PIC chip 3106 further includes lumped MZMs for N-channels. The TW modulator driver (MZMD) chip 3104 includes circuitry for N TW MZMD drivers that correspond to the N channels of the TX PIC chip 3006. The interposer (or a bridge chip) 3102 may provide electrical interconnects between the TW modulator driver 3104 and the TX PIC chip 3106 similar to the descriptions in FIGS. 1A-1D, 2A-2C, and 3A-3E.

Figure 31B:
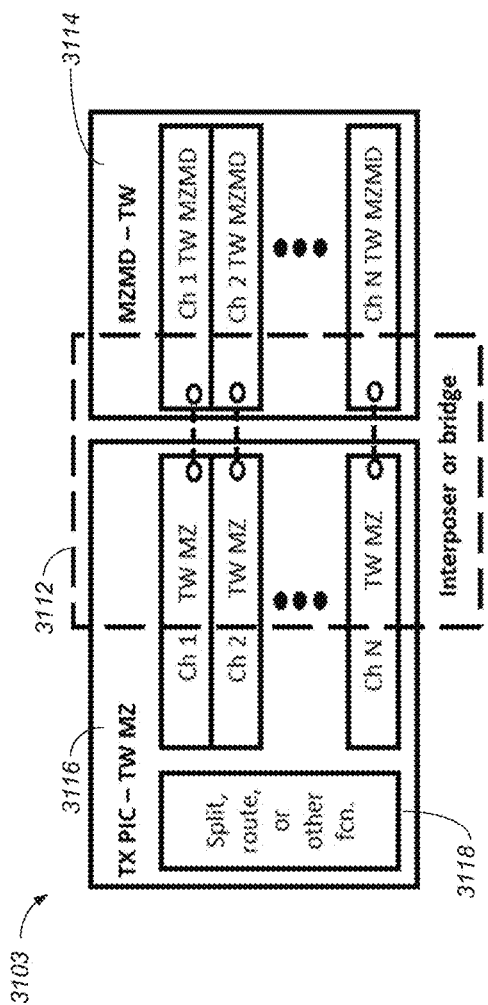

FIG. 31B illustrates an example arrangement 3103 where an interposer (or a bridge chip) 3112 provides electrical interconnects between a TW modulator driver 3114 and a transmitter (TX) PIC chip 3116. The TX PIC chip 3116 includes optical elements 3118 that may perform split, route, or other passive or low-speed functions. The TX PIC chip 3116 further includes TW MZMs for N-channels. The TW modulator driver (MZMD) chip 3114 includes circuitry for N TW MZMD drivers that correspond to the N channels of the TX PIC chip 3116. The interposer (or a bridge chip) 3112 may provide electrical interconnects between the TW modulator driver 3114 and the TX PIC chip 3116 similar to the descriptions in FIGS. 4A-4E, 5, 6A-6C, 7A-7B, and 8.

Figure 32A:
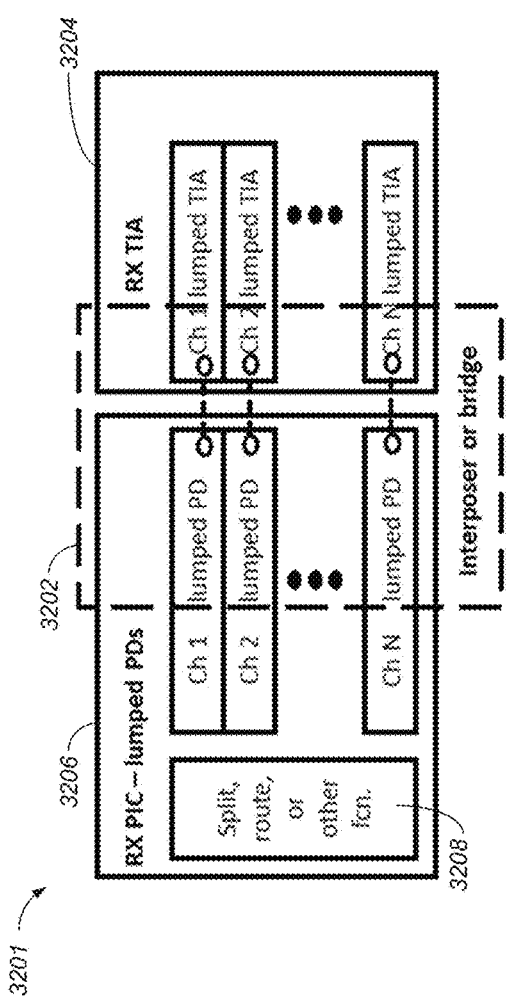
FIGS. 32A and 32B illustrate example arrangements where an interposer or a bridge chip provides electrical interconnects between a lumped TIA and a receiver PIC chip.

FIG. 32A illustrates an example arrangement 3201 where an interposer (or a bridge chip) 3202 provides electrical interconnects between a lumped TIA chip 3204 and a receiver (RX) PIC chip 3206. The RX PIC chip 3206 includes optical elements 3208 that may perform split, route, or other passive or low-speed functions. The RX PIC chip 3206 further includes lumped photodetectors (PD) for N-channels. The lumped TIA chip 3204 includes circuitry for N lumped TIA that correspond to the N channels of the RX PIC chip 3206. The interposer (or a bridge chip) 3202 may provide electrical interconnects between the lumped TIA chip 3204 and the RX PIC chip 3206 similar to the descriptions in FIGS. 1A-1D, 2A-2C, and 3A-3E.

Figure 32B:
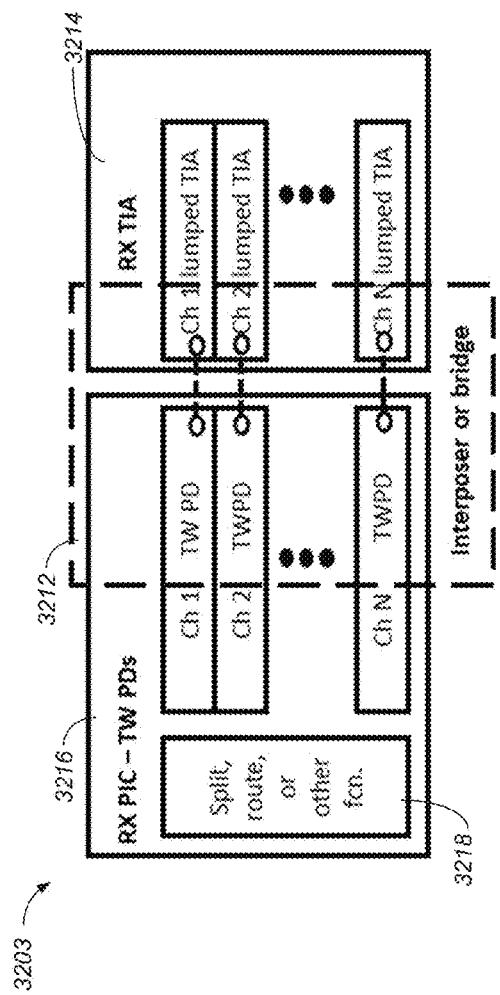

FIG. 32B illustrates an example arrangement 3203 where an interposer (or a bridge chip) 3212 provides electrical interconnects between a lumped modulator driver 3214 and a RX PIC chip 3216. The RX PIC chip 3216 includes optical elements 3218 that may perform split, route, or other passive or low-speed functions. The RX PIC chip 3216 further includes RX PDs for N-channels. The lumped TIA chip 3214 includes circuitry for N lumped TIA that correspond to the N channels of the RX PIC chip 3216. The interposer (or a bridge chip) 3212 may provide electrical interconnects between the lumped modulator driver 3214 and the RX PIC chip 3216 similar to the descriptions in FIGS. 4A-4E, 5, 6A-6C, 7A-7B, and 8.

FIG. 33A illustrates an example arrangement 3301 where an interposer (or a bridge chip) 3302 provides electrical interconnects between a TW amplifier 3304 and a RX PIC chip 3306. The RX PIC chip 3306 includes optical elements 3308 that may perform split, route, or other passive or low-speed functions. The RX PIC chip 3306 further includes lumped PDs for N-channels. The TW amplifier chip 3304 includes circuitry for N TW amplifier drivers that correspond to the N channels of the RX PIC chip 3306. The interposer (or a bridge chip) 3302 may provide electrical interconnects between the TW amplifier chip 3304 and the RX PIC chip 3306 similar to the descriptions in FIGS. 1A-1D, 2A-2C, and 3A-3E.

FIG. 33B illustrates an example arrangement 3303 where an interposer (or a bridge chip) 3312 provides electrical interconnects between a TW amplifier chip 3314 and a RX PIC chip 3316. The RX PIC chip 3316 includes optical elements 3318 that may perform split, route, or other passive or low-speed functions. The RX PIC chip 3316 further includes TW PDs for N-channels. The TW amplifier chip 3314 includes circuitry for N TW amplifier that correspond to the N channels of the RX PIC chip 3316. The interposer (or a bridge chip) 3312 may provide electrical interconnects between the TW amplifier chip 3314 and the RX PIC chip 3316 similar to the descriptions in FIGS. 4A-4E, 5, 6A-6C, 7A-7B, and 8.

Figure 36:
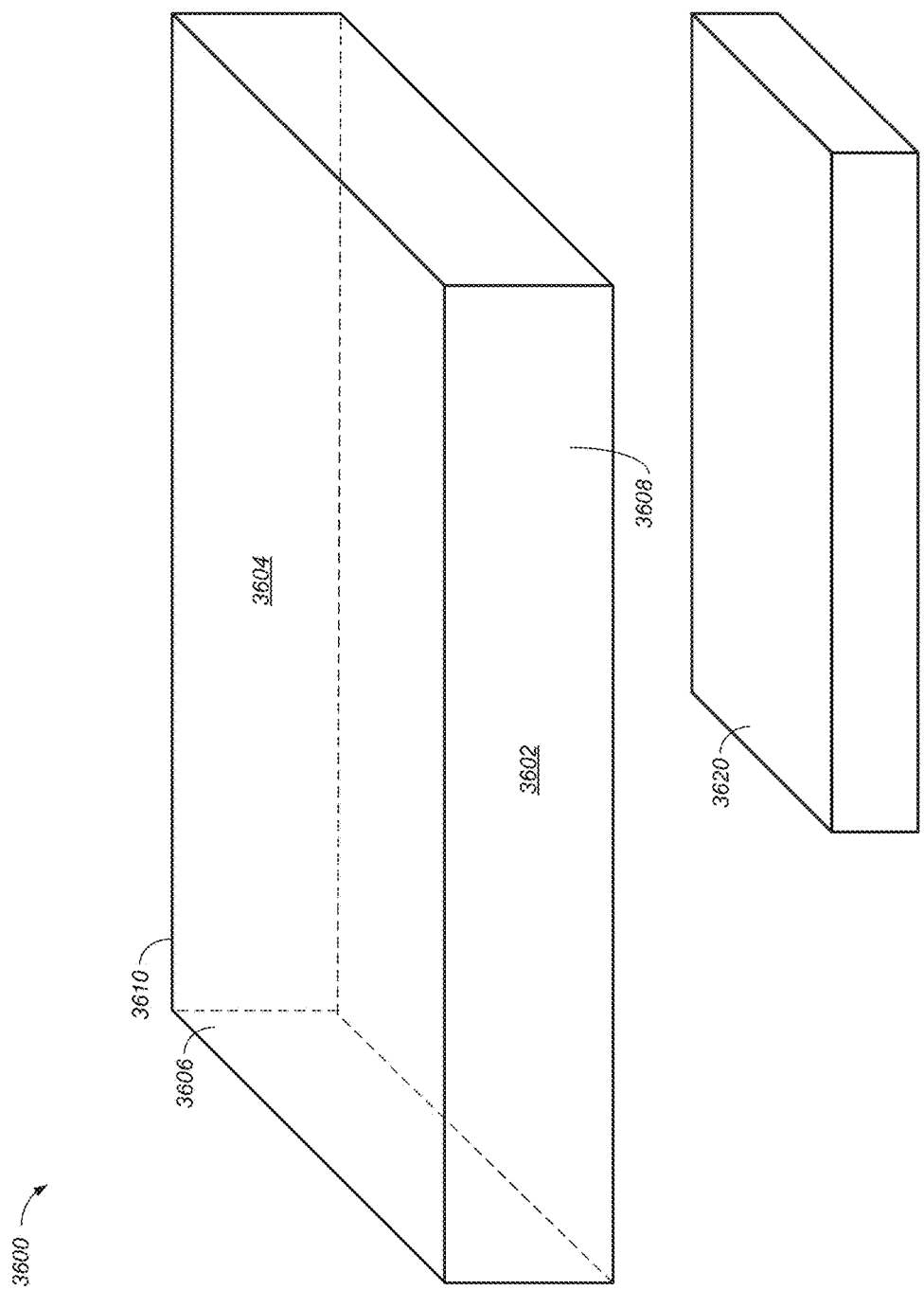
FIG. 36 illustrates an example arrangement where an interposer include traces on different sides.

FIG. 36 illustrates an example arrangement 3600 where an interposer 3610 includes traces on different sides. The interposer 3610 may be applied to any interposer disclosed in this disclosure. The interposer 3610 includes multiple surfaces, e.g., a front surface 3602, a back surface 3604, a top surface 3606, and a bottom surface 3608. In some implementations, the interposer 3610 may have optical access on one side and have RF access on a different side. For example, the interposer 3610 may have optical access (e.g., input/output couplers and waveguide) formed on the bottom surface 3608, and have RF access on the top surface 3606 that are accessible by vias. In some implementations, the interposer 3610 may include low speed, quasi-DC, or DC control access on one side, and RF and/or optical access on different sides. As an example, the interposer 3610 may have optical access (e.g., input/output couplers and waveguide) formed on the bottom surface 3608, RF access formed on the top surface 3606 that are accessible by vias, and DC access formed on the front surface 3602 and/or the back surface 3604 that are accessible by wire bonds. A low speed control signal is one with a frequency that is much lower than the RF signal used to control high-speed operations of the optical element. As an example, a low speed control signal may be a signal that is less than 10 MHz. A quasi-DC control signal is one with a frequency that is almost DC when compared with the RF signal. As an example, a quasi-DC control signal may be a signal that is less than 10 kHz.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
circuitry configured to provide the electrical signal; and
a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;

a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the bridge chip includes a first surface in contact with the photonic integrated circuit and the ASIC chip; and a second surface opposite to the first surface,
wherein the conductive trace of the bridge chip is formed on the first surface.

2. The photonic integrated circuit package of claim 1,
wherein the conductive trace of the bridge chip is formed on the second surface,
wherein the first conductive contact and the second conductive contact of the bridge chip is electrically coupled to the conductive trace of the bridge chip through vias formed in the bridge chip.

3. The photonic integrated circuit package of claim 1, wherein the conductive trace of the bridge chip is formed on a surface that is in contact with the photonic integrated circuit and the ASIC chip.

4. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
 circuitry configured to provide the electrical signal; and
 a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the photonic integrated circuit chip is a multi-element photonic integrated circuit chip that includes multiple active optical elements,
wherein an impedance of each conductive trace for controlling a respective active optical element of the multiple active optical elements is a controlled impedance.

5. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
 circuitry configured to provide the electrical signal; and
 a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the active optical element is a lumped active optical element,
wherein an impedance of the conductive trace of the bridge chip is a controlled impedance.

6. The photonic integrated circuit package of claim 5, wherein the controlled impedance is matched with an impedance of the lumped active optical element.

7. The photonic integrated circuit package of claim 5, wherein the controlled impedance is between 10 ohm to 200 ohm.

8. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
 circuitry configured to provide the electrical signal; and
 a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the active optical element is a lumped active optical element,
wherein the conductive trace of the bridge chip comprises:
a first transmission line segment; and
a second transmission line segment that is in series with the first transmission line segment,
wherein dimensions of the first transmission line segment are different from dimensions of the second transmission line segment.

9. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
  circuitry configured to provide the electrical signal; and
  a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the active optical element is a traveling wave active optical element,
wherein an arrangement of the conductive trace on the bridge chip is different from an arrangement of the multiple electrodes on the photonic integrated circuit chip, such that an arrival timing of the electrical signal at each electrode of the multiple electrodes matches with an arrival timing of an optical signal propagate in the traveling wave active optical element.

10. The photonic integrated circuit package of claim 9, wherein the conductive trace on the bridge chip has a serpentine pattern, and wherein the multiple electrodes on the photonic integrated circuit chip form a straight-line pattern.

11. The photonic integrated circuit package of claim 9, wherein a condition that the arrival timing of the electrical signal at each electrode of the multiple electrodes sufficiently matches with the arrival timing of an optical signal propagate in the traveling wave active optical element is satisfied when an inverse of a difference in the arrival timings is equal to or greater than a baud rate of the optical signal.

12. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
  circuitry configured to provide the electrical signal; and
  a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein the active optical element is a traveling wave active optical element,
wherein the bridge chip further comprises:
a termination resistor coupled to the conductive trace, the termination resistor having an impedance that matches with an impedance of the conductive trace.

13. The photonic integrated circuit package of claim 12, wherein the termination resistor is arranged to achieve a thermal isolation between the termination resistor and the active optical element of the photonic integrated circuit chip, or to provide a reduced thermal loading on the photonic integrated circuit chip or a thermoelectric cooler.

14. A photonic integrated circuit package, comprising:
an active optical element;
an electrode configured to receive an electrical signal, wherein at least one characteristic of the active optical element is changed based on the electrical signal received by the electrode;
a ground electrode; and
a bond contact electrically coupled to the electrode; and
an ASIC (application specific integrated circuit) chip comprising:
  circuitry configured to provide the electrical signal; and
  a bond contact that is electrically coupled to the circuitry;
an bridge chip bonded to at least a portion of the photonic integrated circuit chip and at least a portion of the ASIC chip, the bridge chip comprising:
a conductive trace formed on a surface of the bridge chip;
a ground trace;
a first conductive contact that is directly bonded to the bond contact of the photonic integrated circuit chip; and
a second conductive contact that is directly bonded to the bond contact of the ASIC chip, the first conductive contact and the second conductive contact electrically coupled to the conductive trace to provide the electrical signal from the circuitry of the ASIC chip to the electrode of the photonic integrated circuit chip,
wherein a first pitch between elements in the photonic integrated circuit chip is different from a second pitch between elements in the ASIC chip, and wherein the bridge chip provides a fan out of conductive traces that expand from the first pitch to the second pitch.

15. A method for selecting a transmission line impedance for an interposer coupled to a photonic integrated circuit chip, comprising:
obtaining one or more parameters of a lumped active optical device;
for each respective transmission line impedance of multiple candidate transmission line impedances, determining, based on the one or more parameters of an active optical device, frequency responses for different transmission line lengths; and
selecting, based on the determined frequency responses, a transmission line impedance for the interposer.

* * * * *